United States Patent
Takeda et al.

(10) Patent No.: US 7,582,901 B2
(45) Date of Patent: Sep. 1, 2009

(54) SEMICONDUCTOR DEVICE COMPRISING METAL INSULATOR METAL (MIM) CAPACITOR

(75) Inventors: Kenichi Takeda, Tokorozawa (JP); Tsuyoshi Fujiwara, Tokyo (JP); Toshinori Imai, Tokyo (JP); Tsuyoshi Ishikawa, Tokyo (JP); Toshiyuki Mine, Tokyo (JP); Makoto Miura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/059,651

(22) Filed: Feb. 17, 2005

(65) Prior Publication Data

US 2005/0212082 A1    Sep. 29, 2005

(30) Foreign Application Priority Data

Mar. 26, 2004    (JP) .............................. 2004-091207

(51) Int. Cl.
*H01L 29/76* (2006.01)
(52) U.S. Cl. ................. 257/68; 257/534; 257/E29.345; 257/532
(58) Field of Classification Search ................. 257/535, 257/306, 534, 311, 68, E29.345, 532
See application file for complete search history.

(56) References Cited

U.S. PATENT DOCUMENTS 6,316,359 B1* 11/2001 Simpson ..................... 438/678
6,500,724 B1* 12/2002 Zurcher et al. .............. 438/384
6,924,526 B2* 8/2005 Fukuda et al. .............. 257/309
2002/0079582 A1* 6/2002 Satoh ......................... 257/751
2004/0056324 A1* 3/2004 Ning et al. .................. 257/528

FOREIGN PATENT DOCUMENTS

| JP | 2001-320026 | 11/2001 |
| JP | 2003-188264 | 7/2003 |
| JP | 2003-264236 | 9/2003 |
| JP | 2003-282719 | 10/2003 |
| JP | 2004-134451 | 4/2004 |
| JP | 2004-214550 | 7/2004 |

* cited by examiner

*Primary Examiner*—Thanh V Pham
*Assistant Examiner*—Mohammad T Karimy
(74) *Attorney, Agent, or Firm*—Brundidge & Stanger, P.C.

(57) ABSTRACT

An MIM capacitor using a high-permittivity dielectric film such as tantalum oxide. The MIM capacitor includes an upper electrode, a dielectric film, and a lower electrode. A second dielectric film and the dielectric film are formed between the upper electrode and the lower electrode, at the end of the MIM capacitor. The second dielectric film is formed to have an opening at the top of the lower electrode. The dielectric film abuts the lower electrode via the opening. The upper electrode is formed on the dielectric film. The upper electrode and the dielectric film are formed in such a manner as to embrace the opening entirely, and the second dielectric film and the lower electrode are formed so that the respective widths are the same as, or greater than, the widths of the upper electrode and the dielectric film.

7 Claims, 28 Drawing Sheets

FIG. 11

| | MIM CAPACITOR BASED ON EMBODIMENT 1 | MIM CAPACITOR BASED ON PRIOR ART 3 |
|---|---|---|
| FIRST INTERLAYER DIELECTRIC FILM — SiOC FILM (PERMITTIVITY: 2.9) | 1.36pF/cm | 1.56pF/cm |
| FIRST INTERLAYER DIELECTRIC FILM — SiO FILM (PERMITTIVITY: 4.0) | 1.87pF/cm | 1.92pF/cm |

STATE OF SWITCHES AND THEIR RELATIONS TO THE CAPACITANCE

| S1 | S2 | S3 | S4 | SELECTED TERMINAL | CAPACITANCE |
|----|----|----|----|-------------------|-------------|
| ON | ON | OFF | OFF | TERMINAL 1 – TERMINAL 2(3) | C1+C2 |
| OFF | OFF | OFF | OFF | TERMINAL 2 – TERMINAL 3 | C1*C2/(C1+C2) |
| OFF | ON | OFF | ON | TERMINAL 1 – TERMINAL 3 | C1 |
| OFF | ON | ON | OFF | TERMINAL 1 – TERMINAL 2 | C2 |

SEMICONDUCTOR DEVICE COMPRISING METAL INSULATOR METAL (MIM) CAPACITOR

CLAIM OF PRIORITY

The present application claims priority from Japanese application JP2004-091207, filed on Mar. 26, 2004, the contents of which are hereby incorporated by reference into this application.

BACKGROUND OF THE INVENTION

1. Field of the Invention

The present invention relates to a semiconductor device having a high-reliability high-performance capacitor, and to a method of manufacturing the semiconductor device.

2. Description of the Related Art

In the integrated circuits (ICs) that handle analog signals, capacitors, resistors, inductors, and other passive devices become important constituent elements of the ICs. In the past, these passive devices have been difficult to build into IC chips and have therefore been mounted as external components on substrates. In recent years, however, incorporating the passive devices into IC chips has been attempted actively in order to meet the strong needs of faster system operation and space saving.

One of the most common techniques for forming a capacitor in an IC chip is by using a capacitor structure having an insulator interposed between the upper and lower layers of polysilicon. This type of capacitor, because of its structure, is called the PIP capacitor (PIP: Polysilicon-Insulator-Polysilicon). This capacitor, however, has problems including the ones that the use of an electrode material which contains polysilicon increases resistance, and that since the deposition temperature of the polysilicon exceeds the maximum permissible temperature in a wiring process, the capacitor must be formed near a silicon substrate and this also increases coupling capacitance. An MIM (Metal-Insulator-Metal) capacitor with an insulator interposed between an upper and a lower metal electrode is drawing attention as a method of solving those problems.

Some of the features, characteristics, and problems that the MIM capacitor has are described below using the process diagrams of a conventional working example that are shown in FIGS. 2A, 2B, 3A, and 3B.

First, as shown in FIG. 2A, a titanium nitride film with a film thickness of 50 nm, an aluminum alloy film with a film thickness of 400 nm, and another titanium nitride film with a film thickness of 50 nm are formed in that order on a substrate 100 having semiconductor devices formed thereon. After that, a first etching mask 600 is formed in a desired area by lithography, and then first metal wiring 700 including a first barrier metal layer 205 made of a 50-nm-thick titanium nitride film, a first aluminum layer 206 made of a 400-nm-thick aluminum alloy film, and a second barrier metal layer 207 made of a 50-nm-thick titanium nitride film, is formed by conducting a dry etching process using the first etching mask 600.

Next, as shown in FIG. 2B, a first interlayer dielectric layer 304 made of a 1000-nm-thick silicon dioxide film is formed with a plasma chemical vapor deposition (CVD) method in such a manner as to cover the first metal wiring 700. After this, planarity of the first interlayer dielectric layer 304 is increased using a chemical-mechanical polishing method and then an opening 501 formed in the first interlayer dielectric layer in order for the first metal wiring 700 to become exposed is provided using lithography and dry etching. The area where the opening is provided serves as an MIM capacitor. Next, a dielectric layer 400 made of a 50-nm-thick silicon dioxide film is formed by conducting a plasma CVD process using tetraethoxysilane as a raw material, in such a manner as to cover the first metal wiring 700 exposed inside the opening 501 formed in the first interlayer dielectric layer. Next, in order to form interconnect via plugs for establishing electrical connections to the portions of the first metal wiring that exist in areas other than the MIM capacitor, a second etching mask 601 having an opening in a desired area is formed on the dielectric film 400 and a second opening 502 is formed by conducting a dry etching process using the second etching mask 601.

Furthermore, as shown in FIG. 3A, a tungsten film is formed by sputtering and CVD in such a manner as to fill in the openings formed in the first interlayer dielectric layer 304, then the tungsten film portions in areas other than the openings are removed by chemical-mechanical polishing, and a first conductive plug 250 and a second conductive plug 251 are formed. Next, as shown in 3B, a titanium nitride film with a film thickness of 50 nm, an aluminum alloy film with a film thickness of 400 nm, and another titanium nitride film with a film thickness of 50 nm are formed in that order. After this, second metal wiring 701 including a third barrier metal layer 208 made of a 50-nm-thick titanium nitride film, a second aluminum layer 209 made of a 400-nm-thick aluminum alloy film, and a fourth barrier metal layer 210 made of a 50-nm-thick titanium nitride film, is formed in a desired area by lithography and dry etching. The use of the above processes makes it possible to form an MIM capacitor constructed of the first metal wiring 700, the dielectric film 400, the first conductive plug 250, and the second metal wiring 701. Hereinafter, the MIM capacitor that is formed, pursuant to the above processes, is referred to as conventional example 1 or as the MIM capacitor based thereon.

The MIM capacitor based on conventional example 1 can be formed during a wiring process since the forming temperature of electrodes is 450° C. or less. Also, since a metallic material of low electrical resistance can be used for the electrodes, the use of the MIM capacitor makes it possible to solve the problems that the PIP capacitor poses.

The thus-formed MIM capacitor, however, has the disadvantage that it cannot easily enhance performance. In the foregoing technique, after interconnect via plugs have been formed in the wiring positioned in the underlayer serving as a lower electrode, a dielectric film is formed using the CVD method. In general, silicon dioxide films and silicon nitride films can be formed by CVD at temperatures below 450° C., the maximum permissible temperature in wiring, and the two types of films are about 4 $\epsilon r$ and 7 $\epsilon r$, respectively, in relative permittivity. Since the minimum film thickness of the nondefective films which can be formed in the interconnect via plugs each having a depth equal to or greater than wiring height is about 50 nm, the maximum permissible capacitance density in the case of silicon dioxides is 0.7 fF per square micrometer, and that of silicon nitrides is 1.2 fF per square micrometer. Accordingly, there have been the problems in that it is difficult to reduce the area occupied by MIM elements in one IC chip and thus in that the IC chip itself increases in area.

Using materials (high-permittivity materials) whose relative permittivities are higher than those of silicon dioxides or silicon nitrides is being studied as a method of solving the above problems. Typically, tantalum oxides, hafnium oxides, titanium oxides, and the like are being studied as materials whose relative permittivities are 20 $\epsilon r$ or more. A conventional example of the MIM capacitor forming processes using such a high-permittivity material is described below using FIGS. 4A to 4C.

As shown in FIG. 4A, a first barrier metal film 200 made of 50-nm-thick titanium nitride, a first aluminum film 201 made of a 400-nm-thick aluminum alloy, and a second barrier metal film 202 made of 50-nm-thick titanium nitride, and a dielectric film 400 and an upper electrode 203, made of 50-nm-thick tantalum oxide and 50-nm-thick titanium nitride, respectively, by use of reactive sputtering, are formed in that order on a substrate 100 having semiconductor devices formed thereon. After that, a first etching mask 600 is formed in a desired area by lithography.

Next, as shown in FIG. 4B, after the upper electrode 203 and the dielectric film 400 are patterned using the first etching mask 600, a second etching mask 601 is formed using lithography and then first metal wiring 700 including a first barrier metal layer 205, a first aluminum layer 206, and a second barrier metal layer 207, is formed by dry etching.

Furthermore, as shown in FIG. 4C, after a first interlayer dielectric layer 304 made of a 1000-nm-thick silicon dioxide film is formed using plasma chemical vapor deposition (CVD), the first interlayer dielectric layer 304 is made planar by chemical-mechanical polishing. After this, a patterned upper electrode 204 or the first metal wiring 700 is exposed by forming an opening using lithography and dry etching, and then a first conductive plug 250 made of tungsten and connected to the patterned upper electrode 204, and a second conductive plug 251 made of tungsten and connected to the first metal wiring 700 are formed in the opening. Finally, second metal wiring 701 including a third barrier metal layer 208 made of a 50-nm-thick titanium nitride film, a second aluminum layer 209 made of a 400-nm-thick aluminum alloy, and a fourth barrier metal layer 210 made of a 50-nm-thick titanium nitride film, is formed in a desired area by lithography and dry etching. The use of the above processes makes it possible to form an MIM capacitor made up of the first metal wiring 700, a patterned dielectric film 401, the patterned upper electrode 204, the first conductive plug 250, and the second metal wiring 701. Hereinafter, the MIM capacitor that is formed, pursuant to the above processes, is referred to as conventional example 2 or as the MIM capacitor based thereon.

The MIM capacitor based on conventional example 2 can use a 50-nm-thick tantalum oxide (relative permittivity: 24 $\epsilon r$), whereby it becomes possible to achieve a capacitance density of 4 fF per square micrometer and hence to reduce the area of the capacitor in an IC chip. The thus-formed MIM capacitor, however, has the disadvantages that it is low in dielectric breakdown voltage and significant in leakage current. A structure in which the upper electrode 204 and dielectric film 401 patterned at the end of the MIM capacitor match at the respective ends and the first metal wiring 700 serving as a lower electrode is positioned directly under the ends, is employed in the above technique. Since the end of the dielectric film has a large number of defects, increases in leakage current and decreases in dielectric breakdown voltage are liable to occur in the structure where the end of the dielectric film directly abuts the upper electrode and the lower electrode. However, in the process diagram of FIG. 4A, after the upper electrode 203 and the dielectric film 400 have been patterned using the first etching mask 600, the ends of the dielectric film 401 and upper electrode 204 which have been patterned by conducting lithographic and dry etching processes once again can be formed in shifted form. Thus, the upper electrode 204 and dielectric film 401 patterned at the end of the MIM capacitor can be prevented from matching at the respective ends. At the same time, however, the above technique has the disadvantage that since the upper electrode 203 is dry-etched on the dielectric film 400, dielectric breakdown strength is reduced by the plasma damage and/or local film thinning-down occurring in the area located directly under the end of the patterned upper electrode 204 on the dielectric film 400.

Employing a structure having a dielectric film and a second dielectric layer interposed directly under the end of the upper electrode of the MIM capacitor is being proposed as a method of solving the above problems. This makes it possible to minimize the leakage current increases and dielectric breakdown voltage decreases occurring at the end of the MIM capacitor. A conventional example of such MIM capacitor forming processes is described below using FIGS. 5A to 5C and 6A to 6C.

As shown in FIG. 5A, first metal wiring 700 including a first barrier metal layer 205 made of a 50-nm-thick titanium nitride film, a first aluminum layer 206 made of a 400-nm-thick aluminum alloy, and a second barrier metal layer 207 made of a 50-nm-thick titanium nitride film, is first formed on a substrate 100 having semiconductor devices formed thereon. After this, a first intermediate layer 300 made of 100-nm-thick silicon dioxide is formed on the entire surface of the first metal wiring 700 by plasma CVD.

Next, as shown in FIG. 5B, after the surface of the first metal wiring 700 is exposed by forming an opening in the first intermediate layer 300 by lithography and dry etching. After this, a dielectric film 400 made of a 50-nm-thick tantalum oxide, and an upper electrode 203 made of a 50-nm-thick titanium oxide film are sequentially formed, both by reactive sputtering, in such a manner as to cover the opening, and then a first etching mask 600 is formed in a desired area by using lithography.

Furthermore, as shown in FIG. 5C, a patterned dielectric film 401 and a patterned upper electrode 204 are formed by conducting a dry etching process using the first etching mask 600. At this time, an etching residue 800 made up of the upper electrode 203 and the dielectric film 400 is present on the sidewalls of the first metal wiring 700.

Next, as shown in FIG. 6A, after a first interlayer dielectric layer 304 made of a 1000-nm-thick silicon dioxide film is formed using plasma chemical vapor deposition (CVD), the first interlayer dielectric layer 304 is made planar by chemical-mechanical polishing. After this, a patterned upper electrode 204 or the first metal wiring 700 is exposed by forming an opening using lithography and dry etching, and then a first conductive plug 250 made of tungsten and connected to the patterned upper electrode 204, and a second conductive plug 251 made of tungsten and connected to the first metal wiring 700 are formed in the opening. Finally, as shown in FIG. 6B, second metal wiring 701 including a third barrier metal layer 208 made of a 50-nm-thick titanium nitride film, a second aluminum layer 209 made of a 400-nm-thick aluminum alloy, and a fourth barrier metal layer 210 made of a 50-nm-thick titanium nitride film, is formed in a desired area by combining sputtering, lithography, and dry etching. The use of the above processes makes it possible to form an MIM capacitor made up of the first metal wiring 700, a patterned dielectric film 401, the patterned upper electrode 204, the first conductive plug 250, and the second metal wiring 701. Hereinafter, the MIM capacitor that is formed, pursuant to the above processes, is referred to as conventional example 3 or as the MIM capacitor based thereon.

For the MIM capacitor based on conventional example 3, the upper electrode 204 and dielectric film 401 patterned at the end of the MIM capacitor match at the respective ends.

However, since the first intermediate layer 300 is formed as another dielectric film directly under the ends, it becomes possible to minimize the leakage current increases and dielectric breakdown strength decreases occurring at the end of the MIM capacitor. The thus-formed MIM capacitor, however, has several disadvantages, which can be broadly divided into two. One is that as shown in FIG. 6B, since the high-permittivity tantalum oxide and the conductive titanium nitride are liable to remain as the etching residue 800 on both sides of the adjacent first metal wiring 700, coupling capacitance of the adjacent first metal wiring 700 and/or a wiring-to-wiring leakage current could increase. The other disadvantage becomes a problem particularly in areas of a narrow wiring pitch. This problem refers to one due to the fact that if the first metal wiring 700 is of a narrow wiring pitch, most of the volume between adjacent wiring portions is occupied by the first intermediate layer 300. The ICs in recent years are required to minimize interconnect coupling capacitance in order to meet the needs of further improved operating speed. Accordingly, a dielectric film formed from a material of a relative permittivity of as small as about 3.5 $\epsilon r$ or less, called a low-k material, is usually used as a dielectric film around wiring. According to conventional example 3, however, as shown in FIG. 6C, since the volume between adjacent wiring portions is occupied by the first intermediate layer having a relative permittivity of as high as about 4 $\epsilon r$, there is little room for a low-k material to enter, which, in turn, significantly obstructs reduction in the coupling capacitance of the wiring (refer to, for example, Japanese Patent Laid-open Nos. 2001-320026, 2003-188264, and 2003-282719).

The problem that the present invention is to solve is that in an MIM capacitor that uses, as a dielectric film, a high-permittivity dielectric film (such as a tantalum oxide film) that can enhance the MIM capacitor in capacitance density, suppressing an increase in leakage current and a decrease in dielectric breakdown strength causes an increase in leakage current between adjacent wiring portions, and/or an increase in interconnect coupling capacitance, in the lower metal wiring of the MIM capacitor that forms part of its lower electrode.

SUMMARY OF THE INVENTION

The above problem can be solved by using the process steps of, in an MIM capacitor including an upper electrode, a dielectric film, and a lower electrode: forming a second dielectric film having an opening at the top of the upper electrode; forming the dielectric film in such a manner as to abut the lower electrode via the opening; forming the upper electrode on the dielectric film; leaving the upper electrode and the dielectric film in such a form as to embrace the opening entirely; then leaving the second dielectric film and the lower electrode so that both have the same widths as, or widths greater than, those of the upper electrode and the dielectric film; and thus forming the second dielectric film and the dielectric film between the upper and lower electrodes, at the end of the MIM capacitor.

The above problem can likewise be solved by using the process steps of, in an MIM capacitor including an upper electrode, a dielectric film, and a lower electrode: forming and patterning the lower electrode in such a form as to embrace via plugs opened at the top of patterned lower metal wiring; forming, in order to expose the surface of the lower electrode, a second dielectric film having an opening whose width is narrower than the lower electrode; forming the dielectric film in such a manner as to abut the lower electrode via the opening; forming the upper electrode on the dielectric film; leaving the upper electrode and the dielectric film by patterning the opening in such a form as to entirely embrace the opening; and thus forming the second dielectric film and the dielectric film between the upper and lower electrodes, at the end of the MIM capacitor.

According to the present invention, it becomes possible, while enhancing the capacitance density of an MIM capacitor and minimizing an increase in leakage current and a decrease in dielectric breakdown strength, to reduce any leakage currents between adjacent wiring portions and reduce interconnect coupling capacitance, in metal wiring formed adjacently to the MIM capacitor. A semiconductor device having a high-performance high-reliability capacitor can thus be obtained.

BRIEF DESCRIPTION OF THE DRAWINGS

FIG. 11 is diagram comparing a conventional example with the first embodiment in terms of the coupling capacitance between adjacent metal wiring portions;

DESCRIPTION OF THE PREFERRED EMBODIMENTS

Embodiments of the present invention will be described below using the accompanying drawings. Each of the drawings is depicted schematically, and sections unnecessary for the description are omitted.

First Embodiment

Figure 7A:
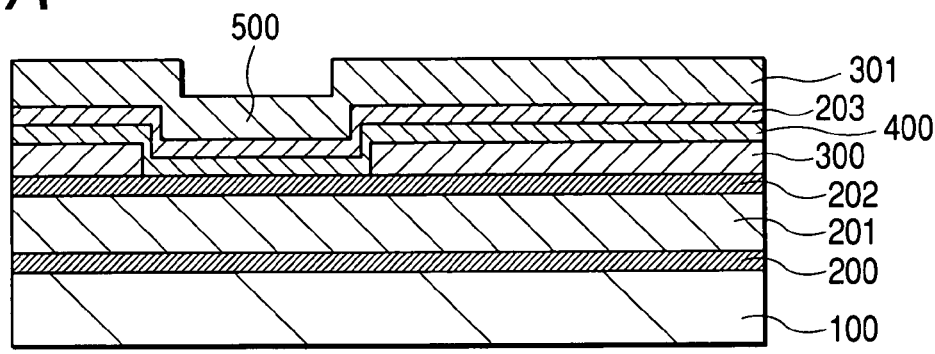
FIGS. 7A to 7C are sectional schematic views of major elements, showing a manufacturing process for the semiconductor device in the first embodiment of the present invention.

FIGS. 7A to 7C and 8A to 8C are sectional views showing a manufacturing process for a semiconductor device based on a first embodiment of the present invention. The description below is given in order of process steps. First, as shown in FIG. 7A, on a substrate 100 having semiconductor devices formed thereon, a first barrier metal film 200 made of 50-nm-thick titanium nitride, a first aluminum film 201 made of a 400-nm-thick aluminum alloy, and a second barrier metal film 202 made of 50-nm-thick titanium nitride are formed using a sputtering method. After this, a first intermediate layer 300 made of a 100-nm-thick silicon dioxide film is formed using a plasma CVD method, and then a first opening 500 is formed in a desired area of the first intermediate layer 300 by using lithography and dry etching. Next, a dielectric film 400 made of 50-nm-thick tantalum oxide, an upper electrode 203 made of 50-nm-thickness titanium nitride, and a hard mask 301 made of 100-nm-thick silicon dioxide are formed by reactive sputtering, sputtering, and plasma CVD, respectively, in such a form as to cover the first opening 500.

Figure 7B:
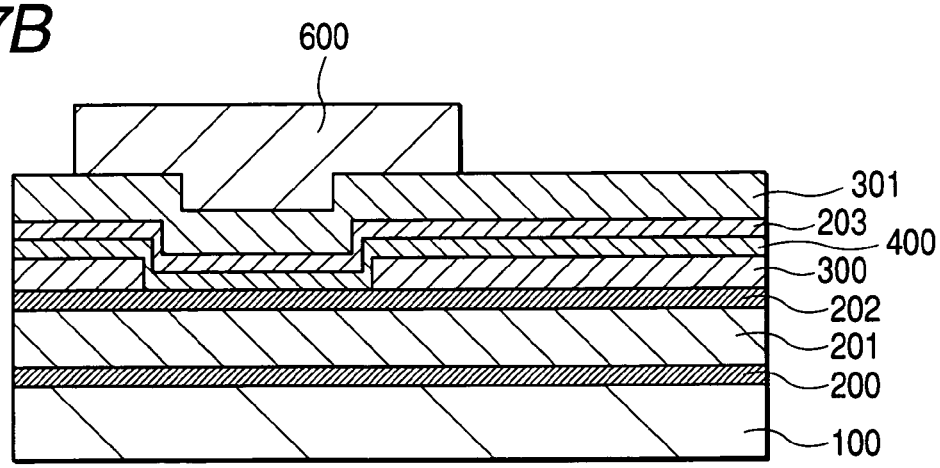
Figure 7C:
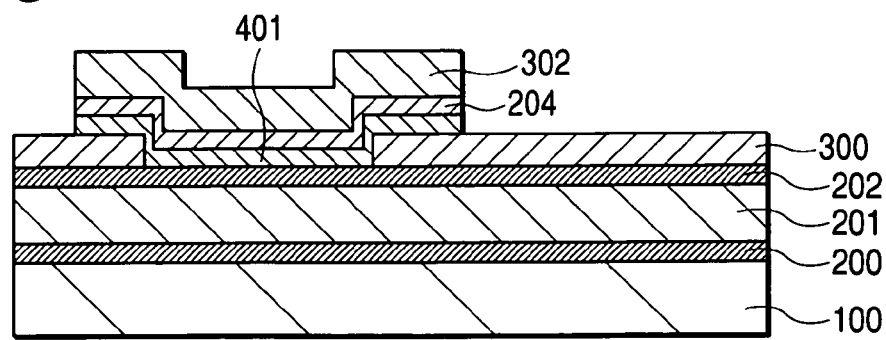

Next, as shown in FIG. 7B, a first etching mask 600 is lithographically formed in such a manner as to protect an area in which an MIM capacitor is to be formed. After this, as shown in FIG. 7C, a patterned hard mask 302, a patterned upper electrode 204, and a patterned dielectric film 401 are formed by conducting a dry etching process using the first etching mask 600 and a fluorine-containing halogen gas. After that, the first etching mask 600 is ashed and a residue thereof is removed (FIG. 7C). Since dry etching in this process step does not involve fine patterning, an ending point of etching can be easily identified. In addition, even if the dielectric film 400 to be patterned is partly left, this does not pose a serious problem in subsequent process steps.

Figure 8A:
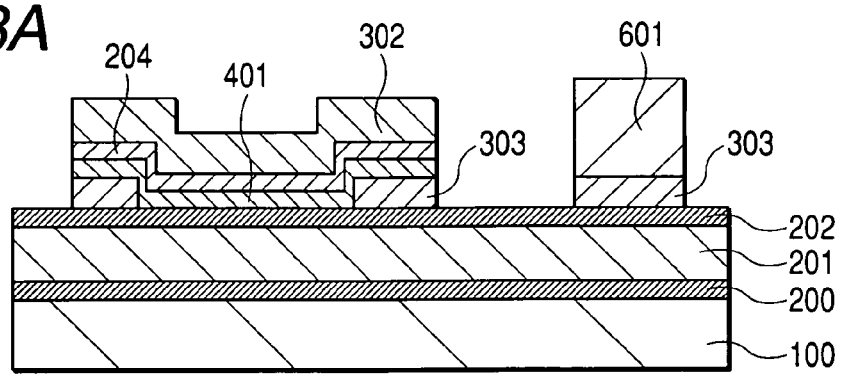
FIGS. 8A to 8C are sectional schematic views of major elements, showing another manufacturing process for the semiconductor device in the first embodiment of the present invention.
Figure 8B:
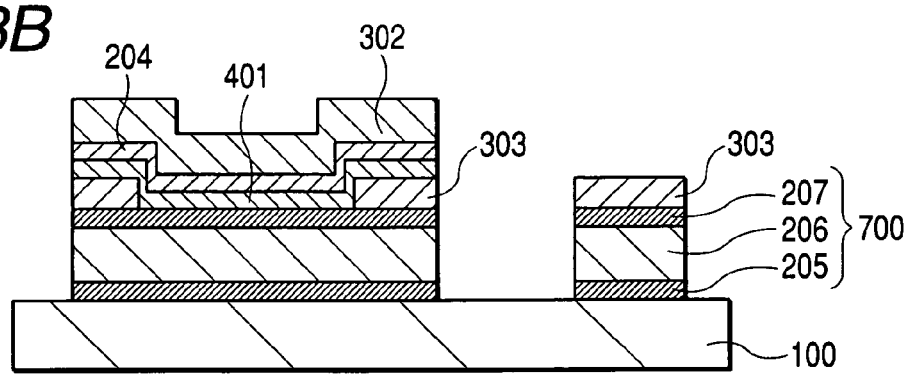

Next, as shown in FIG. 8A, a second etching mask 601 is lithographically formed in the area where metal wiring is to be formed, except in the areas covered with the patterned hard mask 302, and then the first intermediate layer 300 is dry-etched using the second etching mask 601. Following this, a chlorine-gas-based dry etching process using the patterned hard mask 302, the second etching mask, and a patterned first intermediate layer 303 present directly under the second etching mask, is conducted using a metal etching apparatus. Thus, as shown in FIG. 8B, first metal wiring 700 including a first barrier metal layer 205, a first aluminum layer 206, and a second barrier metal layer 207, is formed and the second etching mask is removed by an asher. In this process step, since a hard mask almost free from dimensional shifting is used as an etching mask, the first metal wiring 700 can be processed with high dimensional controllability.

Figure 8C:
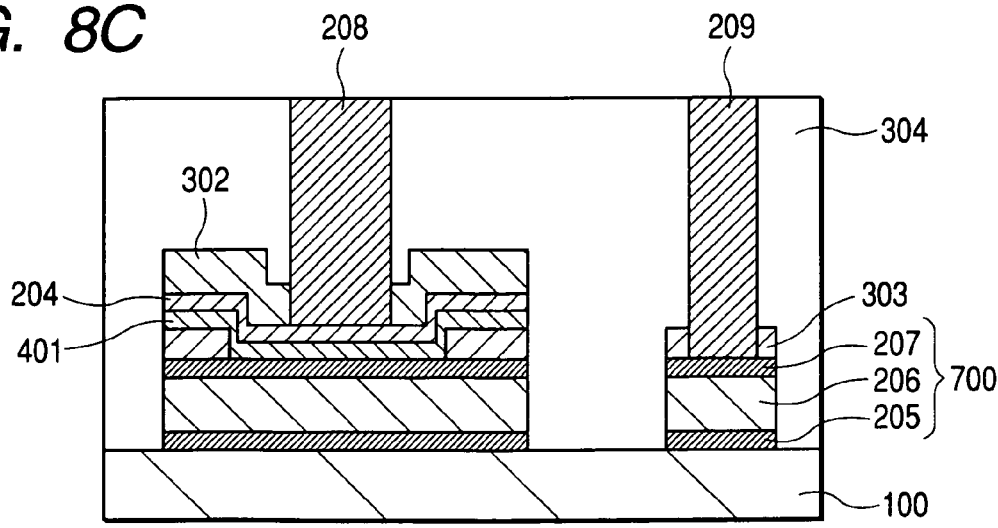

Next, as shown in FIG. 8C, a first interlayer dielectric layer 304 made of a 1000 nm-thickness silicon dioxide film is formed using plasma CVD, and then the first interlayer dielectric layer 304 is made planar by chemical-mechanical polishing. After this, a patterned upper electrode 204 or the first metal wiring 700 is exposed by forming an opening using lithography and dry etching, and then a first conductive plug 250 made of tungsten and connected to the patterned upper electrode 204, and a second conductive plug 251 made of tungsten and connected to the first metal wiring 700 are formed in the opening.

Figure 1:
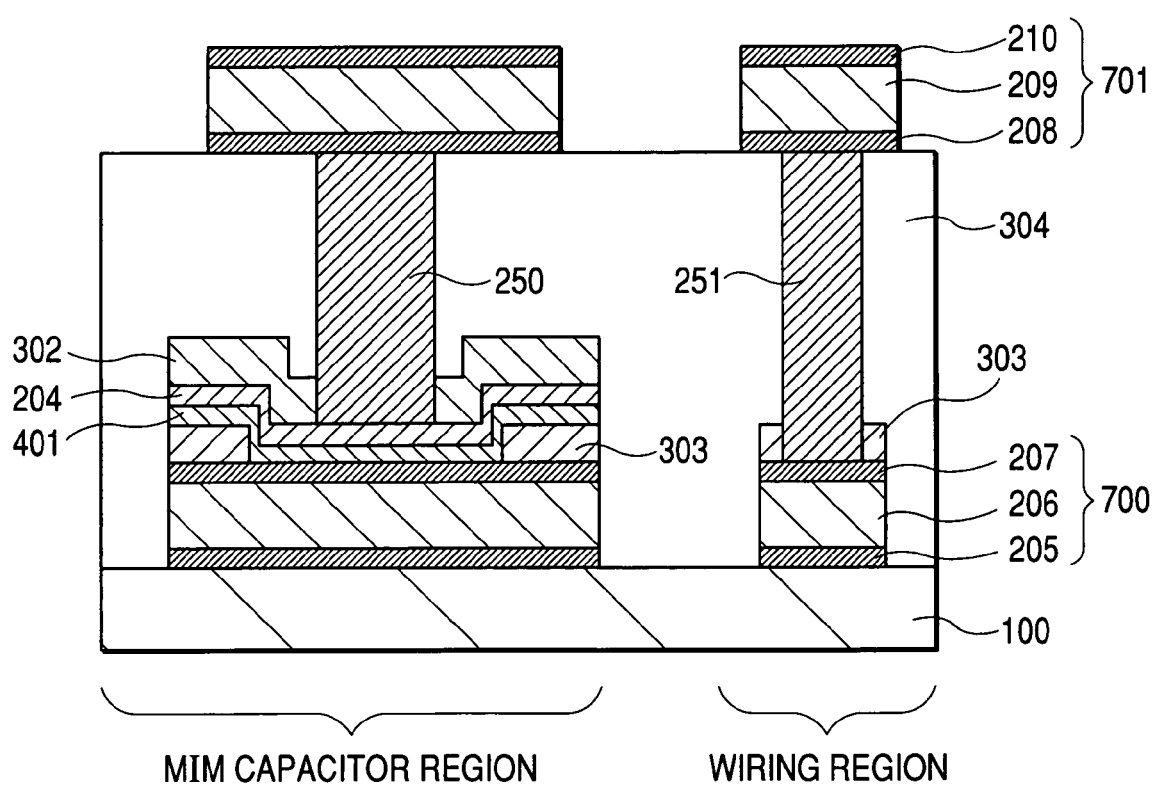
FIG. 1 is a sectional schematic view of major elements, showing a manufacturing process for a semiconductor device according to a first embodiment of the present invention.
Figure 2A:
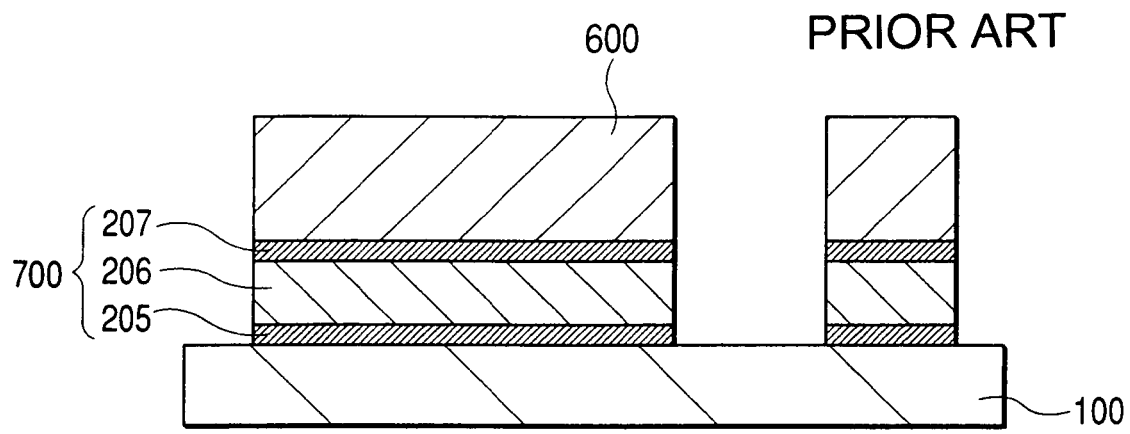
FIGS. 2A and 2B are sectional schematic views of major elements, showing a manufacturing process for a semiconductor device based on conventional example 1.
Figure 2B:
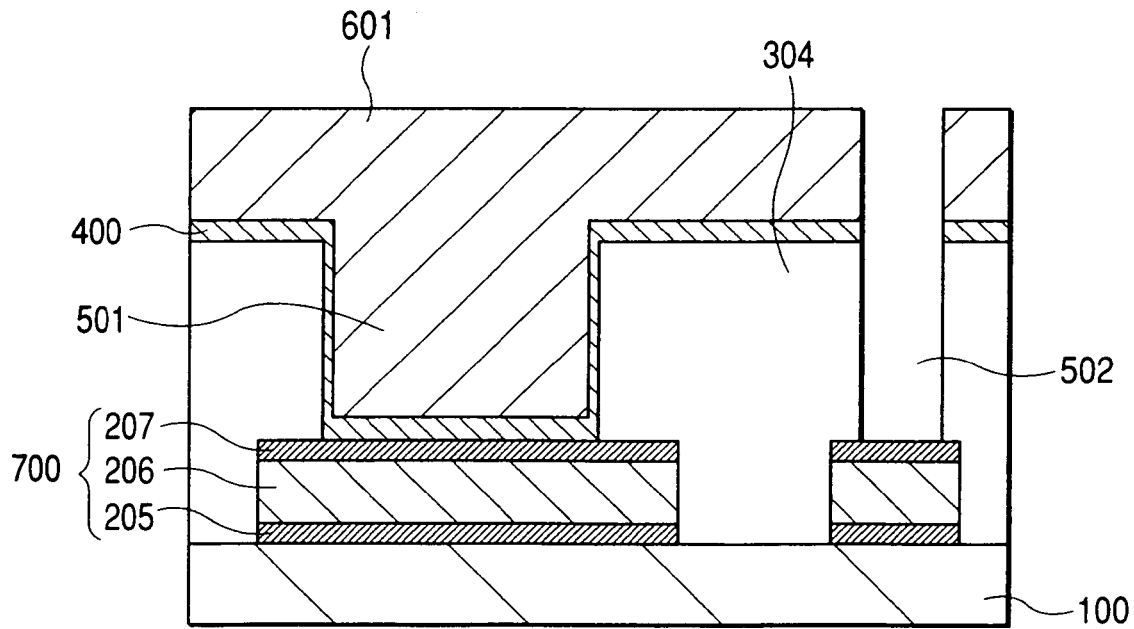
Figure 3A:
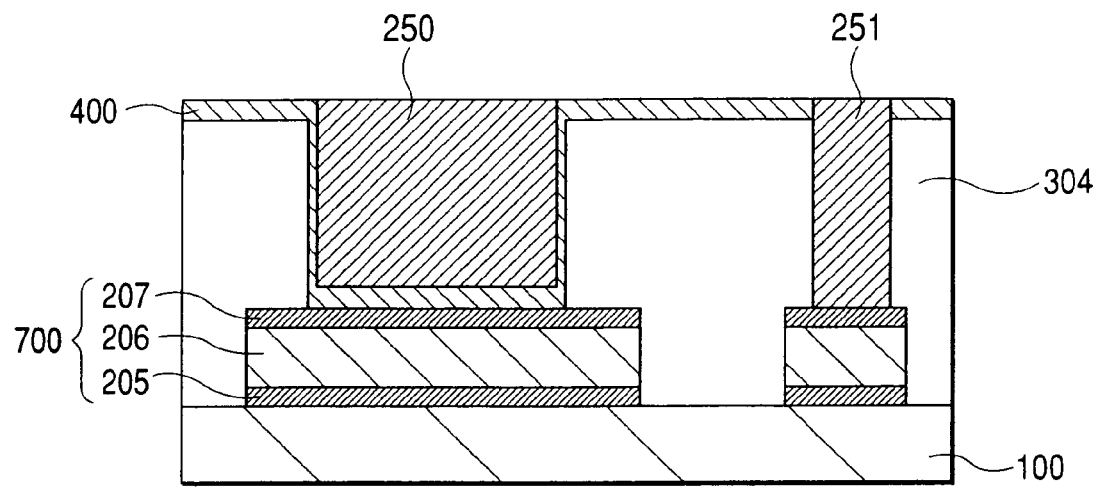
FIGS. 3A and 3B are sectional schematic views of major elements, showing another manufacturing process for the semiconductor device based on conventional example 1.
Figure 3B:
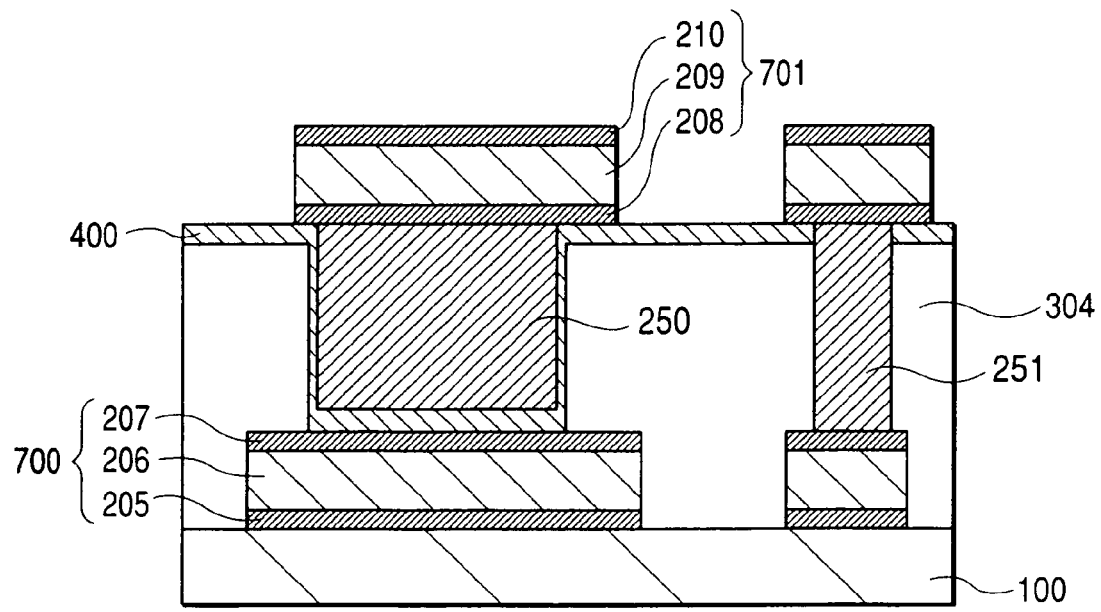
Figure 4A:
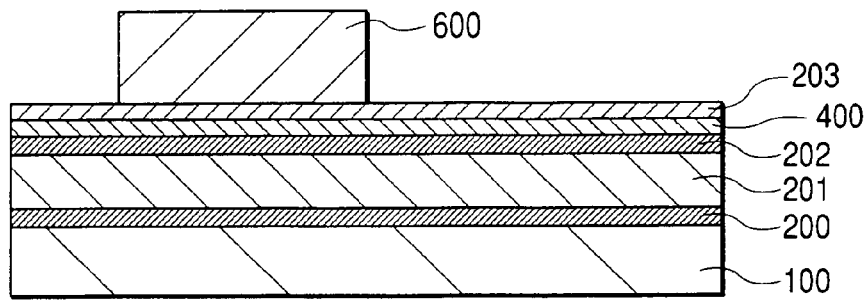
FIGS. 4A to 4C are sectional schematic views of major elements, showing a manufacturing process for a semiconductor device based on conventional example 2.
Figure 4B:
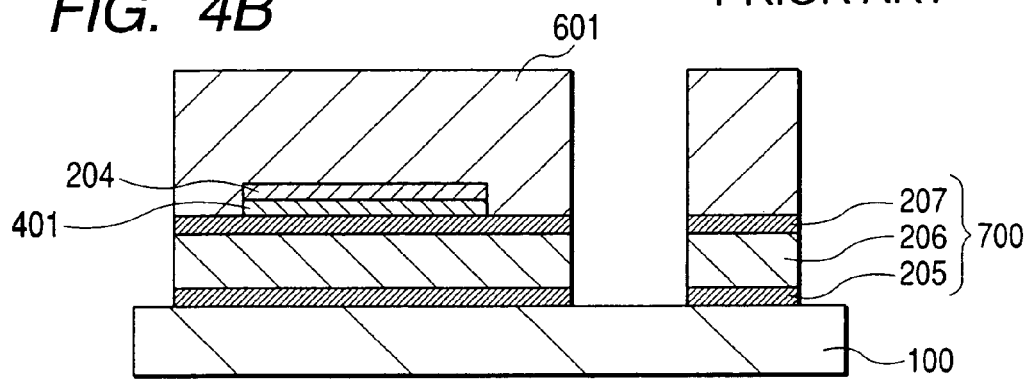
Figure 4C:
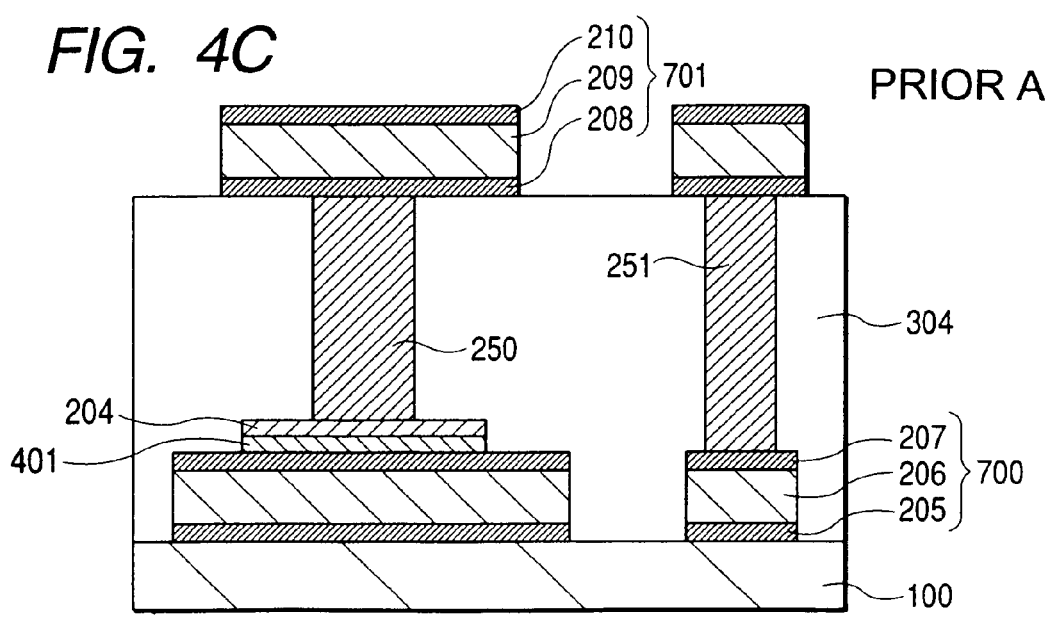
Figure 5A:
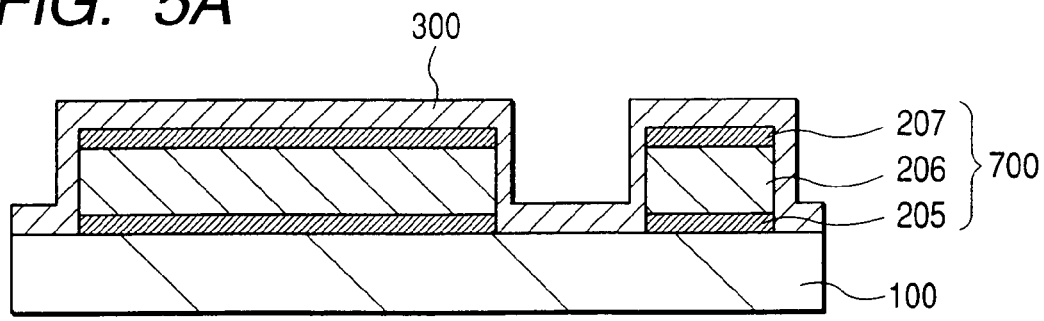
FIGS. 5A to 5C are sectional schematic views of major elements, showing a manufacturing process for a semiconductor device based on conventional example 3.
Figure 5B:
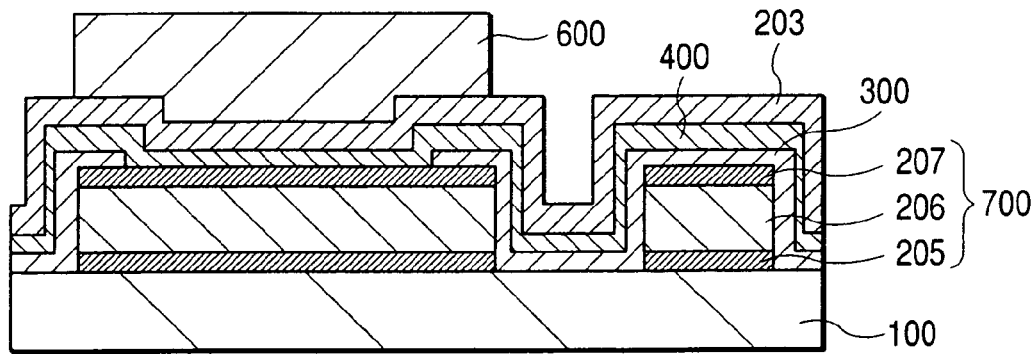
Figure 5C:
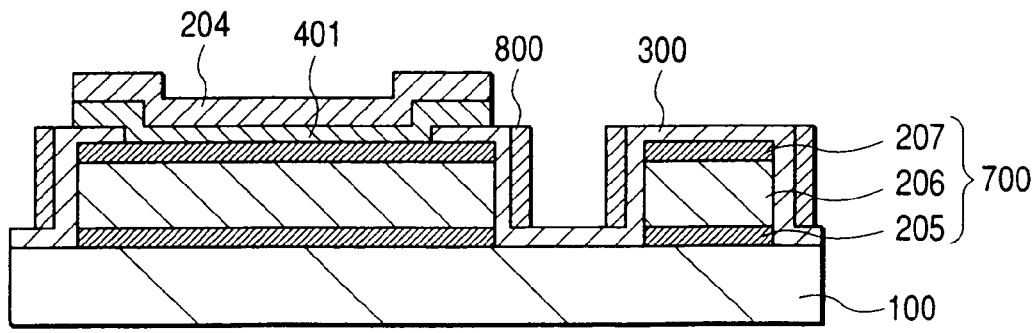
Figure 6A:
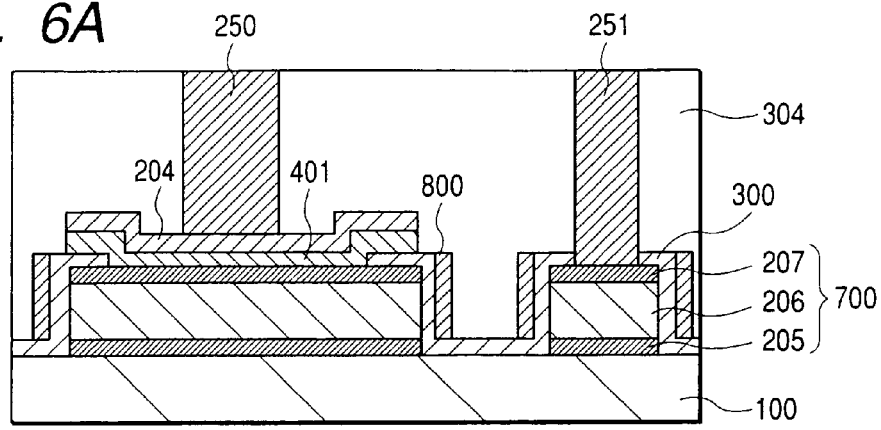
FIGS. 6A to 6C are sectional schematic views of major elements, showing another manufacturing process for the semiconductor device based on conventional example 3.
Figure 6B:
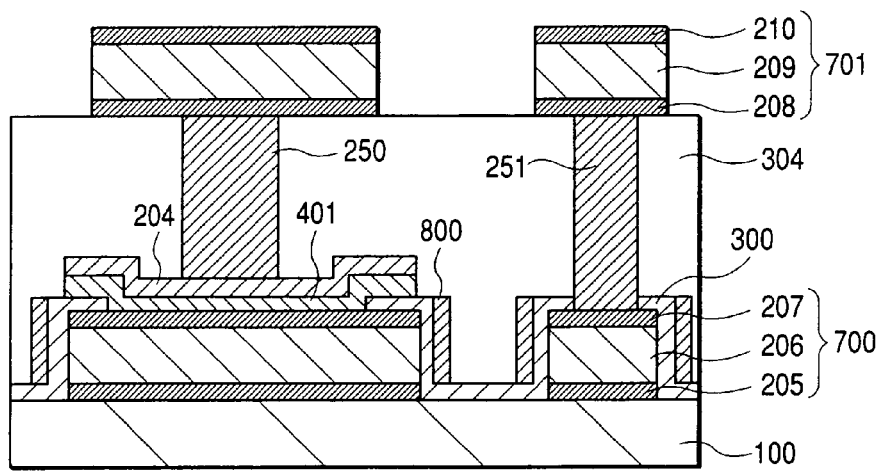
Figure 6C:
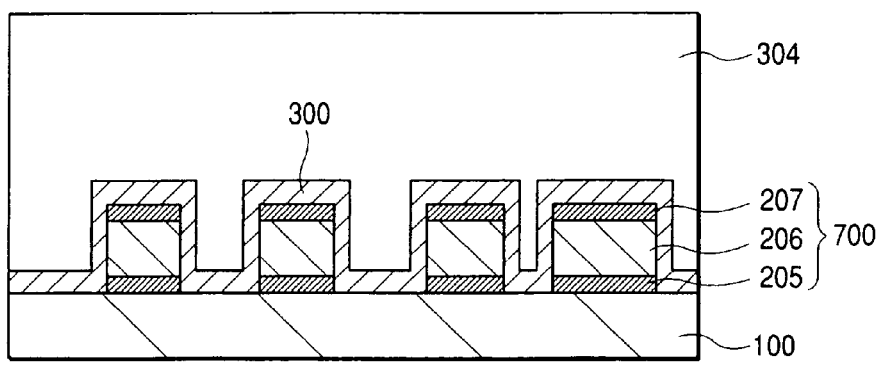

Finally, second metal wiring 701 including a third barrier metal layer 208 made of a 50-nm-thick titanium nitride film, a second aluminum layer 209 made of a 400-nm-thick aluminum alloy, and a fourth barrier metal layer 210 made of a 50-nm-thick titanium nitride film, is formed in a desired area by combining sputtering, lithography, and dry etching. Use of the above process steps makes it possible to form such semiconductor device as shown in FIG. 1, i.e., a semiconductor device that has an MIM capacitor including: the first metal wiring 700, the patterned dielectric film 401, the patterned upper electrode 204, the first conductive plug 250, and the second metal wiring 701.

Figure 9:
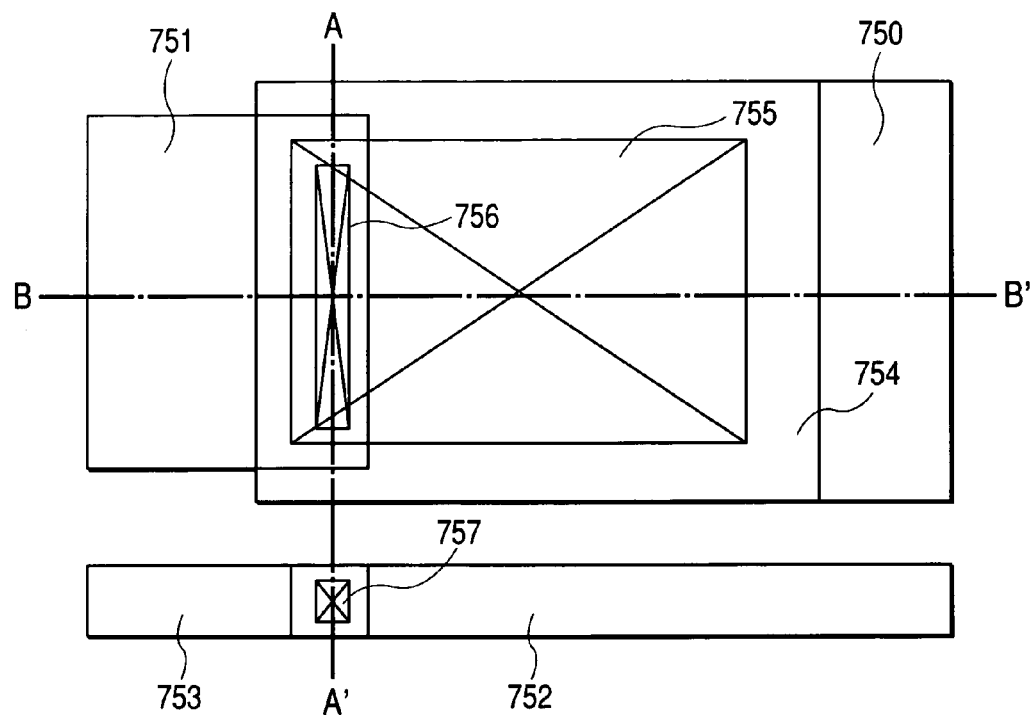
FIG. 9 is a plan layout view schematically showing the first embodiment of the present invention.

A plan layout view of an MIM capacitor which is formed using the above process steps is shown in FIG. 9. The sectional views in FIGS. 1 and 8C show section A-A' of FIG. 9.

Figure 10:
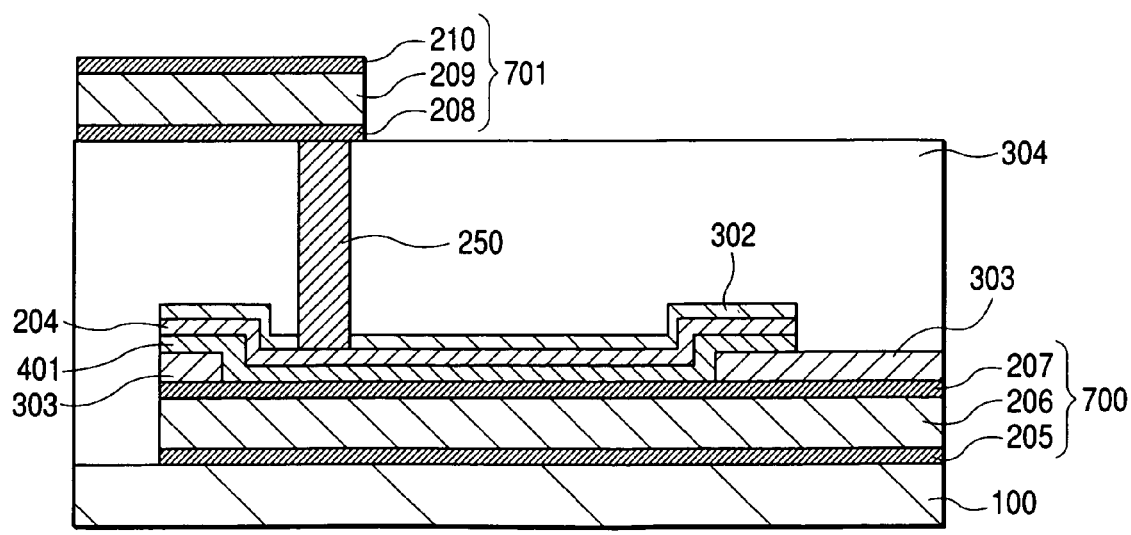
FIG. 10 is a sectional schematic view of section B-B' of the semiconductor device in the first embodiment of the present invention.

A sectional view taken in a direction of B-B' in FIG. 9 is shown in FIG. 10. In the layout view of FIG. 9, an opening 755 provided in the first intermediate layer is an area functioning as the MIM capacitor. At an edge of the MIM capacitor, i.e., at marginal portions of the area 755, a first intermediate layer 303 made of 100-nm-thick silicon dioxide is formed directly under the upper electrode expressed as an area 754.

Structures formed by setting a film thickness of the first intermediate layer 300 to 0, 10, 50, 200, and 300 nm, are provided in addition to the structure shown in the present first embodiment. The structure having the first intermediate layer formed with the film thickness of 0 nm is essentially the same as the structure of conventional example 2.

MIM capacitor performance and reliability of the thus-formed semiconductor device having an MIM capacitor were examined. As a result, a capacitance density of 4 fF/$\mu m^2$ was obtained, irrespective of the thickness of the first intermediate layer. Dependence of the leakage current density in the MIM capacitor on voltage was also evaluated. As a result, only the structures having the first intermediate layer 300 formed with the film thicknesses between 50 and 200 nm satisfies a specified dielectric breakdown strength value (in terms of the leakage current density at a voltage of 10 V, 1 $\mu$A or less per square centimeter). After close examination of the reason why dielectric breakdown strength does not satisfy the specified value, it was found that for the first intermediate layers of the 0-nm and 10-nm film thicknesses, at the edge of the MIM capacitor, a lower electrode 700 and the upper electrode 204 were directly opposed to each other across a dielectric film 401, at an edge of the dielectric film 401. This implies the possible decrease in dielectric breakdown strength due to an increase in the leakage current at the edge of the MIM capacitor. For the first intermediate layer of the 300-nm film thickness, local thinning-down of the dielectric film 400 was observed near an edge of the opening provided in the first intermediate layer. This indicates that since the film of the first intermediate layer became too thick, a shortage of coverage of the tantalum oxide film formed at the edge of the opening is likely to have become prominent. That is to say, it was found that if the first intermediate layer is too thin (e.g., 10 nm or less), a suppression effect against the leakage current increase at the edge of the MIM capacitor is lost, and that conversely, if the first intermediate layer is too thick (e.g., 300 nm or more), a sputtering coverage at the edge of the opening decreases to reduce dielectric breakdown strength.

Next, a structure using an SiOC film formed as a first interlayer dielectric film by use of plasma CVD is provided in addition to the structure shown in the present first embodiment. A relative permittivity of this SiOC film is 2.9 $\epsilon r$. Furthermore, a structure based on the process diagram shown in conventional example 3 was also provided for comparison.

MIM capacitor performance and reliability of the thus-formed semiconductor device having an MIM capacitor were examined. As a result, the dielectric breakdown strength satisfying both a performance value of 4 fF/$\mu m2$ in capacitance density and the foregoing specified value was obtained, irrespective of the kind of first interlayer dielectric film. However, there occurred differences in coupling capacitance of the first metal wiring and in the leakage current density between adjacent first metal wiring portions. As shown in FIG. 11, coupling capacitance between the adjacent first metal wiring portions in the MIM capacitor which uses the SiOC film as the first interlayer dielectric film and is formed in accordance with the present embodiment is 1.36 pF per centimeter of opposite longitudinal length, whereas the coupling capacitance of the capacitor based on conventional example 3 is 1.56 pF. This indicates a coupling capacitance increase of about 15% and obstructs faster operation of circuits and reduction in electric power consumption. When silicon dioxide is used as the first interlayer dielectric film, no significant difference is observed between the first embodiment and conventional example 3. However, evaluation results on the short yield between adjacent wiring portions in a haircomb-shaped homogeneous interlayer capacitor structure indicated that the formation of a capacitor, based on conventional example 3, tends to reduce the short yield.

That is to say, according to the present embodiment, it is possible to form a semiconductor device concurrently realizing the following: an MIM capacitor capable of achieving high capacitance density while minimizing increases in leakage current and decreases in dielectric breakdown strength, and reduction of a coupling capacitance of a wiring layer equivalent to a lower electrode of the MIM capacitor, and improvement in a wiring-to-wiring short yield. More specifically, the above becomes possible by: forming a first intermediate layer made of a 100 nm-thickness silicon dioxide film having an opening at the top of the lower electrode, then forming a dielectric film and an upper electrode in such a manner as to cover the above opening, and patterning the upper electrode, the dielectric film, the first intermediate layer, and the lower electrode in such a form as to embrace the opening entirely.

Although a tantalum oxide nitride with a film thickness of 50 nm is used as a dielectric film in the present embodiment, neither the film thickness nor the kind of material is limited by the embodiment. Capacitance density increases inversely with the film thickness of the dielectric film. For improved capacitance density, therefore, it is preferable that the film thickness be as small as possible. However, a film thickness reduction limit according to a particular operating voltage exists since reducing the film thickness also reduces dielectric breakdown strength. Also, a hafnium oxide, a zirconium oxide, a lanthanum oxide, a titanium oxide, an aluminum oxide, or the like, or a mixture thereof, or a compound that contains nitrogen (and/or the like) therein can be used as the dielectric film material, instead of tantalum oxide. Alternatively, a ferroelectric material such as PZT, STO, or BST can also be used. Furthermore, while the present embodiment uses a single-layer dielectric film as the dielectric film, this dielectric film can also be formed into a stacked structure as required. For example, leakage current density can likewise be reduced by interposing the tantalum oxide film between the upper and lower layers of aluminum oxide (or the like) with a large band gap.

Additionally, while the present embodiment primarily uses a 100-nm-thick silicon dioxide film as the first intermediate layer, the embodiment is not limited by this film thickness or this kind of material. As mentioned above, the first intermediate layer has a preferred film-thickness range, and for the current manufacturing apparatus, excellent characteristics are obtained in the range of about 50 to 200 nm in film thickness. If a technique for further improving a step coverage is adopted as a method of forming the dielectric film, although expansion of the maximum permissible film thickness of the first intermediate layer to a region of 200 nm or more can be easily anticipated, increasing this film thickness without due consideration only yields a small number of advantages. In addition, although the silicon dioxide that is formed using plasma CVD is used as the material of the first intermediate layer, the use of this material does not obstruct selection of other materials, provided that the use of the material suits an intended purpose. More specifically, it is possible to use a low-k film (or the like) represented by silicon nitride, silicon oxynitride, silicon carbide, silicon nitrocarbide, aluminum oxide, SiOC, and the like. If silicon nitride, silicon oxynitride, or aluminum oxide is used, it is possible to improve dry-etching selectivity, and they are used as a light-absorbing layer during lithography. These materials, however, have the disadvantage that their high relative permittivities increase interconnect coupling capacitance.

Because of their low relative permittivities, silicon carbide, silicon nitrocarbide, an SiOC film, and the like are effective for reduction in coupling capacitance, whereas these materials have the disadvantage that they do not easily reduce leakage current. Furthermore, although the present embodiment uses single-layer silicon dioxide as the first intermediate layer, this layer can also be formed into a stacked structure made up of plural layers. More specifically, in the structure where silicon nitride is used as the layer abutting on the lower electrode and silicon dioxide is used as the layer formed on the silicon nitride layer, it becomes easy to control a sectional taper angle of the opening provided in the first intermediate layer. If this taper angle is highly controllable, the coverage of the dielectric film is likely to be improved, which is effective for improving dielectric breakdown strength. The high controllability of the taper angle also improves controllability of an area of the opening in the MIM capacitor, thus offering the advantage that a desired dielectric constant can be obtained with high reproducibility.

Besides, while the present embodiment uses 50-nm-thick titanium nitride to form the upper electrode, neither the film thickness nor the kind of material is limited by the embodiment. If the upper electrode is too thin, when via plugs are opened, these via plugs could break through the upper electrode, damaging the dielectric film located thereunder. Conversely, if the upper electrode is too thick, since this means that a resistor is inserted in series with respect to the MIM capacitor, high-frequency characteristics could deteriorate. In the range where titanium nitride is used, a film thickness from about 50 to 100 nm is preferred. Tantalum, tungsten, or a metal based mainly on a nitride of tungsten, or aluminum, or an alloy thereof, or the like is usable as a material of the upper electrode, instead of titanium nitride. Furthermore, although titanium nitride is used as the barrier metal for forming first and second metal wiring, it is possible, as mentioned above, to use tantalum, tungsten, or a metal based mainly on a nitride of tungsten, instead of titanium nitride. Besides, if there is a margin on reliability, it is also possible to employ a structure not using a barrier metal. Moreover, forming both the upper electrode and the barrier metal into a stacked structure made up of plural layers does not present any problems.

Additionally, in the present embodiment, as shown in the layout view of FIG. 9, the upper electrode and the upper metal wiring are connected by one via plug 756 positioned in the opening. Via plugs, however, do not have their positions, quantity, or sizes limited by the embodiment. Larger-size via plugs improve high-frequency characteristics since they reduce coupling resistance. In general, however, a maximum permissible size exists for the tungsten formed with the CVD method. Although using an aluminum alloy to fill in a via plug alleviates the size limit, this filling-in method increases the number of other process steps required, such as planarizing the interlayer dielectric film and the metal. Additionally, in the present embodiment, the via plug is positioned inside the opening. This construction minimizes coupling resistance associated with the upper electrode, whereas the construction could damage the dielectric film if the amount of etching during opening of the via plug is too great. If the via plug is positioned outside the opening, i.e., in an area internal to the area 754 in FIG. 9 and external to the area 755 therein, a margin against dielectric film damage due to over-etching is improved extensively. This is due to the fact that, even if the via plug breaks through the upper electrode and reaches the dielectric film, since the first intermediate layer exists directly under the dielectric film, damage thereto does not directly lead to deterioration of the MIM capacitor in characteristics. However, since coupling resistance due to sheet resistance of the upper electrode increases, high-frequency characteristics could be adversely affected. Although, in the layout view of FIG. 9, the MIM capacitor has only the single opening 755 formed in the first intermediate layer, this opening can also be split into a plurality of openings to obtain a multi-opening MIM capacitor.

In addition, while, in the present embodiment, the process steps using primarily a silicon dioxide film as the first interlayer dielectric film have been described by way of example, the embodiment is not limited to/by this material and it is possible to use a low-k material capable of reducing the coupling capacitance of the wiring. It is also possible to use such an SiOC film (carbon-containing silicon dioxide film) as represented by Black Diamond (registered trademark of Applied Materials, Inc.), such an organic film as represented by SiLK (registered trademark of the Dow Chemicals Company), other low-k materials with a pore(s) introduced thereinto, a fluorine-containing silicon dioxide film, or the like. When such a low-k material is used, protective dielectric films of some kind are required and thus a first interlayer dielectric film also includes the multilayer film constructed of these plural dielectric films. Furthermore, when such a low-k material is used, restrictions on process temperature and the like usually make it difficult to apply the CVD method to tungsten, and if this is the case, the via plug is preferably filled in with aluminum or the like.

Although the aluminum wiring that is processed by dry etching is used as second metal wiring in the present embodiment, the aluminum wiring or copper wiring that is processed with a damascene method can be used instead, as required. In this case, it is also possible to reduce the number of process steps by applying a dual damascene method capable of forming the via plug at the same time.

Second Embodiment

FIGS. 12A to 12C, 13A and 13B are sectional views showing another manufacturing process for a semiconductor device of the present invention. The description below is given in order of process steps.

Figure 12A:
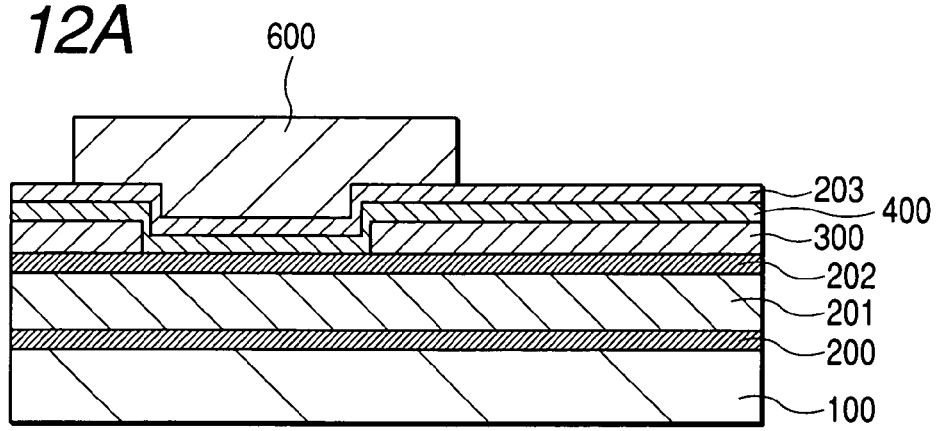
FIGS. 12A to 12C are sectional schematic views of major elements, showing a manufacturing process for a semiconductor device in a second embodiment of the present invention.

First, as shown in FIG. 12A, on a substrate 100 having semiconductor devices formed thereon, a first barrier metal film 200 made of 50-nm-thick titanium nitride, a first aluminum film 201 made of a 400-nm-thick aluminum alloy, and a second barrier metal film 202 made of 50-nm-thick titanium nitride are formed using a sputtering method. After this, a first intermediate layer 300 made of a 100-nm thick silicon dioxide film is formed using a plasma CVD method, and then an opening is provided in a desired area of the first intermediate layer 300 by using lithography and dry etching. Next, a dielectric film 400 made of 50-nm-thick tantalum oxide, and an upper electrode 203 made of 50-nm-thick titanium nitride are formed by reactive sputtering and lithography, respectively, in such a form as to cover the opening. Furthermore, a first etching mask 600 is formed by lithography to protect an area in which an MIM capacitor is to be formed.

Figure 12B:
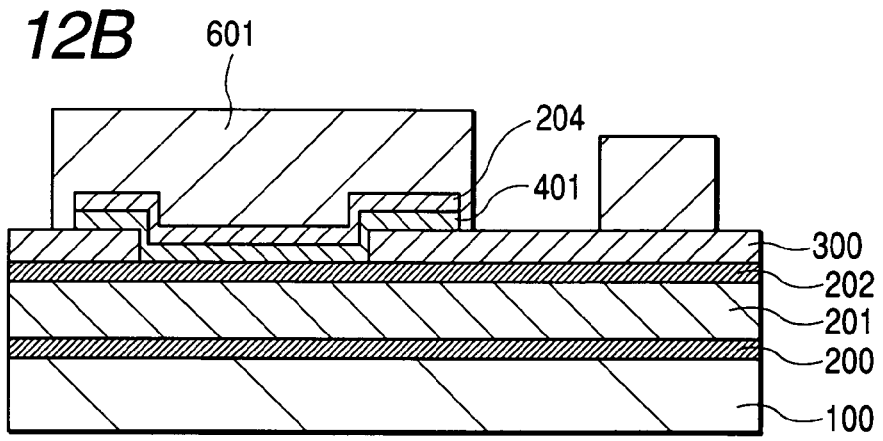

Next, a patterned upper electrode 204 and a patterned dielectric film 401 are formed by conducting a dry etching process using the first etching mask 600 and a fluorine-containing halogen gas. After that, the first etching mask 600 is ashed and a residue thereof is removed. After these, a second etching mask 601 is further formed by lithography, as shown in FIG. 12B, in such a form as to protect the area where the MIM capacitor is to be formed and an area in which metal wiring is to be formed.

Figure 12C:
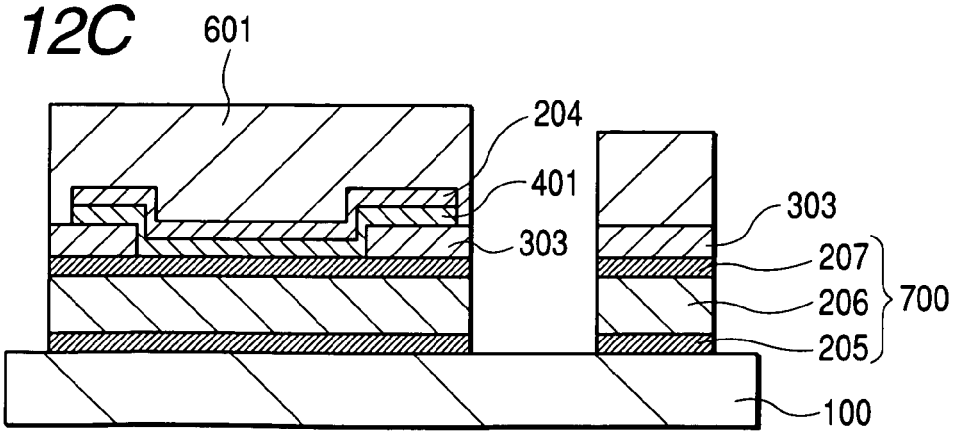

Next, the first intermediate layer 300 is dry-etched using the second etching mask 601. Following this, dry etching with a metal etching apparatus was conducted and first metal wiring 700 including a first barrier metal layer 205, a first aluminum layer 206, and a second barrier metal layer 207, is formed using the second etching mask 601, as shown in FIG. 12C.

Figure 13A:
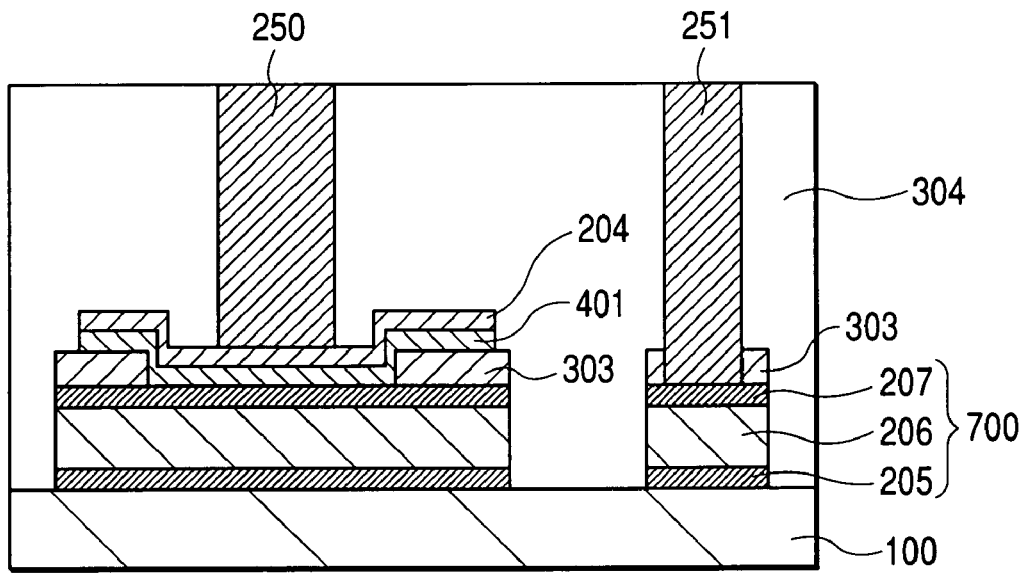
FIGS. 13A, 13B are sectional schematic views of major elements, showing another manufacturing process for the semiconductor device in the second embodiment of the present invention.

Next, as shown in FIG. 13A, the second etching mask 601 is removed by an asher, then a first interlayer dielectric layer 304 made of a 1000-nm-thick silicon dioxide film is formed using plasma CVD, and the first interlayer dielectric layer 304 is made planar by chemical-mechanical polishing. Next, the patterned upper electrode 204 or the first metal wiring 700 is exposed by forming an opening using lithography and dry etching. After that, a first conductive plug 250 made of tungsten and connected to the patterned upper electrode 204, and a second conductive plug 251 made of tungsten and connected to the first metal wiring 700 are formed in the opening.

Figure 13B:
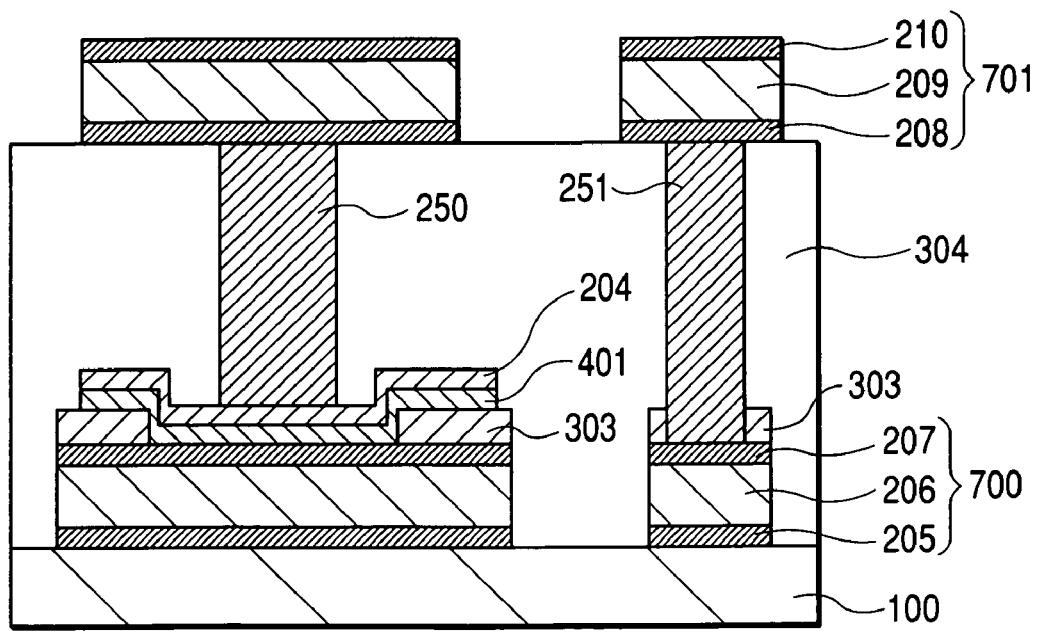

Finally, second metal wiring 701 including a third barrier metal layer 208 made of a 50-nm-thick titanium nitride film, a second aluminum layer 209 made of a 400-nm-thick aluminum alloy, and a fourth barrier metal layer 210 made of a 50-nm-thick titanium nitride film, is formed in a desired area by combining sputtering, lithography, and dry etching. Use of the above process steps makes it possible to form such a semiconductor device as shown in FIG. 13B, i.e., a semiconductor device that has an MIM capacitor including: the first metal wiring 700, the patterned dielectric film 401, the upper electrode 204, the first conductive plug 250, and the second metal wiring 701.

A structure using a SiOC film formed as a first interlayer dielectric film by use of plasma CVD is provided in addition to the structure shown in the second embodiment.

MIM capacitor performance and reliability of the thus-formed semiconductor device having an MIM capacitor were examined. A capacitance density value and a specified dielectric breakdown strength value, both equivalent to those shown in the first embodiment, were obtained as a result. Obtained values relating to coupling capacitance and short yield between adjacent first metal wiring portions were also equivalent to those of the first embodiment.

That is to say, according to the present embodiment, it is possible to form a semiconductor device concurrently realizing the following: an MIM capacitor capable of achieving high capacitance density while minimizing increases in leakage current and decreases in dielectric breakdown strength, reduction of a coupling capacitance of a wiring layer equivalent to a lower electrode of the MIM capacitor, and improvement in a wiring-to-wiring short yield. More specifically, the above becomes possible by: forming a first intermediate layer made of a 100-nm-thick silicon dioxide film having an opening at the top of the lower electrode, then forming a dielectric film and an upper electrode in such a manner as to cover the above opening, and patterning the upper electrode, the dielectric film, the first intermediate layer, and the lower electrode in such a form as to embrace the opening entirely.

The present embodiment, unlike the first embodiment, uses an etching mask to pattern the multilayer aluminum film located directly under the MIM capacitor. Since a hard mask is not used, the present embodiment is slightly disadvantageous in terms of fine-patterning dimensional controllability. However, there is an advantage that a hard mask forming process can be omitted.

Although a tantalum oxide with a film thickness of 50 nm is used as a dielectric film in the present embodiment, neither the film thickness nor the kind of material is limited by the embodiment. Capacitance density increases inversely with the film thickness of the dielectric film. For improved capacitance density, therefore, it is preferable that the film thickness be as small as possible. However, a film thickness reduction limit according to a particular operating voltage exists since reducing the film thickness also reduces dielectric breakdown strength. Also, a hafnium oxide, a zirconium oxide, a lanthanum oxide, a titanium oxide, an aluminum oxide, or the like, or a mixture thereof, or a compound that contains nitrogen (and/or the like) therein can be used as the dielectric film material, instead of tantalum oxide. Alternatively, a ferroelectric material such as PZT, STO, or BST can also be used. Furthermore, while the present embodiment uses a single-layer dielectric film as the dielectric film, this dielectric film can also be formed into a stacked structure as required. For example, leakage current density can likewise be reduced by interposing the tantalum oxide film between upper and lower layers of aluminum oxide (or the like) with a large band.

Additionally, while the present embodiment primarily uses a 100-nm-thick silicon dioxide film as the first intermediate layer, the embodiment is not limited by this film thickness or this kind of material. As mentioned above, the first intermediate layer has a preferred film-thickness range, and for the current manufacturing apparatus, excellent characteristic are obtained in the range of about 50 to 200 nm in film thickness. If a technique for further improving a step coverage is adopted as a method of forming the dielectric film, although expansion of the maximum permissible film thickness of the first intermediate layer to a region of 200 nm or more can be easily anticipated, increasing this film thickness without due consideration only yields a small number of advantages. In addition, although the silicon dioxide that is formed using plasma CVD is used as the material of the first intermediate layer, the use of this material does not obstruct selection of other materials, provided that the use of the material suits an intended purpose. More specifically, it is possible to use a low-k film (or the like) represented by silicon nitride, silicon-oxynitride, silicon carbide, silicon nitrocarbide, aluminum oxide, SiOC, and the like. If silicon nitride, silicon oxynitride, or aluminum oxide is used, it is possible to improve dry-etching selectivity, and they are used as a light-absorbing layer during lithography. These materials, however, have the disadvantage that their high relative permittivities increase interconnect coupling capacitance.

Because of their low relative permittivities, silicon carbide, silicon nitrocarbide, an SiOC film, and the like are effective for reduction in coupling capacitance, whereas these materials have the disadvantage that they do not easily reduce leakage current. Furthermore, although the present embodiment uses single-layer silicon dioxide as the first intermediate layer, this layer can also be formed into a stacked structure made up of plural layers. More specifically, in the structure where silicon nitride is used as the layer abutting on the lower electrode and silicon dioxide is used as the layer formed on the silicon nitride layer, it becomes easy to control a sectional taper angle of the opening provided in the first intermediate layer. If this taper angle is highly controllable, the coverage of the dielectric film is likely to be improved, which is effective for improving dielectric breakdown strength. The high controllability of the taper angle also improves controllability of an area of the opening in the MIM capacitor, thus offering the advantage that a desired dielectric constant can be obtained with high reproducibility.

Besides, while the present embodiment uses 50-nm-thick titanium nitride to form the upper electrode, neither the film thickness nor the kind of material is limited by the embodiment. If the upper electrode is too thin, when via plugs are opened, these via plugs could break through the upper electrode, damaging the dielectric film located thereunder. Conversely, if the upper electrode is too thick, since this means that a resistor is inserted in series with respect to the MIM capacitor, high-frequency characteristics could deteriorate. In the range where titanium nitride is used, a film thickness from about 50 to 100 nm is preferred. Tantalum, tungsten, or a metal based mainly on a nitride of tungsten, or aluminum, or an alloy thereof, or the like is usable as a material of the upper electrode, instead of titanium nitride. Furthermore, although titanium nitride is used as the barrier metal for forming first and second metal wiring, it is possible, as mentioned above, to use tantalum, tungsten, or a metal based mainly on a nitride of tungsten, instead of titanium nitride. Besides, if there is a margin on reliability, it is also possible to employ a structure not using a barrier metal. Moreover, forming both the upper electrode and the barrier metal into a stacked structure made up of plural layers does not present any problems.

The present embodiment, almost similarly to the first embodiment, takes such a construction as shown in the layout view of FIG. 9. The present embodiment, however, differs from the first embodiment in one respect, i.e., the first metal wiring 750 is positioned outside the area 754 denoting the upper electrode. When actual application of the present embodiment is considered, it does not suffer such limitations as shown in the second embodiment, i.e., limitations due to positions, quantity, or sizes of the via plugs. Larger-size via plugs improve high-frequency characteristics since they reduce coupling resistance. In general, however, a maximum permissible size exists for the tungsten formed with the CVD method. Although using an aluminum alloy to fill in a via plug alleviates the size limit, this filling-in method increases the number of other process steps required, such as planarizing the interlayer dielectric film and the metal. Additionally, in the present embodiment, the via plug is positioned inside the opening. This construction minimizes coupling resistance associated with the upper electrode, whereas the construction could damage the dielectric film if the amount of etching during opening of the via plug is too great. If the via plug is positioned outside the opening, i.e., in an area internal to the area 754 in FIG. 9 and external to the area 755 therein, a margin against dielectric film damage due to over-etching improves extensively. This is due to the fact that, even if the via plug breaks through the upper electrode and reaches the dielectric film, since the first intermediate layer exists directly under the dielectric film, damage thereto does not directly lead to deterioration of the MIM capacitor in characteristics. However, since coupling resistance due to sheet resistance of the upper electrode increases, high-frequency characteristics could be adversely affected.

In addition, while, in the present embodiment, the process steps using primarily a silicon dioxide film as the first interlayer dielectric film have been described by way of example, the embodiment is not limited to this material and it is possible to use a low-k material capable of reducing the coupling capacitance of the wiring. It is also possible to use such an SiOC film (carbon-containing silicon dioxide film) as represented by Black Diamond (registered trademark of Applied Materials, Inc.), such an organic film as represented by SiLK (registered trademark of the Dow Chemicals Company), other low-k materials with a pore(s) introduced thereinto, a fluorine-containing silicon dioxide film, or the like. When such a low-k material is used, protective dielectric films of some kind are required and thus a first interlayer dielectric film also includes the multilayer film constructed of these plural dielectric films. Furthermore, when such a low-k material is used, restrictions on process temperature and the like usually make it difficult to apply the CVD method to tungsten, and if this is the case, the interconnect via plug is preferably filled in with aluminum or the like.

Although the aluminum wiring that is processed by dry etching is used as second metal wiring in the present embodiment, the aluminum wiring or copper wiring that is processed with a damascene method can be used instead, as required. In this case, it is also possible to reduce the number of process steps by applying a dual damascene method capable of forming the via plug at the same time.

Third Embodiment

FIGS. 14A, 14B 15A, and 15B are sectional views showing yet another manufacturing process for a semiconductor device of the present invention. The description below is given in order of process steps.

Figure 14A:
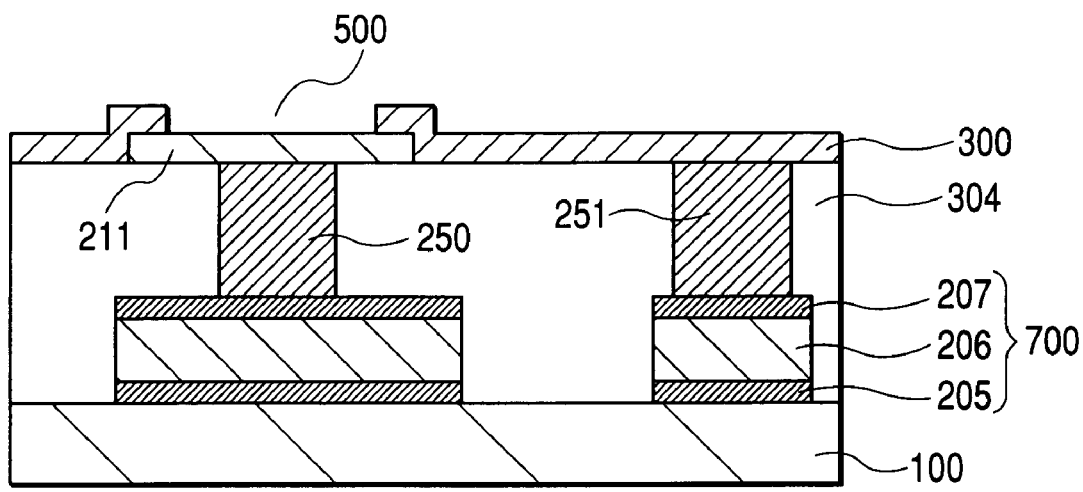
FIGS. 14A, 14B are sectional schematic views of major elements, showing a manufacturing process for a semiconductor device in: a third embodiment of the present invention.

First, as shown in FIG. 14A, on a substrate 100 having semiconductor devices formed thereon, a titanium nitride film with a film thickness of 50 nm, an aluminum alloy with a film thickness of 400 nm, and another titanium nitride film with a film thickness of 50 nm are formed using a sputtering method. After that, first metal wiring 700 including a first barrier metal layer 205, a first aluminum layer 206, and a second barrier metal layer 207, is formed using lithography and dry etching. Next, a first interlayer dielectric layer 304 made of a 1000-nm-thick silicon dioxide film is formed using plasma CVD, and then the first interlayer dielectric layer 304 is made planar by chemical-mechanical polishing. Next after a desired area of the first metal wiring 700 is exposed by forming an opening using lithography and dry etching, a first conductive plug 250 and a second conductive plug 251, both made of tungsten, are formed in the opening. After this, titanium nitride with a film thickness of 50 nm is formed by sputtering in such a manner as to cover the first conductive plug 250 and the second conductive plug 251, and then a lower electrode 211 patterned to cover the first conductive plug 250 is formed by combining lithography and dry etching. After that, a silicon dioxide film with a film thickness of 100 nm is formed using plasma CVD, and then a first intermediate layer 300 having an opening 500 in the patterned lower electrode 211 is formed using lithography and dry etching.

Figure 14B:
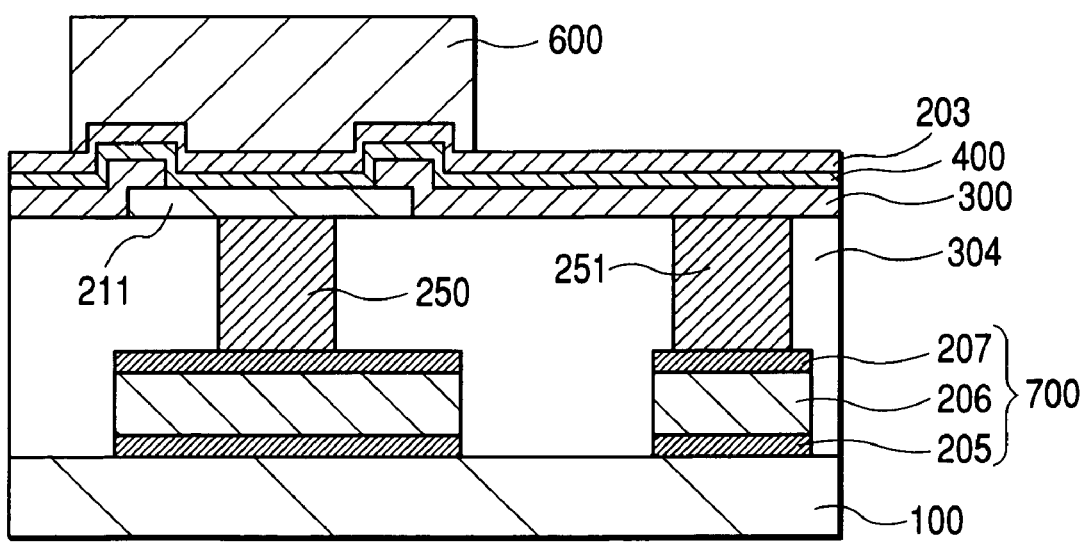

Next, as shown in FIG. 14B, a dielectric film 400 made of 50-nm-thick tantalum oxide is formed so as to cover the opening 500 and abut the patterned lower electrode 211, and an upper electrode 203 made of 50-nm-thick titanium nitride is formed by sputtering. After this, a first etching mask 600 is formed by lithography to cover an area to be left as an MIM capacitor.

Figure 15A:
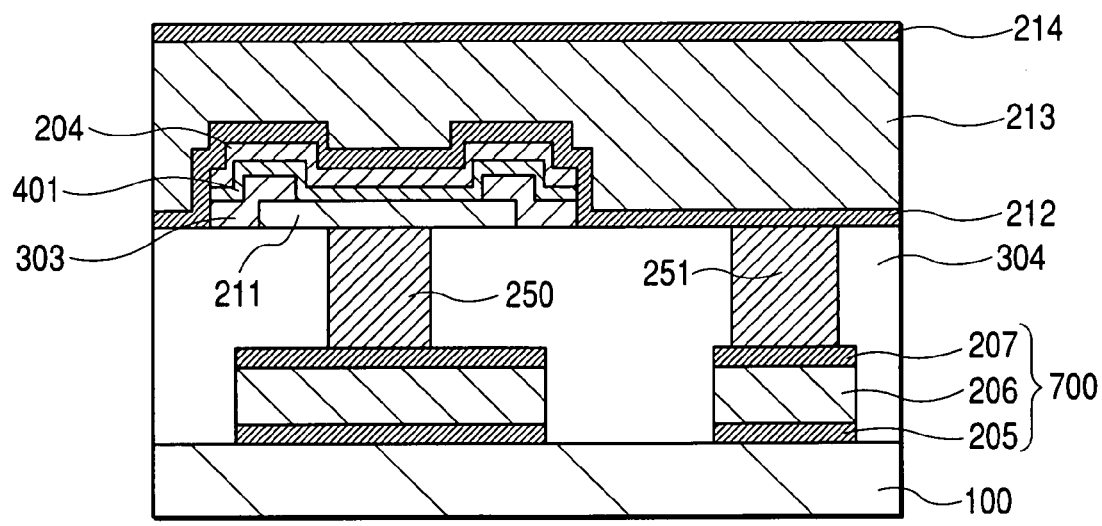
FIGS. 15A, 15B are sectional schematic views of major elements, showing another manufacturing process for the semiconductor device in the third embodiment of the present invention.

Next, as shown in FIG. 15A, the upper electrode 203, the dielectric film 400, and the first intermediate layer 300 are dry-etched using the first etching mask 600. After this, a third barrier metal film 212 made of 50-nm-thick titanium nitride, a second aluminum film 213 made of a 400-nm-thick aluminum alloy, and a fourth barrier metal film 214 made of 50-nm-thick titanium nitride are formed over the entire surface of the dry-etched area by sputtering.

Figure 15B:
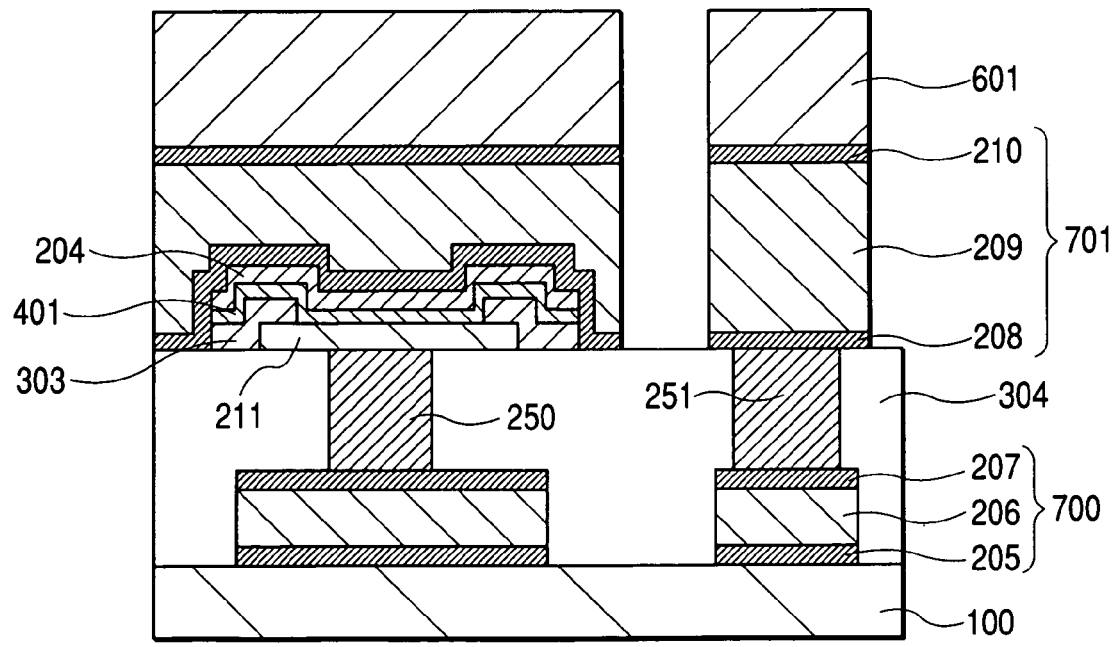

Next, as shown in FIG. 15B, a second etching mask 601 is lithographically formed in the area where metal wiring is to be formed. After that, second metal wiring 701 including a third barrier metal layer 208 made of a 50-nm-thick titanium nitride film, a second aluminum layer 209 made of a 400-nm-thick aluminum alloy, and a fourth barrier metal layer 210 made of a 50 nm-thickness titanium nitride film, is formed by dry etching with a chlorine-containing gas. Finally, the excess second etching mask 601 is removed by an asher. Thus, it becomes possible to form a semiconductor device having the MIM capacitor including the first metal wiring 700, the first conductive plug 250, the patterned lower electrode 211, and the patterned dielectric film 401, the patterned upper electrode 204, and the second metal wiring 701.

Structures formed by setting a film thickness of the first intermediate layer 300 to 0, 10, 50, 200, and 300 nm, are provided in addition to the structure shown in the present third embodiment.

MIM capacitor performance and reliability of the thus-formed semiconductor device having an MIM capacitor were examined. As a result, similarly to the first embodiment, a performance of 4 fF/$\mu m^2$ in capacitance density was obtained, despite the thickness of the first intermediate layer. Also, similarly to the first embodiment, only the structures having the first intermediate layer 300 formed with the film thicknesses between 50 and 200 nm satisfied a specified dielectric breakdown strength value of the MIM capacitor. After close examination of the reason why dielectric breakdown strength did not satisfy the specified value, it was found that for the first intermediate layers of the 0-nm and 10-nm film thicknesses, the film thicknesses of the first intermediate layer and dielectric film formed on the lower electrode 211 decreased at an edge and sidewalls thereof. This implies the possible decrease in dielectric breakdown strength due to an increase in the leakage current at the edge of the lower electrode. For the first intermediate layer of the 300-nm film thickness, local thinning-down of the dielectric film 400 was observed near an edge of the opening provided in the first intermediate layer 303. This indicates that since the film of the intermediate layer became too thick, a shortage of coverage of the tantalum oxide film formed at the edge of the opening is likely to have become prominent. That is to say, it was found that if the first intermediate layer is too thin (e.g., 10 nm or less), a suppression effect against the leakage current increase at the edge of the MIM capacitor is lost, and that conversely, if the first intermediate layer is too thick (e.g., 300 nm or more), a sputtering coverage at the edge of the opening decreases to reduce dielectric breakdown strength.

It was further found that similarly to the first embodiment, since the first metal wiring 700 and the second metal wiring 701 do not have their peripheries covered by the first intermediate layer of a higher relative permittivity, the problems of, as in conventional example 3, a signal delay or electric power consumption being increased by an increase in the coupling capacitance of the wiring do not easily occur.

That is to say, according to the present embodiment, it is possible to form a semiconductor device having an MIM capacitor capable of achieving high capacitance density while minimizing increases in leakage current and decreases in dielectric breakdown strength. More specifically, the above becomes possible by: forming a lower electrode so as to cover a via plug opened in lower metal wiring; forming a first intermediate layer made of a 100-nm-thick silicon dioxide film having an opening at the top of the lower electrode; forming a dielectric film and an upper electrode in such a manner as to cover the above opening; and patterning the upper electrode, the dielectric film, the first intermediate layer in such a form as to embrace the opening entirely.

The present embodiment, unlike the first embodiment, is characterized in that since a metal film that is formed independently of aluminum wiring is present directly under the dielectric film of the MIM capacitor, it is possible to select a material independent of the barrier metal used in the aluminum wiring, and in that the embodiment is insusceptible to hillocking occurring on the aluminum wiring. The total number of process steps, however, increases since a patterning process for the lower electrode is newly added.

Although a tantalum oxide with a film thickness of 50 nm is used as a dielectric film in the present embodiment, neither the film thickness nor the kind of material is limited by the embodiment. Capacitance density increases inversely with the film thickness of the dielectric film. For improved capacitance density, therefore, it is preferable that the film thickness be as small as possible. However, a film thickness reduction limit according to a particular operating voltage exists since reducing the film thickness also reduces dielectric breakdown strength. Also, a hafnium oxide, a zirconium oxide, a lanthanum oxide, a titanium oxide, an aluminum oxide, or the like, or a mixture thereof, or a compound that contains nitrogen (and/or the like) therein can be used as the dielectric film material, instead of tantalum oxide. Alternatively, a ferroelectric material such as PZT, STO, or BST can also be used. Furthermore, while the present embodiment uses a single-layer dielectric film as the dielectric film, this dielectric film can also be formed into a stacked structure as required. For example, leakage current density can likewise be reduced by interposing the tantalum oxide film between upper and lower layers of aluminum oxide (or the like) with a large band gap.

Additionally, while the present embodiment primarily uses a 100-nm-thick silicon dioxide film as the first intermediate layer, the embodiment is not limited by this film thickness or this kind of material. As mentioned above, the first intermediate layer has a preferred film-thickness range, and for the current manufacturing apparatus, excellent characteristics are obtained in the range of about 50 to 200 nm in film thickness. If a technique for further improving a step coverage is adopted as a method of forming the dielectric film, although expansion of the maximum permissible film thickness of the first intermediate layer to a region of 200 nm or more can be easily anticipated, increasing this film thickness without due consideration only yields a small number of advantages. In addition, although the silicon dioxide that is formed using plasma CVD is used as the material of the first intermediate layer, the use of this material does not obstruct selection of other materials, provided that the use of the material suits an intended purpose. More specifically, it is possible to use a low-k film (or the like) represented by silicon nitride, silicon oxynitride, silicon carbide, silicon nitrocarbide, aluminum oxide, SiOC, and the like. If silicon nitride, silicon oxynitride, or aluminum oxide is used, it is possible to improve dry-etching selectivity, and they are used as a light-absorbing layer during lithography. These materials, however, have the disadvantage that their high relative permittivities increase interconnect coupling capacitance.

Because of their low relative permittivities, silicon carbide, silicon nitrocarbide, an SiOC film, and the like are effective for reduction in coupling capacitance, whereas these materials have the disadvantage that they do not easily reduce leakage current. Furthermore, although the present embodiment uses single-layer silicon dioxide as the first intermediate layer, this layer can also be formed into a stacked structure made up of plural layers. More specifically, in the structure where silicon nitride is used as the layer abutting on the lower electrode and silicon dioxide is used as the layer formed on the silicon nitride layer, it becomes easy to control a sectional taper angle of the opening provided in the first intermediate layer. If this taper angle is highly controllable, the coverage of the dielectric film is likely to be improved, which is effective for improving dielectric breakdown strength. The high controllability of the taper angle also improves controllability of an area of the opening in the MIM capacitor, thus offering the advantage that a desired dielectric constant can be obtained with high reproducibility.

Besides, while the present embodiment uses 50-nm-thick titanium nitride to form the lower electrode and the upper electrode, neither the film thickness nor the kind of material is limited by the embodiment. If the electrode is too thick, since this means that a resistor is inserted in series with respect to the MIM capacitor, high-frequency characteristics could deteriorate. In the range where titanium nitride is used, a film thickness from about 50 to 100 nm is preferred. Tantalum, tungsten, or a metal based mainly on a nitride thereof, or aluminum, or an alloy thereof, or the like is usable as a material of the upper electrode, instead of titanium nitride. Furthermore, although titanium nitride is used as the barrier metal for forming first and second metal wiring, it is possible, as mentioned above, to use tantalum, tungsten, or a metal based mainly on a nitride thereof, instead of titanium nitride. Besides, if there is a margin on reliability, it is also possible to employ a structure not using a barrier metal. Moreover, forming both the upper electrode and the barrier metal into a stacked structure made up of plural layers does not present any problems.

Although the first metal wiring 700 and the lower electrode 211 are connected by a single via plug in the present embodiment, the number, positions, and shapes of via plugs are arbitrarily selectable, provided that electrical connection between the first metal wiring and the lower electrode is ensured. It goes without saying that interconnect via plugs as large as possible should be formed to reduce the coupling resistor inserted in series with respect to the MIM capacitor.

Additionally, while the via plug in the present embodiment is entirely filled in with tungsten at the first conductive plug 250, validity of the present invention is not limited by this structure or material. Instead of tungsten, a conductor based mainly on aluminum or copper can be used as a material of the first conductive plug 250. Furthermore, the surface of the first conductive plug 250 does not necessarily need to be flush with the surface of the first interlayer dielectric film 304, and such indentation or bumping levels that do not affect reliability can be accommodated to a certain extent during the forming process for the upper electrode and the dielectric film.

In addition, while, in the present embodiment, the process steps using primarily a silicon dioxide film as the first interlayer dielectric film have been described by way of example, the embodiment is not limited to/by this material and it is possible to use a low-k material capable of reducing the coupling capacitance of the wiring. It is also possible to use such an SiOC film (carbon-containing silicon dioxide film) as represented by Black Diamond (registered trademark of Applied Materials, Inc.), such an organic film as represented by SiLK (registered trademark of the Dow Chemicals Company), other low-k materials with a pore(s) introduced thereinto, a fluorine-containing silicon dioxide film, or the like. When such a low-k material is used, protective dielectric films of some kind are required and thus a first interlayer dielectric film also includes the multilayer film constructed of these plural dielectric films.

Although the aluminum wiring that is processed by dry etching is used as first metal wiring in the present embodiment, the aluminum wiring or copper wiring that is processed with a damascene method can be used instead, as required.

Fourth Embodiment

FIGS. 16A, 16B and 17A, 17B are sectional views showing a further manufacturing process for a semiconductor device of the present invention. The description below is given in order of process steps.

Figure 16A:
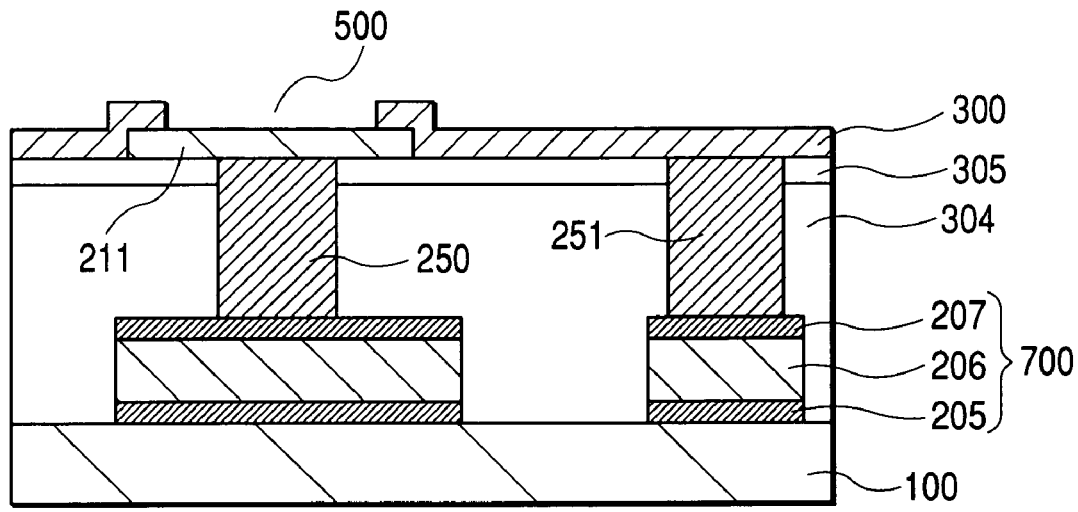
FIGS. 16A, 16B are sectional schematic views of major elements, showing a manufacturing process for a semiconductor device in a fourth embodiment of the present invention.

First, as shown in FIG. 16A, on a substrate 100 having semiconductor devices formed thereon, a 50-nm-thick titanium nitride film, a 400-nm-thick aluminum alloy, and a 50-nm-thick titanium nitride film are formed using a sputtering method. After that, first metal wiring 700 including a first barrier metal layer 205, a first aluminum layer 206, and a second barrier metal layer 207, is formed using lithography and dry etching. Next, a first interlayer dielectric layer 304 made of a 1000-nm-thick silicon dioxide film is formed using a plasma CVD method, and then the first interlayer dielectric layer 304 is made planar by chemical-mechanical polishing. Next after an etching stopper made of 50-nm-thick silicon nitride is formed with the CVD method, a desired area of the first metal wiring 700 is exposed by forming an opening using lithography and dry etching. After that, a first conductive plug 250 and a second conductive plug 251, both made of tungsten, are formed in the opening. After this, a 50-nm-thick titanium nitride film is formed by sputtering in such a manner as to cover the first conductive plug 250 and the second conductive plug 251, and then a lower electrode 211 patterned to cover the first conductive plug 250 is formed by combining lithography and dry etching. After that, a 100-nm-thick silicon dioxide film is formed using a plasma CVD method, and then a first intermediate layer 300 having an opening 500 in the patterned lower electrode 211 is formed using lithography and dry etching.

Figure 16B:
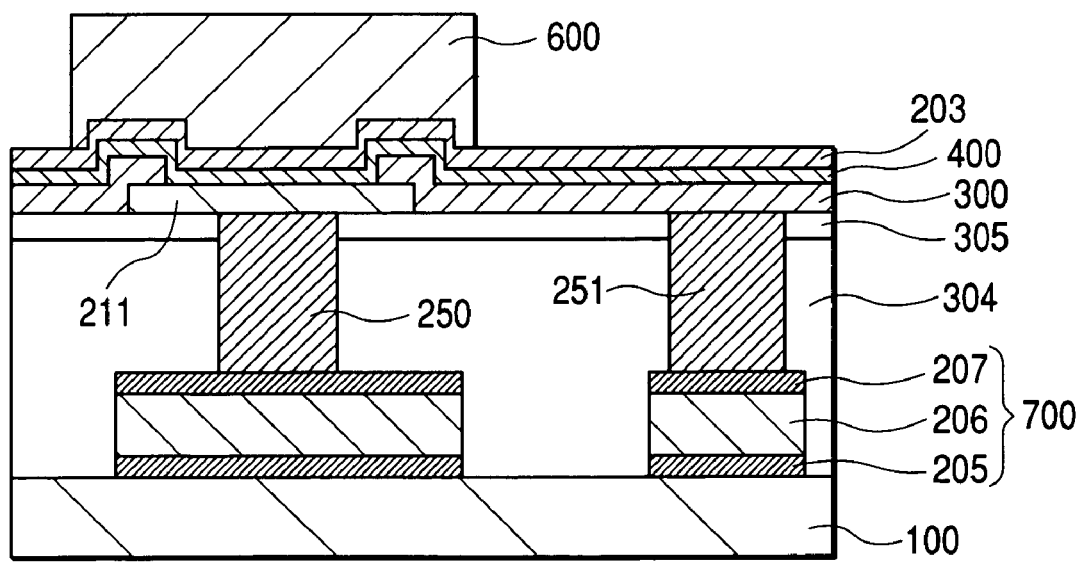

Next, as shown in FIG. 16B, a dielectric film 400 made of 50-nm-thick tantalum oxide is formed so as to cover the opening 500 and abut the patterned lower electrode 211, and an upper electrode 203 made of 50-nm-thick titanium nitride is formed by sputtering. After this, a first etching mask 600 is formed by lithography to cover an area to be left as an MIM capacitor.

Figure 17A:
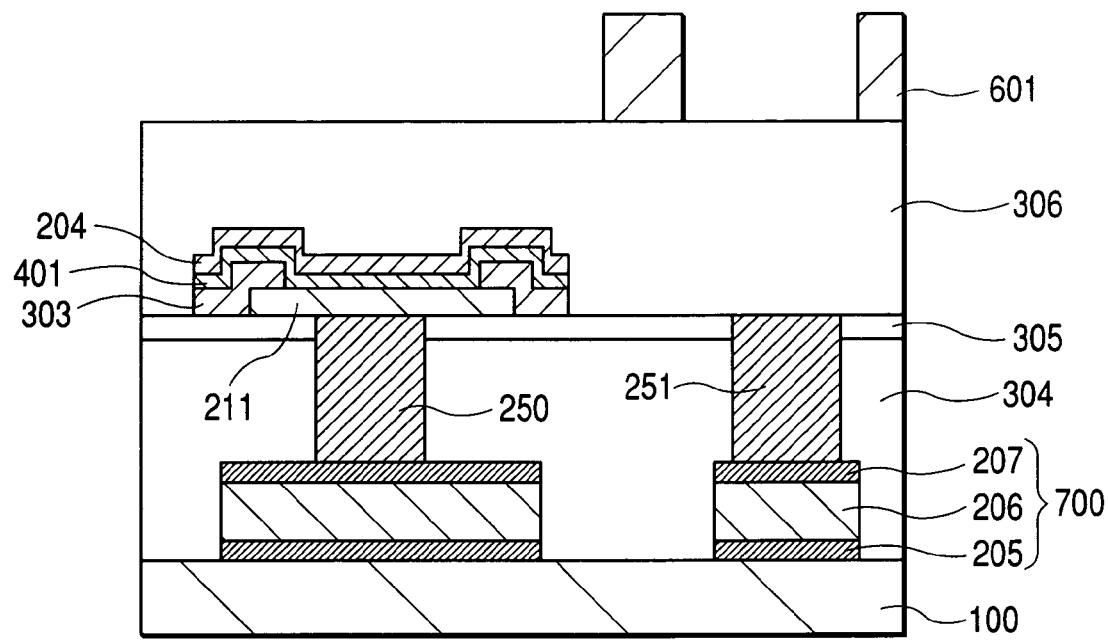
FIGS. 17A, 17B are sectional schematic views of major elements, showing another manufacturing process for the semiconductor device in the fourth embodiment of the present invention.

Next, as shown in FIG. 17A, the upper electrode 203, the dielectric film 400, and the first intermediate layer 300 are dry-etched using the first etching mask 600. After this, a second interlayer dielectric film 306 made of 500-nm-thick silicon dioxide is formed using a plasma CVD method, and then the second interlayer dielectric film 306 is made planar by using chemical-mechanical polishing. After that, a second etching mask 601 is lithographically formed in the area where metal wiring is to be formed.

Figure 17B:
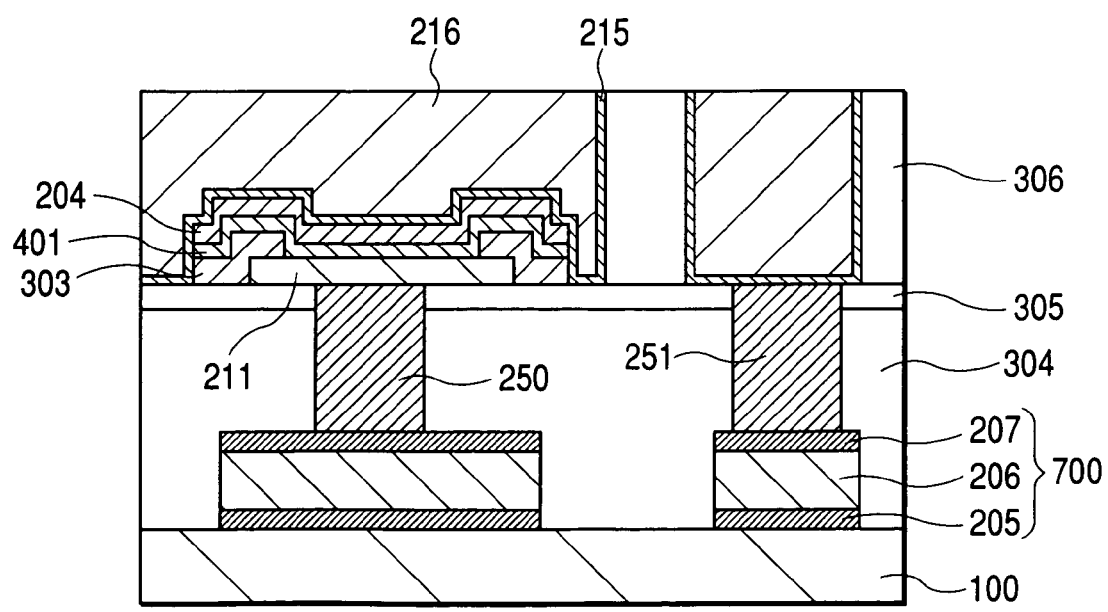

Next, as shown in FIG. 17B, dry etching is conducted using an upper electrode 204 and an etching stopper 305 as etching stoppers, and an opening is formed in the second interlayer dielectric film. Next after sequential formation of a 50-nm-thick tantalum nitride film and a 100-nm-thick copper film by sputtering, the opening in the second interlayer dielectric film is filled in by electrolytic copper plating with a copper-plating liquid containing a copper sulfate solution as its principal constituent. After that, excesses of the copper film and of the tantalum nitride film are removed by chemical-mechanical polishing, and second metal wiring 701 made up of a first copper layer 216 and a fifth barrier metal layer 215 is formed. It thus becomes possible to form a semiconductor device having the MIM capacitor including the first metal wiring 700, the first conductive plug 250, the patterned lower electrode 211, and the patterned dielectric film 401, the patterned upper electrode 204, and the second metal wiring 701.

MIM capacitor performance and reliability of the thus-formed semiconductor device having an MIM capacitor were examined and as a result, it was found that reliability and performance equivalent to those shown in the third embodiment are obtained.

That is to say, according to the present embodiment, it is possible to form a semiconductor device having an MIM capacitor capable of achieving high capacitance density while at the same time minimizing increases in leakage current and decreases in dielectric breakdown strength. More specifically, the above becomes possible by: forming a lower electrode so as to cover an interconnect via plug opened in lower metal wiring; forming a first intermediate layer made of a 100 nm-thickness silicon dioxide film having an opening at the top of the lower electrode; forming a dielectric film and an upper electrode in such a manner as to cover the above opening; and patterning the upper electrode, the dielectric film, and the first intermediate layer in such a form as to embrace the opening entirely.

The present embodiment, unlike the first embodiment, is characterized in that since a metal film that was formed independently of aluminum wiring is present, directly under the dielectric film of the MIM capacitor, it is possible to select a material independent of the barrier metal used in the aluminum wiring, and in that the embodiment is insusceptible to hillocking occurring on the aluminum wiring. The total number of process steps, however, increases since a patterning process for the lower electrode is newly added.

Although a 50-nm thick tantalum oxide film is used as a dielectric film in the present embodiment, neither the film thickness nor the kind of material is limited by the embodiment. Capacitance density increases inversely with the film thickness of the dielectric film. For improved capacitance density, therefore, it is preferable that the film thickness be as small as possible. However, a film thickness reduction limit according to a particular operating voltage exists since reducing the film thickness also reduces dielectric breakdown strength. Also, a hafnium oxide, a zirconium oxide, a lanthanum oxide, a titanium oxide, an aluminum oxide, or the like, or a mixture thereof, or a compound that contains nitrogen (and/or the like) therein can be used as the dielectric film material, instead of tantalum oxide. Alternatively, a ferroelectric material such as PZT, STO, or BST can also be used. Furthermore, while the present embodiment uses a single-layer dielectric film as the dielectric film, this dielectric film can also be formed into a stacked structure as required. For example, leakage current density can likewise be reduced by interposing the tantalum oxide film between upper and lower layers of aluminum oxide (or the like) with a large band gap.

In addition, although the present embodiment uses a 50-nm-thick silicon nitride film as an etching stopper, neither the film thickness nor the kind of material is limited by the embodiment. Since silicon nitride is high in relative permittivity, a low-k film (or the like) represented by silicon oxynitride, silicon carbide, silicon nitrocarbide, aluminum oxide, SiOC, or the like can be used instead to reduce coupling capacitance. In the present embodiment, the etching stopper, although formed on the first interlayer dielectric film and under the lower electrode 211, is not limited to these positions and can also be formed so as to cover the upper electrode 204 and the dielectric film 401. If the etching stopper is formed in this way, the MIM capacitor is not exposed to plasma during the patterning of the second interlayer dielectric film. Instead, the MIM capacitor is exposed to plasma only when the etching stopper itself is removed following completion of processing. A structure without this etching stopper can also be used if limitations on wiring height controllability and the like are not strict.

Additionally, while the present embodiment primarily uses a 100-nm-thick silicon dioxide film as the first intermediate layer, the embodiment is not limited by this film thickness or this kind of material. As mentioned above, the first intermediate layer has a preferred film-thickness range, and for current manufacturing apparatuses, excellent characteristics are obtained in the range of about 50 nm to 200 nm in film thickness. If a technique for further improving a step coverage is adopted as a method of forming the dielectric film, although expansion of the maximum permissible film thickness of the first intermediate layer to a region of 200 nm or more can be easily anticipated, increasing this film thickness without due consideration only yields a small number of advantages. In addition, although the silicon dioxide that is formed using a plasma CVD method is used as the material of the first intermediate layer, the use of this material does not obstruct selection of other materials, provided that the use of the material suits an intended purpose. More specifically, it is possible to use a low-k film (or the like) represented by silicon nitride, silicon oxynitride, silicon carbide, silicon nitrocarbide, aluminum oxide, SiOC, and the like. If silicon nitride, silicon oxynitride, or aluminum oxide is used, it is possible to improve dry-etching selectivity, and they are used as a light-absorbing layer during lithography. These materials, however, have the disadvantage that their high relative permittivities increase interconnect coupling capacitance.

Because of their low relative permittivities, silicon carbide, silicon nitrocarbide, an SiOC film, and the like are effective for reduction in coupling capacitance, whereas these materials have the disadvantage that they do not easily reduce leakage current. Furthermore, although the present embodiment uses single-layer silicon dioxide as the first intermediate layer, this layer can also be formed into a stacked structure made up of plural layers. More specifically, in the structure where silicon nitride is used as the layer abutting on the lower electrode and silicon dioxide is used as the layer formed on the silicon nitride layer, it becomes easy to control a sectional taper angle of the opening provided in the first intermediate layer. If this taper angle is highly controllable, the coverage of the dielectric film is likely to be improved, which is effective for improving dielectric breakdown strength. The high controllability of the taper angle also improves controllability of an area of the opening in the MIM capacitor, thus offering the advantage that a desired dielectric constant can be obtained with high reproducibility.

Besides, while the present embodiment uses 50-nm-thick titanium nitride to form the lower electrode and the upper electrode, neither the film thickness nor the kind of material is limited by the embodiment. If the electrode is too thick, since this means that a resistor is inserted in series with respect to the MIM capacitor, high-frequency characteristics could deteriorate. In the range where titanium nitride is used, a film thickness ranging from about 50 nm to 100 nm is preferred. Tantalum, tungsten, or a metal based mainly on a nitride of tungsten, or aluminum, or an alloy thereof, or the like is usable as a material of the upper electrode, instead of titanium nitride. Furthermore, although titanium nitride and tantalum nitride are used as the barrier metals for forming first and second metal wiring, respectively, it is possible, as mentioned above, to use tantalum, tungsten, or a metal based mainly on a nitride of tungsten, instead of titanium nitride or tantalum nitride. Besides, if there is a margin on reliability, it is also possible to employ a structure not using a barrier metal. Moreover, forming both the upper electrode and the barrier metals into a stacked structure made up of plural layers does not present any problems.

Although the first metal wiring 700 and the lower electrode 211 are connected by a single interconnect via plug in the present embodiment, the number, positions, and shapes of interconnect via plugs are arbitrarily selectable, provided that electrical connection between the first metal wiring and the lower electrode is ensured. It goes without saying that interconnect via plugs as large as possible should be formed to reduce the coupling resistance inserted in series with respect to the MIM capacitor.

Additionally, while the interconnect via plug in the present embodiment is entirely filled in with tungsten at the first conductive plug 250, validity of the present invention is not limited to/by this structure or material. Instead of tungsten, a conductor based mainly on aluminum or copper can be used as a material of the first conductive plug 250. Furthermore, the surface of the first conductive plug 250 does not necessarily need to be flush with the surface of the first interlayer dielectric film 304, and such indentation or bumping levels that do not affect reliability can be accommodated to a certain extent during the forming process for the lower electrode and the dielectric film.

In addition, while, in the present embodiment, the process steps using silicon dioxide for both the first interlayer dielectric film and the second interlayer dielectric film have been described by way of example, the embodiment is not limited to/by this material and it is possible to use a low-k material capable of reducing the coupling capacitance of the wiring. It is also possible to use such an SiOC film (carbon-containing silicon dioxide film) as represented by Black Diamond (registered trademark of Applied Materials, Inc.), such an organic film as represented by SiLK (registered trademark of the Dow Chemicals Company), other low-k materials with a pore(s) introduced thereinto, a fluorine-containing silicon dioxide film, or the like. When such a low-k material is used, protective dielectric films of some kind are required and thus both a first interlayer dielectric film and a second interlayer dielectric film also include the multilayer film constructed of these plural dielectric films.

Although the aluminum wiring that is processed by dry etching is used as first metal wiring in the present embodiment, the aluminum wiring or copper wiring that is processed with a damascene method can be used instead, as required.

Fifth Embodiment

A fifth embodiment is one of the applications which use the manufacturing process for the semiconductor device shown in the second embodiment, and process steps for forming an MIM capacitor and a resistor on the same plane are described below using the sectional views shown in FIGS. 18A to 18C and 19A, 19B. The description is given in order of the process steps.

Figure 18A:
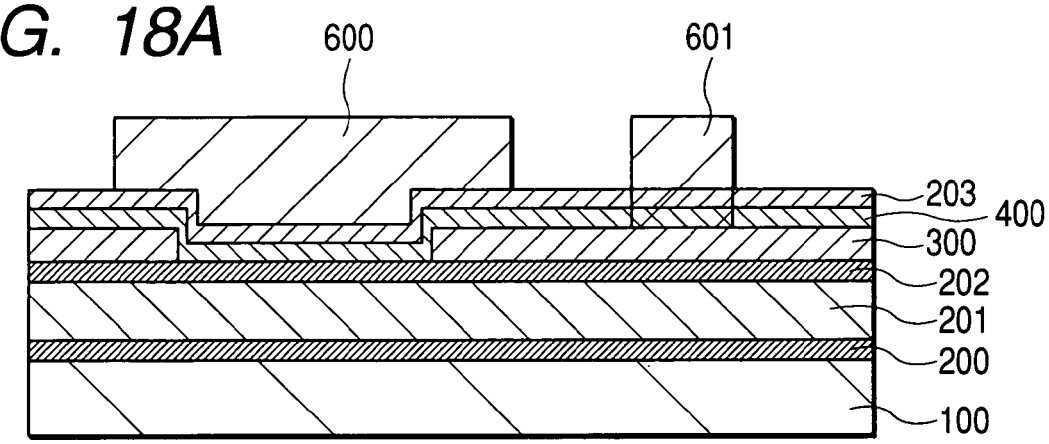
FIGS. 18A to 18C are sectional schematic views of major elements, showing a manufacturing process for a semiconductor device in a fifth embodiment of the present invention.

First, as shown in FIG. 18A, on a substrate 100 having semiconductor devices formed thereon, a first barrier metal film 200 made of 50-nm-thick titanium nitride, a first aluminum film 201 made of a 400-nm-thick aluminum alloy, and a second barrier metal film 202 made of 50-nm-thick titanium nitride are formed using a sputtering method. After this, a first intermediate layer 300 made of a 100-nm thick silicon dioxide film is formed using a plasma CVD method, and then an opening is provided in a desired area of the first intermediate layer 300 by using lithography and dry etching. Next, a dielectric film 400 made of 50-nm-thick tantalum oxide and an upper electrode 203 made of 25-nm-thick tantalum nitride are formed by reactive sputtering and sputtering, respectively, in such a form as to cover the opening. Furthermore, a first etching mask 600 and a second etching mask 601 are lithographically formed in an area in which an MIM capacitor is to be formed, and an area in which a resistor is to be formed, respectively.

Figure 18B:
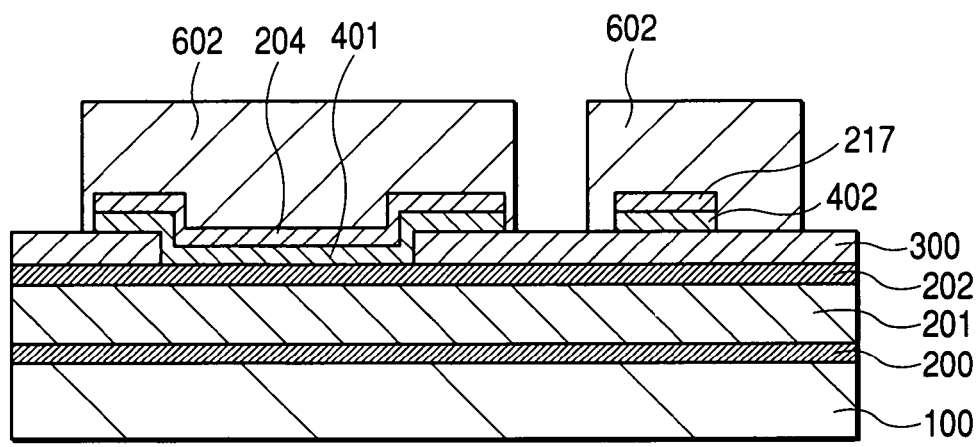

Next, a patterned upper electrode 204, a patterned dielectric film 401, a patterned resistor layer 217, and a dielectric film 402 under the resistor layer 217 are formed by conducting a dry etching process using the first etching mask 600, the second etching mask 601, and a fluorine-containing halogen gas. After that, the first etching mask 600 and the second etching mask 601 are ashed and residues thereof are removed. After these, a third etching mask 603 is further formed by lithography, as shown in FIG. 18B, in such a form as to protect the area where the MIM capacitor is to be formed and an area in which metal wiring is to be formed.

Figure 18C:
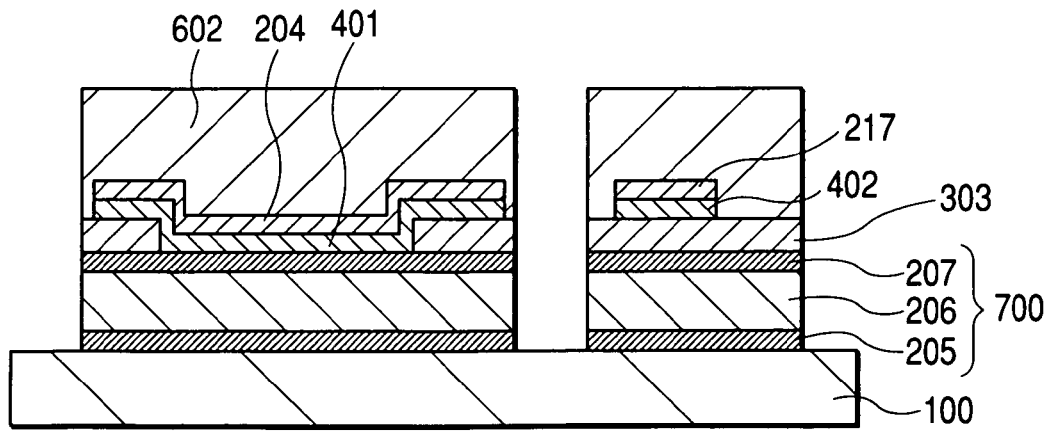

Next, as shown in FIG. 18C, the first intermediate layer 300 is dry-etched using the third etching mask 603. Following this, dry etching with a metal etching apparatus is conducted and first metal wiring 700 including a first barrier metal layer 205, a first aluminum layer 206, and a second barrier metal layer 207, is formed using the third etching mask 603.

Figure 19A:
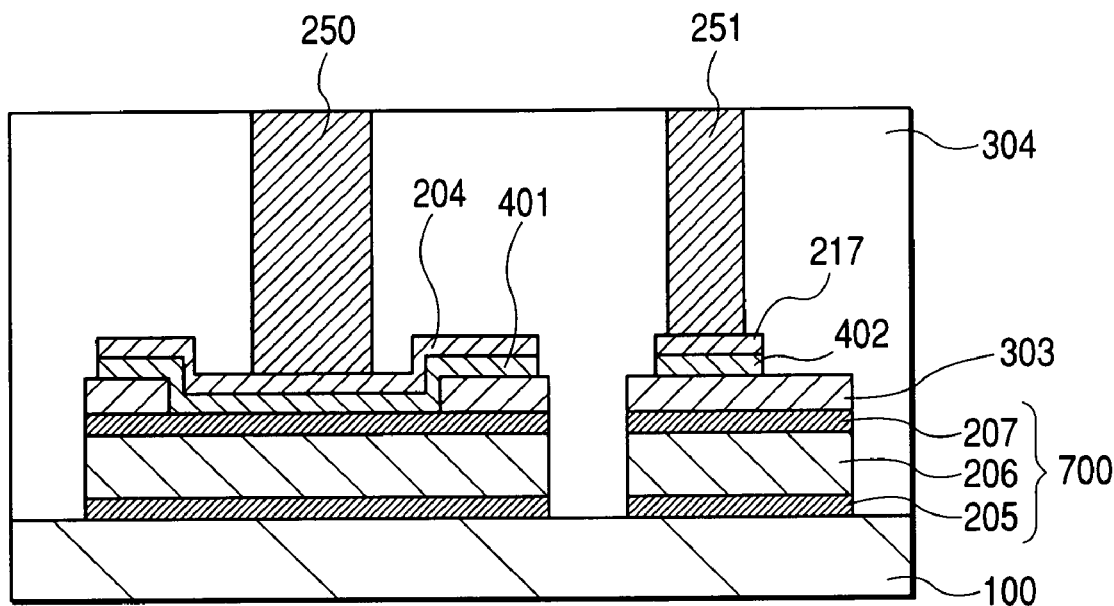
FIGS. 19A, 19B are sectional schematic views of major elements, showing another manufacturing process for the semiconductor device in the fifth embodiment of the present invention.

Next, as shown in FIG. 19A, the third etching mask 603 is removed by an asher, then a first interlayer dielectric layer 304 made of a 1000-nm-thick silicon dioxide film is formed using a plasma CVD method, and the first interlayer dielectric layer 304 is made planar by chemical-mechanical polishing. Next, the patterned upper electrode 204 or the patterned resistor layer 217 is exposed by forming an opening using lithography and dry etching. After that, a first conductive plug 250 made of tungsten and connected to the patterned upper electrode 204, and a second conductive plug 251 made of tungsten and connected to the patterned resistor layer 217 are formed in the opening. Although this is not shown in the figure, if an interconnect via plug is to be provided in the first metal wiring at which neither the MIM capacitor nor the resistor is to be formed, the first metal wiring 700 needs to be exposed by providing an opening also in a first intermediate layer 303.

Figure 19B:
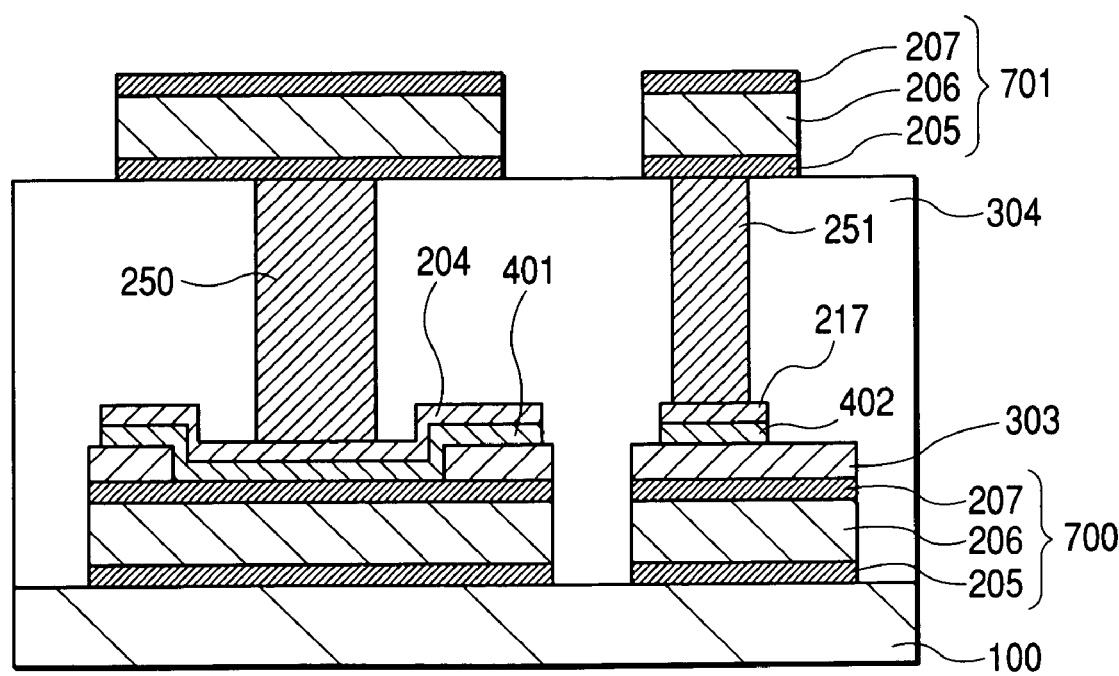

Finally, second metal wiring 701 including a third barrier metal layer 208 made of a 50-nm-thick titanium nitride film, a second aluminum layer 209 made of a 400-nm-thick aluminum alloy, and a fourth barrier metal layer 210 made of a 50-nm-thick titanium nitride film, is formed in a desired area by combining sputtering, lithography, and dry etching. Use of the above process steps makes it possible to form such semiconductor device as shown in FIG. 19B, i.e., a semiconductor device having: an MIM capacitor including the first metal wiring 700, the patterned dielectric film 401, the upper electrode 204, the first conductive plug 250, and the second metal wiring 701; and a resistor constructed of the patterned resistor layer 217.

MIM capacitor performance and reliability of the thus-formed semiconductor device having an MIM capacitor are equivalent to those of the second embodiment. It was also found that the thus-formed resistor has a sheet resistance of 92 o/□. Furthermore, a sufficient performance value of −70 ppm/° C. was obtained from evaluation results on a temperature coefficient of electrical resistance.

That is to say, according to the present embodiment, it is possible to form a semiconductor device concurrently realizing the followings: an MIM capacitor capable of achieving high capacitance density while minimizing increases in leakage current and decreases in dielectric breakdown strength, reduction of a coupling capacitance of a wiring layer equivalent to a lower electrode of the MIM capacitor, improvement in a wiring-to-wiring short yield, and a resistor excellent in temperature coefficient. More specifically, the above becomes possible by: forming a first intermediate layer made of a 100 nm-thickness silicon dioxide film having an opening at the top of the lower electrode; forming a dielectric film and an upper electrode in such a manner as to cover the above opening; patterning the upper electrode, the dielectric film, the first intermediate layer, and the lower electrode in such a form as to embrace the opening entirely; patterning the upper electrode and the dielectric film in the area where a resistor is to be formed during the patterning of the upper electrode; and patterning the first intermediate layer and the lower electrode in such a form as to embrace the area where the resistor is to be formed.

Although the upper electrode and the resistor are formed of 25-nm-thick tantalum nitride in the present embodiment, neither the film thickness nor the kind of material is limited by the embodiment. Other materials and different film thicknesses can also be used within a range that does not deteriorate performance of the upper electrode or performance of the resistor. More specifically, it is possible to use a high-melting-point metal such as titanium, tungsten, or molybdenum, or an alloy containing a nitride thereof as its principal constituent. Changing of the film thickness according to a resistivity of the substance forming the resistor can also be conducted within a sheet resistance range allowable for circuit designing. Additionally, although the present embodiment used single-layer tantalum nitride to construct the upper electrode and the resistor, it is possible to adopt a stacked structure with a plurality of stacked layers each different in composition and material.

Although a tantalum oxide with a film thickness of 50 nm is used as a dielectric film in the present embodiment, neither the film thickness nor the kind of material is limited by the embodiment. A hafnium oxide, a zirconium oxide, a lanthanum oxide, a titanium oxide, an aluminum oxide, or the like, or a mixture thereof, or a compound that contains nitrogen (and/or the like) therein can be used as the dielectric film material, instead of tantalum oxide. Alternatively, a ferroelectric material such as PZT, STO, or BST can also be used. Furthermore, while the present embodiment uses a single-layer dielectric film as the dielectric film, this dielectric film can also be formed into a stacked structure as required.

Additionally, while the present embodiment primarily uses a 100-nm-thick silicon dioxide film as the first intermediate layer, the embodiment is not limited by this film thickness or this kind of material. As mentioned above, the first intermediate layer has a preferred film-thickness range, and for current manufacturing apparatuses, excellent characteristics are obtained in the range of about 50 nm to 200 nm film thickness. It can be easily estimated, however, that depending on performance of the deposition apparatus used, the foregoing preferred film-thickness range changes to a certain degree. In addition, although the silicon dioxide that is formed using a plasma CVD method is used as the material of the first intermediate layer, the use of this material does not obstruct selection of other materials, provided that the use of the material suits an intended purpose. More specifically, it is possible to use a low-k film (or the like) represented by silicon nitride, silicon oxynitride, silicon carbide, silicon nitrocarbide, aluminum oxide, SiOC, and the like. Furthermore, although the present embodiment uses single-layer silicon dioxide as the first intermediate layer, this layer can also be formed into a stacked structure made up of plural layers. More specifically, in the structure where silicon nitride is used as the layer abutting on the lower electrode and silicon dioxide is used as the layer formed on the silicon nitride layer, it becomes easy to control a sectional taper angle of the opening provided in the first intermediate layer. If this taper angle is highly controllable, the coverage of the dielectric film is likely to be improved, which is effective for improving dielectric breakdown strength. The high controllability of the taper angle also improves controllability of an area of the opening in the MIM capacitor, thus offering the advantage that a desired dielectric constant can be obtained with high reproducibility.

In addition, in the present embodiment, layout of the MIM section takes substantially the same construction as that shown in the layout view of FIG. 9. In consideration of actual application, a respect in which the layout is not limited to such positions, number, and sizes of interconnect via plugs as shown in the present embodiment is as shown in the second embodiment.

Furthermore, while, in the present embodiment, the process steps using primarily a silicon dioxide film as the first interlayer dielectric film have been described by way of example, the embodiment is not limited to/by this material and it is possible to use a low-k material capable of reducing the coupling capacitance of the wiring. It is also possible to use such an SiOC film (carbon-containing silicon dioxide film) as represented by Black Diamond (registered trademark of Applied Materials, Inc.), such an organic film as represented by SiLK (registered trademark of the Dow Chemicals Company), other low-k materials with a pore(s) introduced thereinto, a fluorine-containing silicon dioxide film, or the like.

Although the aluminum wiring that is processed by dry etching is used as second metal wiring in the present embodiment, the aluminum wiring or copper wiring that is processed with a damascene method can be used instead, as required. In this case, it is also possible to reduce the number of process steps by applying a dual damascene method capable of forming the interconnect via plug at the same time.

Sixth Embodiment

A sixth embodiment is one of the applications which use the manufacturing process for the semiconductor device shown in the third embodiment, and process steps for forming an MIM capacitor and a resistor on the same plane are described below using the sectional views shown in FIGS. 20A, 20B and 21A, 21B. The description is given in order of the process steps.

Figure 20A:
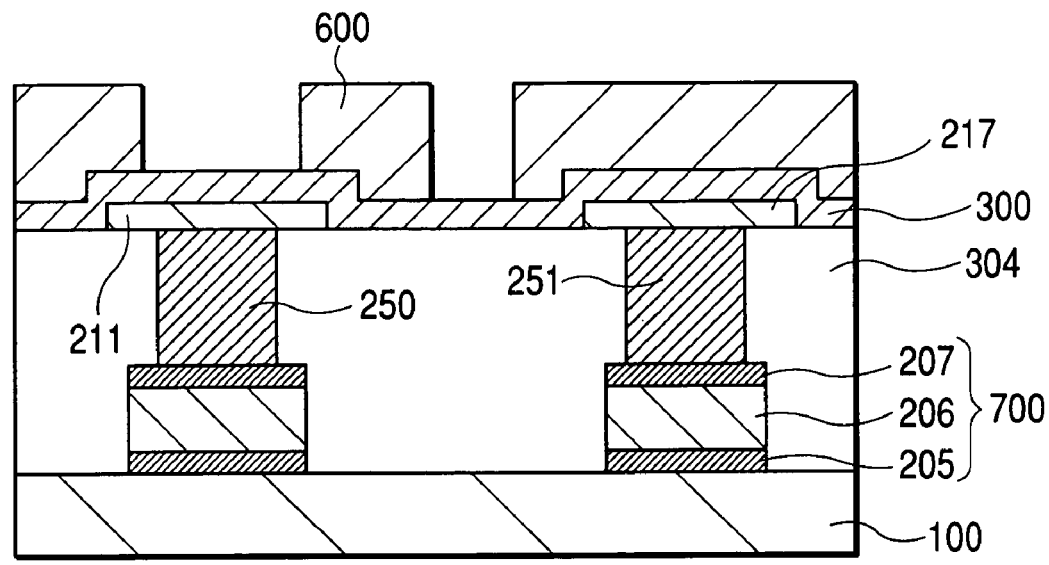
FIGS. 20A, 20B are sectional schematic views of major elements, showing a manufacturing process for a semiconductor device in a sixth embodiment of the present invention.

First, as shown in FIG. 20A, on a substrate 100 having semiconductor devices formed thereon, a 50-nm-thick titanium nitride film, a 400-nm-thick aluminum alloy, and a 50-nm-thick titanium nitride film are formed using a sputtering method. After that, first metal wiring 700 including a first barrier metal layer 205, a first aluminum layer 206, and a second barrier metal layer 207, is formed using lithography and dry etching. Next, a first interlayer dielectric layer 304 made of a 1000-nm-thick silicon dioxide film is formed using a plasma CVD method, and then the first interlayer dielectric layer 304 is made planar by chemical-mechanical polishing. Next after a desired area of the first metal wiring 700 is exposed by forming an opening using lithography and dry etching, a first conductive plug 250 and a second conductive plug 251, both made of tungsten, are formed in the opening. After this, a 50-nm-thick tantalum nitride film is formed by sputtering in such a manner as to cover the first conductive plug 250 and the second conductive plug 251, and then a lower electrode 211 patterned to cover the first conductive plug 250, and a resistor layer 217 patterned to cover the second conductive plug 251 are formed by combining lithography and dry etching. After that, a 100-nm-thick silicon dioxide film is formed using a plasma CVD method, and then a first etching mask 600 having an opening in a desired area is formed using lithography. The first etching mask 600 also needs to have an opening at least at the top of the patterned lower electrode 211.

Figure 20B:
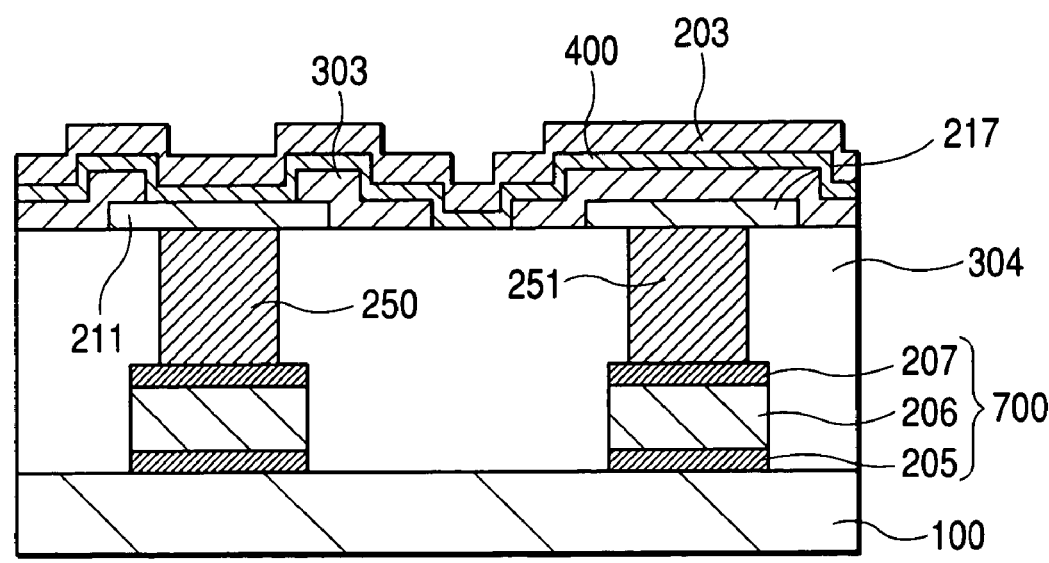
Figure 21A:
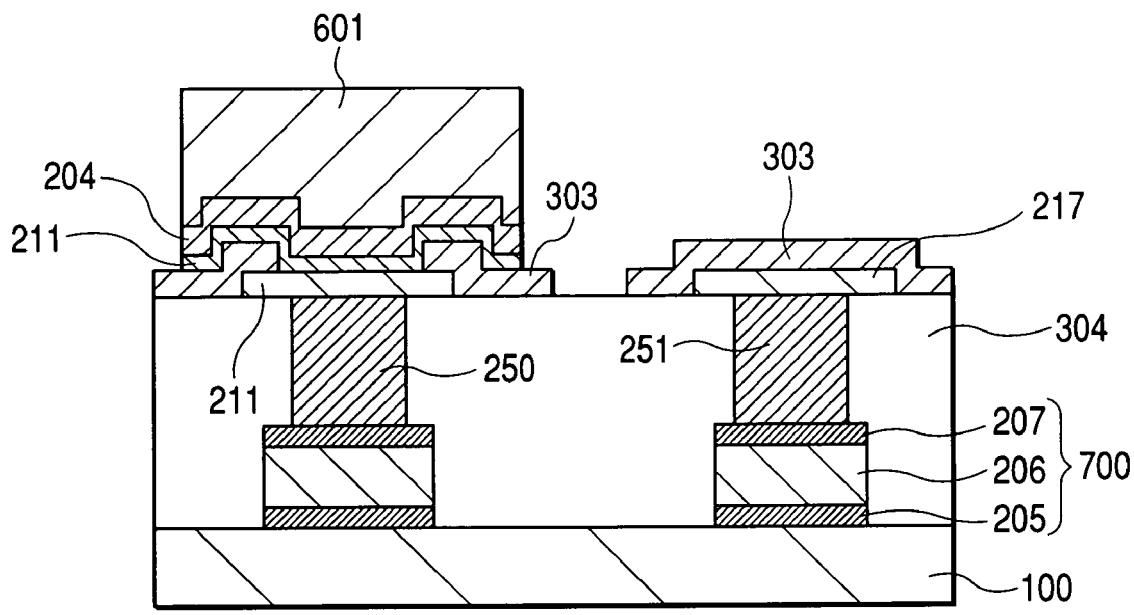
FIGS. 21A, 21B are sectional schematic views of major elements, showing another manufacturing process for the semiconductor device in the sixth embodiment of the present invention.
Figure 21B:
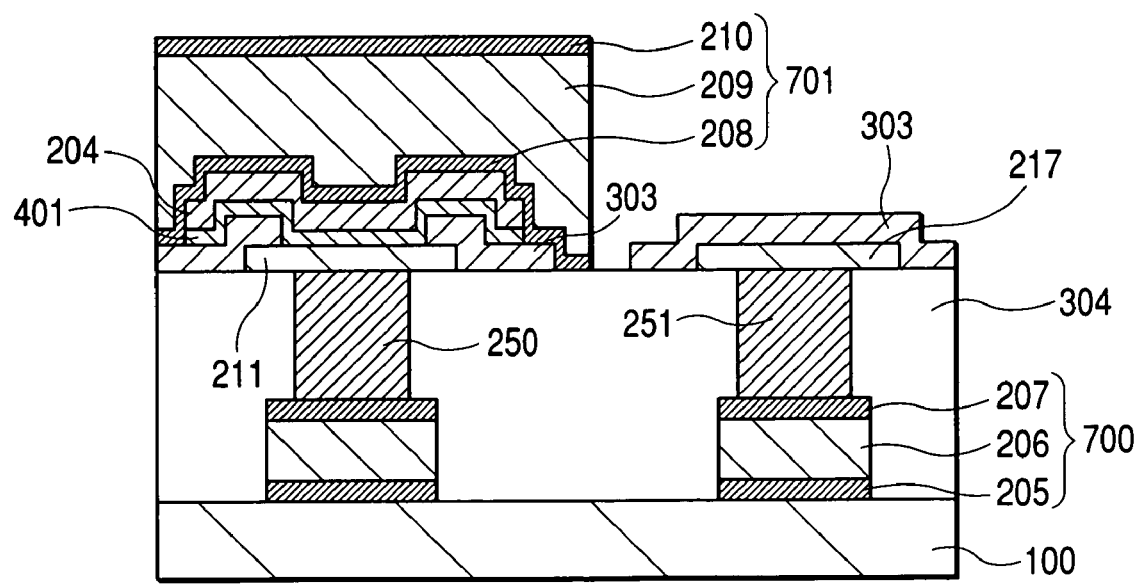

Next, as shown in FIG. 20B, dry etching is executed using the first etching mask 600 and an opening is provided in a first intermediate layer 300 so as to expose at least the lower electrode 211. After this, a dielectric film 400 and an upper electrode 203 are formed to cover the opening. Next, as shown in FIG. 21A, a second etching mask 601 is lithographically formed to cover an area to be left as an MIM capacitor, and then the upper electrode 203 and the dielectric film 400 are dry-etched using the second etching mask 601. In this process step, the patterned resistor layer 217 is not etched since it is protected by a first intermediate layer 303 patterned thereon.

Next, after the second etching mask 601 is removed by an asher, a 50-nm-thick titanium nitride film, a 400-nm-thick aluminum alloy, and a 50-nm-thick titanium nitride film are formed over the entire surface by sputtering. After this, second metal wiring 701 including a third barrier metal layer 208 made of a 50-nm-thick titanium nitride film, a second aluminum layer 209 made of a 400-nm-thick aluminum alloy, and a fourth barrier metal layer 210 made of a 50-nm-thick titanium nitride film, is formed by combining lithography and dry etching which used a chlorine-containing gas. Thus, it becomes possible to form a semiconductor device having: an MIM capacitor including the first metal wiring 700, the first conductive plug 250, the patterned lower electrode 211, the patterned dielectric film 401, the patterned upper electrode 204, and the second metal wiring 701; and a resistor constructed of the resistor layer 217 connected to the second conductive plug 251.

Figure 22:
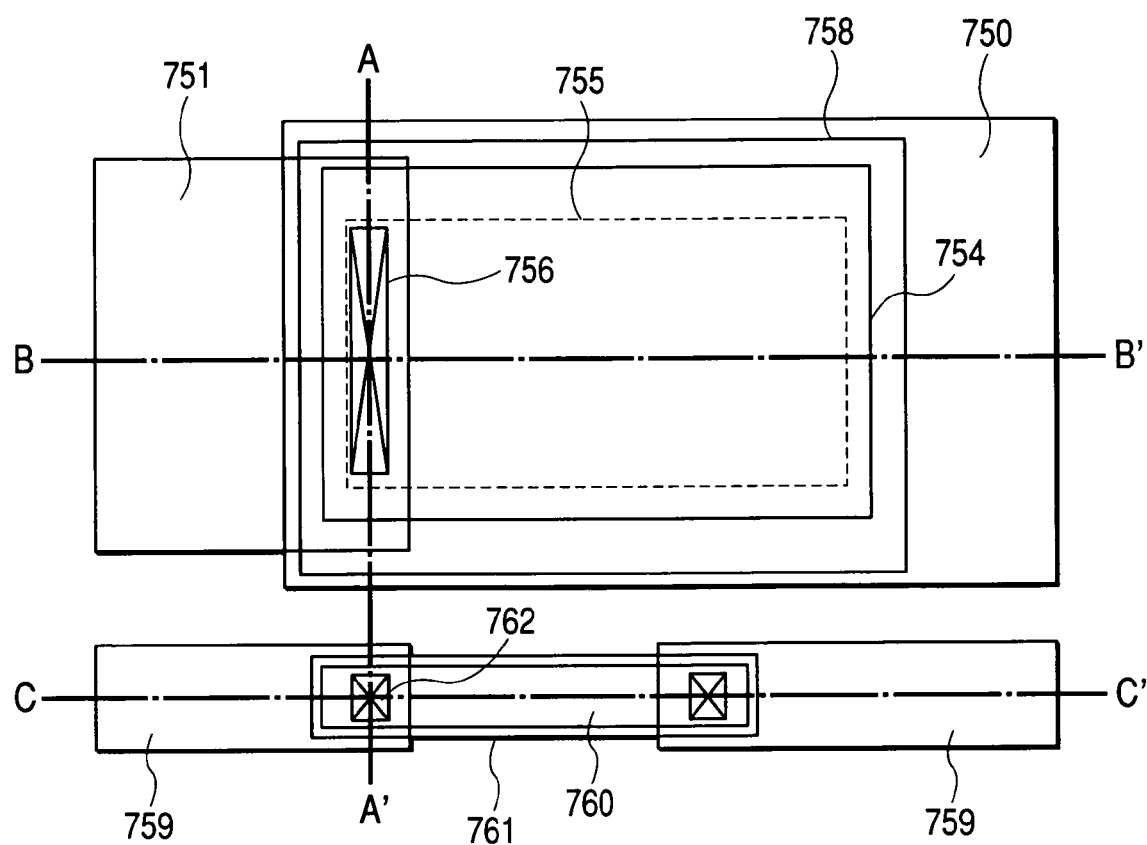
FIG. 22 is a plan layout view schematically showing the sixth embodiment of the present invention.
Figure 23:
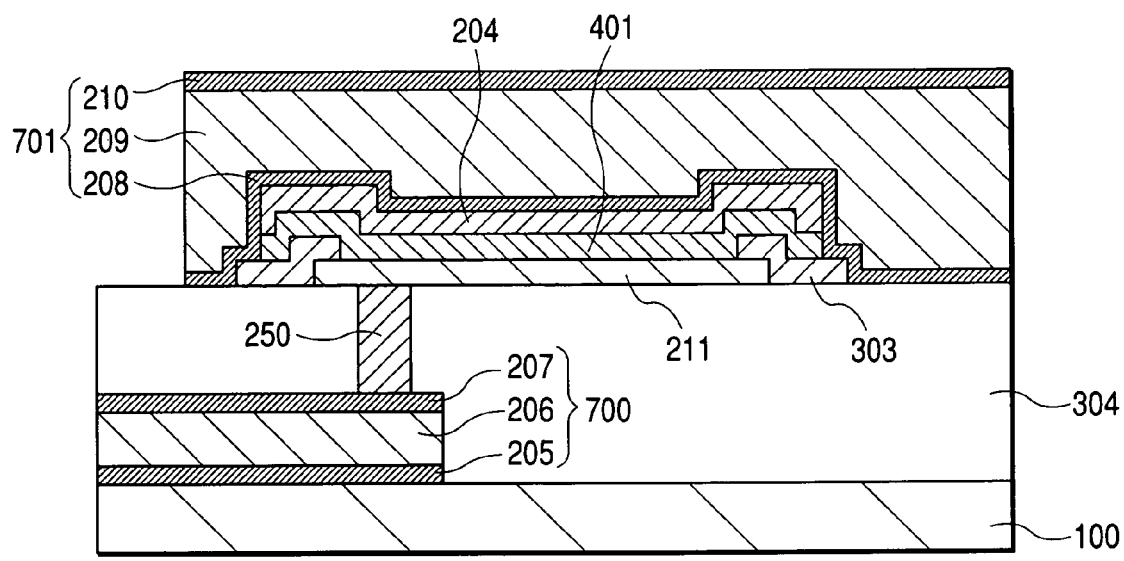
FIG. 23 is a sectional schematic view of section B-B' of the semiconductor device in the sixth embodiment of the present invention.
Figure 24:
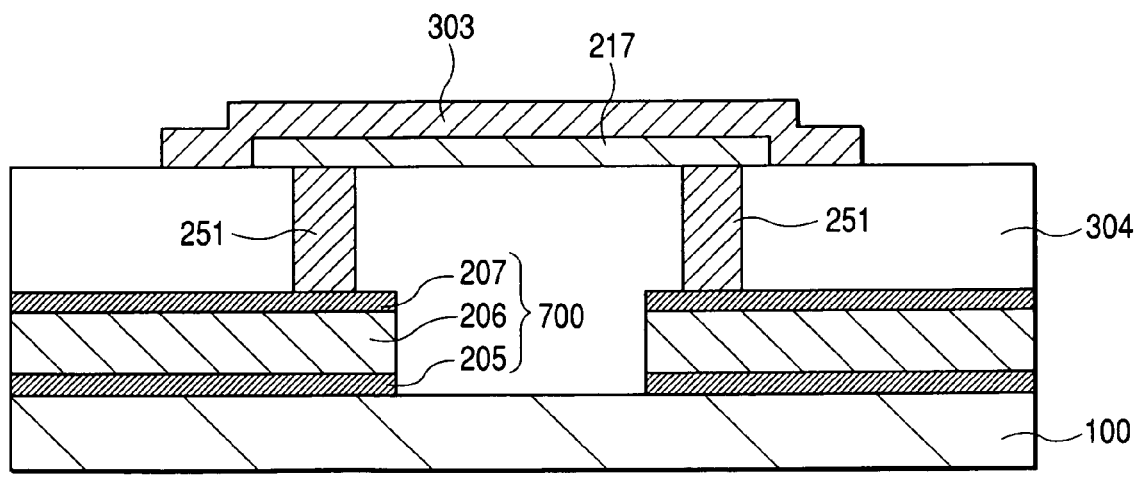
FIG. 24 is a sectional schematic view of section C-C' of the semiconductor device in the sixth embodiment of the present invention.

An example of a plan layout view of the MIM capacitor and resistor which are formed using the above process steps is shown in FIG. 22. The sectional views in FIGS. 20A, 20B and 21A, 22B show section A-A' of FIG. 22. A sectional view taken in a direction of B-B' in FIG. 22 is shown in FIG. 23, and a sectional view taken in a direction of C-C' in FIG. 22 is shown in FIG. 24. In the layout view of FIG. 22, an opening 755 provided in the first intermediate layer is an area functioning as the MIM capacitor, and a resistor 761 is an area functioning as the resistor.

MIM capacitor performance and reliability of the thus-formed semiconductor device having an MIM capacitor and a resistor were examined. As a result, it was found that performance and reliability equivalent to those of the third embodiment are obtained. It was also found that the thus-formed resistor has a sheet resistance of 92 $\Omega/\square$. Furthermore, a sufficient performance value of −70 ppm/° C. was obtained from evaluation results on temperature coefficients of electrical resistance.

That is to say, according to the present embodiment, it is possible to form a semiconductor device having: an MIM capacitor capable of achieving high capacitance density while minimizing increases in leakage current and decreases in dielectric breakdown strength; and a resistor capable of being formed without increasing the number of process steps. More specifically, the above MIM capacitor can be formed by: forming a lower electrode so as to cover an interconnect via plug opened in lower metal wiring; forming a first intermediate layer made of a 100 nm-thickness silicon dioxide film having an opening at the top of the lower electrode; forming a dielectric film and an upper electrode in such a manner as to cover the above opening; patterning the upper electrode, the dielectric film, and the first intermediate layer in such a form as to embrace the opening entirely. Also, the above resistor can be realized by: forming it by patterning part of the metal film formed as the lower electrode; and forming the first intermediate layer so as to cover the resistor.

The present embodiment, unlike the fifth embodiment, is characterized in that since a metal film that is formed independently of aluminum wiring is present, directly under the dielectric film of the MIM capacitor, it is possible to select a material independent of the barrier metal used in the aluminum wiring, and in that the embodiment is insusceptible to hillocking occurring on the aluminum wiring. The total number of process steps, however, increases since a patterning process for the lower electrode is newly added.

Although the lower electrode and the resistor are formed of 25-nm-thick tantalum nitride in the present embodiment, neither the film thickness nor the kind of material is limited by the embodiment. Other materials and different film thicknesses can also be used within a range that does not deteriorate performance of the lower electrode or performance of the resistor. More specifically, it is possible to use a high-melting-point metal such as titanium, tungsten, or molybdenum, or an alloy containing a nitride thereof as its principal constituent. Changing of the film thickness according to a resistivity of the substance forming the resistor can also be conducted within a sheet resistance range allowable for circuit designing. Additionally, although the present embodiment used single-layer tantalum nitride to construct the lower electrode and the resistor, it is possible to adopt a stacked structure with a plurality of stacked layers each different in composition and material.

Besides, while the present embodiment uses 50-nm-thick titanium nitride to form the upper electrode, neither the film thickness nor the kind of material is limited by the embodiment. Tantalum, tungsten, or a metal based mainly on a nitride of tungsten, or aluminum, or an alloy thereof, or the like is usable as a material of the upper electrode, instead of titanium nitride. Furthermore, although titanium nitride is used as the barrier metal for forming first and second metal wiring, it is possible, as mentioned above, to use tantalum, tungsten, or a metal based mainly on a nitride of tungsten, instead of titanium nitride. Besides, if there is a margin on reliability, it is also possible to employ a structure not using a barrier metal. Moreover, forming both the upper electrode and the barrier metal into a stacked structure made up of plural layers does not present any problems.

Although a 50-nm thick tantalum oxide film is used as a dielectric film in the present embodiment, neither the film thickness nor the kind of material is limited by the embodiment. A hafnium oxide, a zirconium oxide, a lanthanum oxide, a titanium oxide, an aluminum oxide, or the like, or a mixture thereof, or a compound that contains nitrogen (and/or the like) therein can be used as the dielectric film material, instead of tantalum oxide. Alternatively, a ferroelectric material such as PZT, STO, or BST can also be used. Furthermore, while the present embodiment uses a single-layer dielectric film as the dielectric film, this dielectric film can also be formed into a stacked structure as required.

Additionally, while the present embodiment primarily uses a 100-nm-thick silicon dioxide film as the first intermediate layer, the embodiment is not limited by this film thickness or this kind of material. As mentioned above, the first intermediate layer has a preferred film-thickness range, and for current manufacturing apparatuses, excellent characteristics are obtained in the range of about 50 nm to 200 nm film thickness. It can be easily estimated, however, that depending on performance of the deposition apparatus used, the foregoing preferred film-thickness range changes to a certain degree. In addition, although the silicon dioxide that is formed using a plasma CVD method is used as the material of the first intermediate layer, the use of this material does not obstruct selection of other materials, provided that the use of the material suits an intended purpose. More specifically, it is possible to use a low-k film (or the like) represented by silicon nitride, silicon oxynitride, silicon carbide, silicon nitrocarbide, aluminum oxide, SiOC, and the like. Furthermore, although the present embodiment uses single-layer silicon dioxide as the first intermediate layer, this layer can also be formed into a stacked structure made up of plural layers. More specifically, in the structure where silicon nitride is used as the layer abutting on the lower electrode and silicon dioxide is used as the layer formed on the silicon nitride layer, it becomes easy to control a sectional taper angle of the opening provided in the first intermediate layer. If this taper angle is highly controllable, the coverage of the dielectric film is likely to be improved, which is effective for improving dielectric breakdown strength. The high controllability of the taper angle also improves controllability of an area of the opening in the MIM capacitor, thus offering the advantage that a desired dielectric constant can be obtained with high reproducibility.

In addition, the present embodiment takes the layout construction shown in FIG. 22. In consideration of actual application, a respect in which the layout is not limited to such positions, number, and sizes of interconnect via plugs as shown in the present embodiment is as shown in the other embodiments.

Additionally, while the interconnect via plug in the present embodiment is entirely filled in with tungsten at the first conductive plug 250 and the second conductive plug 251, validity of the present invention is not limited to/by this structure or material. Instead of tungsten, a conductor based mainly on aluminum or copper can be used as a conductive material. Furthermore, the surfaces of the first conductive plug 250 and the second conductive plug 251 do not necessarily need to be flush with the surface of the first interlayer dielectric film 304, and such indentation or bumping levels that do not affect reliability can be accommodated to a certain extent during the forming process for the lower electrode and the dielectric film.

Furthermore, while, in the present embodiment, the process steps using primarily a silicon dioxide film as the first interlayer dielectric film have been described by way of example, the embodiment is not limited to/by this material and it is possible to use a low-k material capable of reducing the coupling capacitance of the wiring. It is possible to use such an SiOC film (carbon-containing silicon dioxide film) as represented by Black Diamond (registered trademark of Applied Materials, Inc.), such an organic film as represented by SiLK (registered trademark of the Dow Chemicals Company), other low-k materials with a pore(s) introduced thereinto, a fluorine-containing silicon dioxide film, or the like. When such a low-k material is used, protective dielectric films of some kind are required and thus a first interlayer dielectric film also includes the multilayer film constructed of these plural dielectric films.

Although the aluminum wiring that is processed by dry etching is used as first metal wiring and second metal wiring in the present embodiment, the aluminum wiring or copper wiring that is processed with a damascene method can be used instead, as required.

Seventh Embodiment

The present embodiment is one of the applications using the manufacturing process for the semiconductor device shown in the second embodiment. Process steps for forming MIM capacitors in a vertically two-level stacked form are described below using the sectional views shown in FIGS. 25A, 25B, 25C, 26A, and 26B. The description is given in order of the process steps. The sectional views of FIGS. 25A, 25B, 25C, 26A, and 26B show a manufacturing process for the semiconductor device of the present invention. The following is the description given in order of the process steps.

Figure 25A:
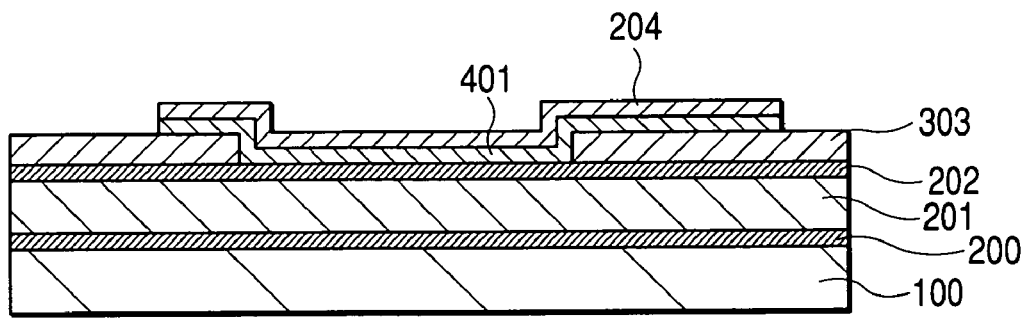
FIGS. 25A, 25B, 25C are sectional schematic views of a manufacturing process for major elements of a semiconductor device in a seventh embodiment of the present invention.

As shown in FIG. 25A, on a substrate 100 having semiconductor devices formed thereon, a first barrier metal film 200 made of a 50-nm-thick titanium nitride film, a first aluminum film 201 made of a 400-nm-thick aluminum alloy, and a second barrier metal film 202 made of a 50-nm-thick titanium nitride film are first formed using a sputtering method. After this, a first intermediate layer made of a 100-nm-thick silicon dioxide film is formed using a plasma CVD method, and then an opening is provided in a desired area of the first intermediate layer by combining lithography and dry etching. Next, a dielectric film made of a 50-nm-thick tantalum oxide film and an upper electrode made of a 50-nm-thick tantalum nitride film are formed by reactive sputtering and sputtering, respectively, in such a form as to cover the opening. Furthermore, an upper electrode 204 and a dielectric film 401, both patterned beforehand to cover the opening, are formed by dry etching.

Figure 25B:
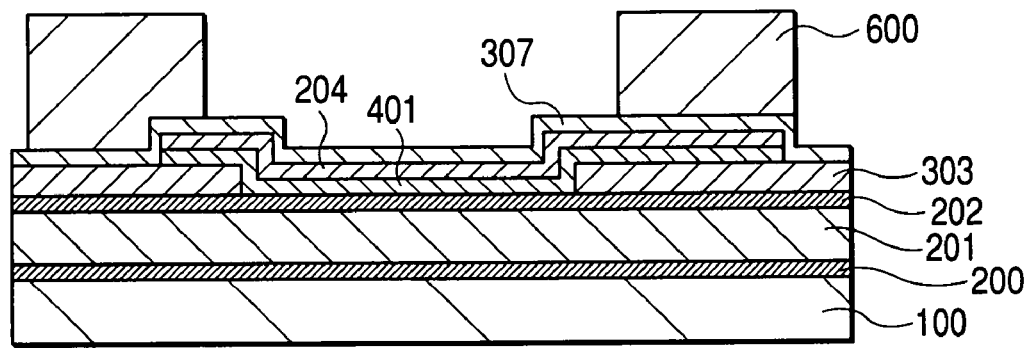

Next, as shown in FIG. 25B, a second intermediate layer 307 made of a 100-nm-thick silicon dioxide film is formed by whole-surface processing with plasma CVD. After this, a first etching mask 600 having an opening at both the patterned upper electrode 204 and above the patterned dielectric film 401 is formed on the second intermediate layer 307 by using lithography.

Figure 25C:
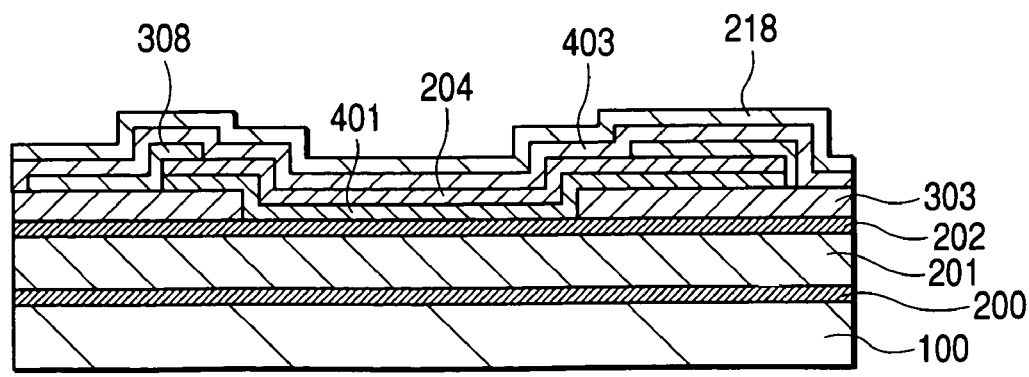

Next, as shown in FIG. 25C, until the patterned upper electrode 204 has become exposed, the second intermediate layer 307 is dry-etched using the first etching mask 600, and a second intermediate layer 308 is thus formed. After this, a second dielectric film 403 made of a 50-nm-thick tantalum oxide film is formed by whole-surface processing with reactive sputtering, and a second upper electrode 218 made of a 50-nm-thick titanium nitride film is formed using sputtering.

Figure 26A:
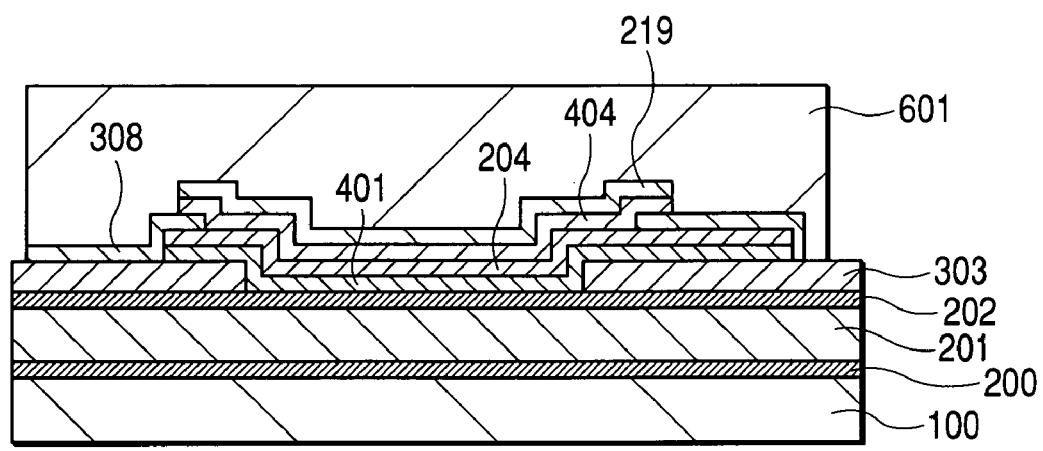
FIGS. 26A, 26B are sectional schematic views of the manufacturing process for major elements of a semiconductor device in the seventh embodiment of the present invention.

Next, as shown in FIG. 26A, a patterned second dielectric film 404 and a patterned second upper electrode 219 are formed by lithographic and dry-etching methods in such a form as to cover at least the opening above the patterned upper electrode 204 provided on the patterned second intermediate layer. These forming steps are followed by forming a second etching mask 601 in a desired area by lithography in such a form as to include at least the patterned upper electrode 204 and the patterned second upper electrode 219.

Next after dry etching of a patterned first intermediate layer 303 using the second etching mask 601, the second barrier metal film 202, the first aluminum film 201, and the first barrier metal film 200 are dry-etched and then first metal wiring 700 is formed that is constituted by a first barrier metal layer 205, a first aluminum layer 206, and a second barrier metal layer 207. Next after removal of the second etching mask 601 by use of an asher, a first interlayer dielectric layer 304 made of a 1000-nm-thick silicon dioxide film is formed using plasma CVD, and then the first interlayer dielectric layer 304 is made planar by using a chemical-mechanical polishing method. Next, openings are provided by lithography and dry etching so that the patterned upper electrode 204, the first metal wiring 700, and the patterned second upper electrode 219 are exposed. In addition, a first conductive plug 250 made of tungsten and connected to the patterned second upper electrode 219, a second conductive plug 251 made of tungsten and connected to the patterned upper electrode 204, and a third conductive plug 252 made of tungsten and connected to the first metal wiring 700 are formed in the openings.

Figure 26B:
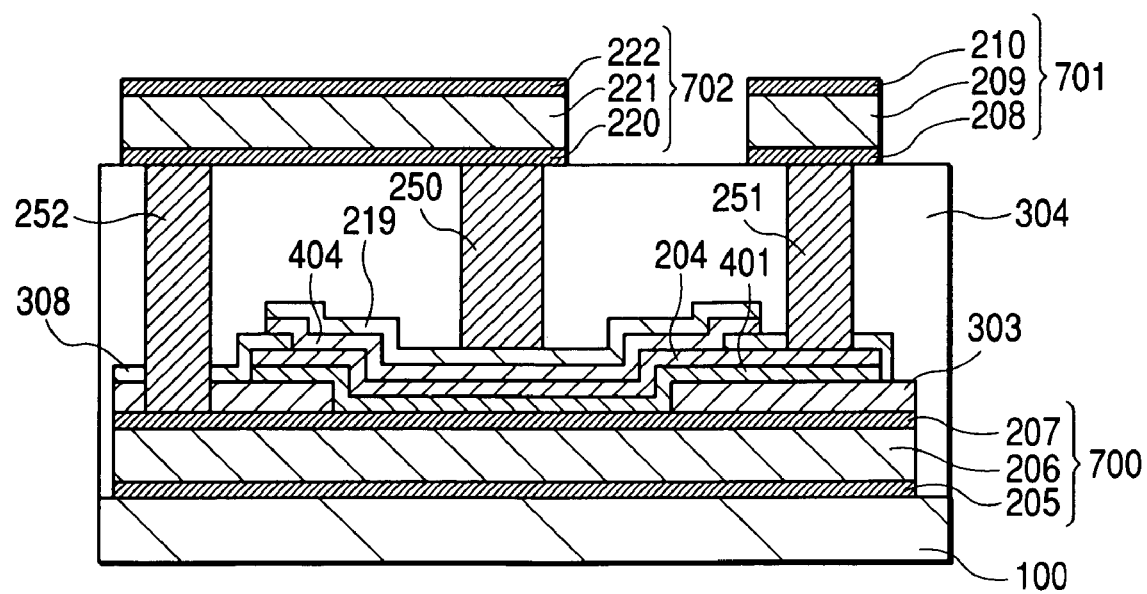

Finally, second metal wiring 701 including a third barrier metal layer 208 made of a 50-nm-thick titanium nitride film, a second aluminum layer 209 made of a 400-nm-thick aluminum alloy, and a fourth barrier metal layer 210 made of a 50-nm-thick titanium nitride film, is formed by combining a sputtering method, lithography, and dry etching, so as to be electrically connected to the second conductive plug 251. Third metal wiring 702 electrically connected to the first conductive plug 250 and the third conductive plug 252 and including a six barrier metal layer 220 made of a 50-nm-thick titanium nitride film, a third aluminum layer 221 made of a 400-nm-thick aluminum alloy, and a seventh barrier metal layer 222 made of a 50-nm-thick titanium nitride film, is formed by combining the above three methods. The use of the above process steps makes it possible to form a semiconductor device having a vertically stacked MIM capacitor arrangement made up of the first metal wiring 700, the patterned dielectric film 401, the patterned upper electrode 204, the patterned second dielectric film 404, and the patterned second upper electrode 219. FIG. 26B shows such a semiconductor device.

Examinations were performed on MIM capacitor performance and reliability of the thus-formed semiconductor device that has MIM capacitors. Specified dielectric breakdown strength data equivalent to the value shown in the second embodiment were obtained as a result. Obtained values relating to coupling capacitance and short yield between adjacent first metal wiring portions were also equivalent to those of the second embodiment. Additionally, in the present embodiment, since MIM capacitors of the type shown in the second embodiment are connected in parallel to each other, about twice the capacitance density of the second embodiment was obtained.

That is to say, according to the present embodiment, it is possible to form MIM capacitors capable of achieving high capacitance density while minimizing increases in leakage current and decreases in dielectric breakdown strength, and a semiconductor device capable of concurrently realizing reduction in a coupling capacitance of a wiring layer equivalent to a lower electrode of each MIM capacitor, and improvement in a wiring-to-wiring short yield. More specifically, the above MIM capacitors and semiconductor device can be realized by: forming a first intermediate layer made of a 100-nm-thick silicon dioxide film having an opening at the top of the lower electrode; forming a dielectric film and an upper electrode in such a form as to cover the above opening; patterning the upper electrode and the dielectric film in such a form as to completely embrace the opening; forming a second intermediate layer made of a 100-nm-thick silicon dioxide film having an opening at the top of the lower electrode; forming a second upper electrode and a second dielectric film in such a form as to cover the above opening; and patterning the second upper electrode and the second dielectric film in such a form as to completely embrace the opening.

The present embodiment, unlike the second embodiment, has a vertical two-level stacked MIM capacitor structure. Although this structure increases the number of manufacturing process steps required, the structure allows significant improvement of the capacitance density per MIM capacitor area occupancy.

While the present embodiment employs a vertically two-level stacked structure of MIM capacitors, the number of stacking levels can also be increased to three or more, as required.

Although tantalum oxide films with a thickness of 50 nm are used as the dielectric film and second dielectric film in the present embodiment, neither the film thickness nor the kind of material is limited by the embodiment. Capacitance density increases inversely with the film thickness of the dielectric film. For improved capacitance density, therefore, it is preferable that the film thickness be as small as possible. However, a film thickness reduction limit according to a particular operating voltage exists since reducing the film thickness also reduces dielectric breakdown strength. Additionally, a hafnium oxide, a zirconium oxide, a lanthanum oxide, a titanium oxide, an aluminum oxide, or the like, or a mixture thereof, or a compound that contains nitrogen (and/or the like) therein can be used as the dielectric film material, instead of tantalum oxide. Alternatively, a ferroelectric material such as PZT, STO, or BST can also be used. Furthermore, while the present embodiment uses a single-layer dielectric film as the dielectric film, this dielectric film can also be formed into a stacked structure as required. For example, leakage current density can likewise be reduced by sandwiching the top and bottom of the tantalum oxide film between the aluminum oxide (or the like) having a large band-gap. Besides, the dielectric film and the second dielectric film do not always need to be of the same material, the same forming process, or the same film thickness, and can use an appropriate material, forming process, and/or film thickness according to particular requirements.

While the present embodiment primarily uses 100-nm-thick silicon dioxide films as the first intermediate layer and the second intermediate layer, the embodiment is not limited by this film thickness or this kind of material. As mentioned above, the first intermediate layer and the second intermediate layer each have a preferred film-thickness range, and for the current manufacturing apparatus, excellent characteristics are obtained in the range of about 50 to 200 nm in film thickness. If a technique for further improving a step coverage is adopted as a method of forming the dielectric film, although expansion of the maximum permissible film thickness to a region of 200 nm or more can be easily anticipated, increasing this film thickness without due consideration only yields a small number of advantages. In addition, although the silicon dioxide that is formed using plasma CVD is used as the material of the first and second intermediate layers, the use of this material does not obstruct selection of other materials, provided that the use of the material suits an intended purpose. More specifically, it is possible to use a low-k film (or the like) represented by silicon nitride, silicon oxynitride, silicon carbide, silicon nitrocarbide, aluminum oxide, SiOC, and the like. If silicon nitride, silicon oxynitride, or aluminum oxide is used, this makes it possible to improve dry-etching selectivity and to use them as a light-absorbing layer during lithography. These materials, however, have the disadvantage that their high relative permittivities increase interconnect coupling capacitance. Additionally, although, because of their low relative permittivities, silicon carbide, silicon nitrocarbide, an SiOC film, and the like are effective for reduction in coupling capacitance, these materials also have a disadvantage that a leakage current does not easily decrease. Furthermore, although the present embodiment uses single-layer silicon dioxide to form the first and second intermediate layers, these layers can both be formed into a stacked structure made up of plural layers. More specifically, in the structure where silicon nitride is used as the layer abutting on the lower electrode and silicon dioxide is used as the layer formed on this silicon nitride layer, it becomes easy to control sectional taper angles of the openings provided in the first and second intermediate layers. If these taper angles are highly controllable, the coverage of the dielectric film is likely to be improved, which is effective in improving dielectric breakdown strength. The high controllability of the taper angles also improves controllability of areas of the openings in the MIM capacitors, thus offering the advantage that a desired dielectric constant can be obtained with high reproducibility.

Furthermore, although the same material, the same forming process, and the same film thickness are used for the first and second intermediate layers in the present embodiment, validity of the present invention is not limited to these factors.

Besides, while the present embodiment uses 50-nm-thick titanium nitride films to form the upper electrode and the second upper electrode, neither the film thickness nor the kind of material is limited by the embodiment. If the film thickness is too small, when interconnect via plugs are opened, these via plugs could break through the electrodes, damaging the dielectric film located thereunder. Conversely, if the film thickness is too great, since this means that a resistor is inserted in series with respect to the MIM capacitor, high-frequency characteristics could deteriorate. In the range where titanium nitride is used, a film thickness from about 50 to 100 nm is preferred. Tantalum, tungsten, or a metal based mainly on a nitride thereof, or aluminum, or an alloy thereof, or the like is usable as an electrode material, instead of titanium nitride. Furthermore, although titanium nitride is used as the barrier metal for forming first, second, and third metal-wiring portions, it is possible, as mentioned above, to use tantalum, tungsten, or a metal based mainly on a nitride thereof, instead of titanium nitride. Besides, if there is a margin on reliability, it is possible to employ a structure not using a barrier metal. Moreover, forming both the upper electrode and the barrier metal into a stacked structure made up of plural layers does not present any problems.

In addition, while, in the present embodiment, the process steps using primarily a silicon dioxide film as the first interlayer dielectric film have been described by way of example, the embodiment is not limited to this material and it is possible to use a low-k material capable of reducing the coupling capacitance of the wiring. It is also possible to use such an SiOC film (carbon-containing silicon dioxide film) as represented by Black Diamond (registered trademark of Applied Materials, Inc.), such an organic film as represented by SiLK (registered trademark of the Dow Chemicals Company), other low-k materials with a pore(s) introduced thereinto, a fluorine-containing silicon dioxide film, or the like. When such a low-k material is used, protective dielectric films of some kind are required and thus a first interlayer dielectric film also includes the multilayer film constructed of these plural dielectric films. Furthermore, when such a low-k material is used, restrictions on process temperature and on the like usually make it difficult to apply the CVD method to tungsten, and if this is the case, interconnect via plugs are preferably filled in with aluminum or the like.

Although the aluminum wiring processed by dry etching is used as second and third metal wiring portions in the present embodiment, the aluminum wiring or copper wiring that is processed with a damascene method can be used instead, as required. In this case, it is also possible to reduce the number of process steps by applying a dual damascene method capable of forming interconnect via plugs at the same time.

Eighth Embodiment

The present embodiment is one of the applications using the manufacturing process for the semiconductor device shown in the seventh embodiment, and details of the present invention are described below using the sectional view shown in FIG. 27. The description is given below in order of the process steps.

First, the structure shown in FIG. 26A is created in accordance with the manufacturing process steps shown in the seventh embodiment.

Next after dry etching of a patterned first intermediate layer 303 using a second etching mask 601, a second barrier metal film 202, a first aluminum film 201, and a first barrier metal film 200 are dry-etched. Then first metal wiring 700 is formed that is constituted by a first barrier metal layer 205, a first aluminum layer 206, and a second barrier metal layer 207. Next after removal of the second etching mask 601 by use of an asher, a first interlayer dielectric layer 304 made of a 1000-nm-thick silicon dioxide film is formed using plasma CVD, and then the first interlayer dielectric layer 304 is made planar by using a chemical-mechanical polishing method. Next, openings are provided by lithography and dry etching so that a patterned upper electrode 204, the first metal wiring 700, and a patterned second upper electrode 219 are exposed. In addition, a first conductive plug 250 made of tungsten and connected to the patterned second upper electrode 219, a second conductive plug 251 made of tungsten and connected to the patterned upper electrode 204, and a third conductive plug 252 made of tungsten and connected to the first metal wiring 700 are formed in the openings. The manufacturing process steps up to this phase are the same as for the seventh embodiment.

Next, second metal wiring 701 including a third barrier metal layer 208 made of a 50-nm-thick titanium nitride film, a second aluminum layer 209 made of a 400-nm-thick aluminum alloy, and a fourth barrier metal layer 210 made of a 50-nm-thick titanium nitride film, is formed by combining a sputtering method, lithography, and dry etching, so as to be electrically connected to the second conductive plug 251. Also, second metal wiring 702 electrically connected to the first conductive plug 250 and including a sixth barrier metal layer 220 made of a 50-nm-thick titanium nitride film, a third aluminum layer 221 made of a 400-nm-thick aluminum alloy, and a seventh barrier metal layer 222 made of a 50-nm-thick titanium nitride film, is formed by combining the above three methods. In addition, second metal wiring 702 electrically connected to the third conductive plug 252 and including an eighth barrier metal layer 223 made of a 50-nm-thick titanium nitride film, a fourth aluminum layer 224 made of a 400-nm-thick aluminum alloy, and a ninth barrier metal layer 225 made of a 50-nm-thick titanium nitride film, is formed using the above three methods.

The use of the above process steps makes it possible to form a semiconductor device having a vertically stacked MIM capacitor arrangement made up of the first metal wiring 700, a patterned dielectric film 401, the patterned upper electrode 204, a patterned second dielectric film 404, and the patterned second upper electrode 219. FIG. 27 shows such a semiconductor device.

Figure 27:
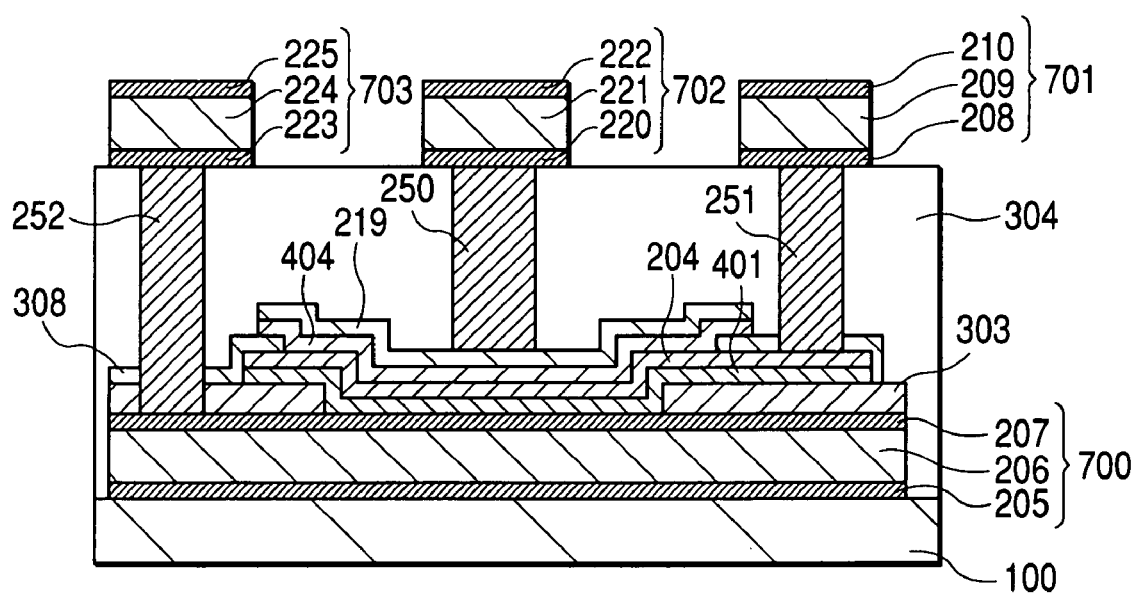
FIG. 27 is a sectional schematic views of a manufacturing process for major elements of a semiconductor device in an eighth embodiment of the present invention.

The structure in the present embodiment, shown in FIG. 27, differs from the structure of the seventh embodiment in that independent output terminals (702, 703) are formed for the first conductive plug 250 and the third conductive plug 252, respectively.

Figures 28A, 28B:
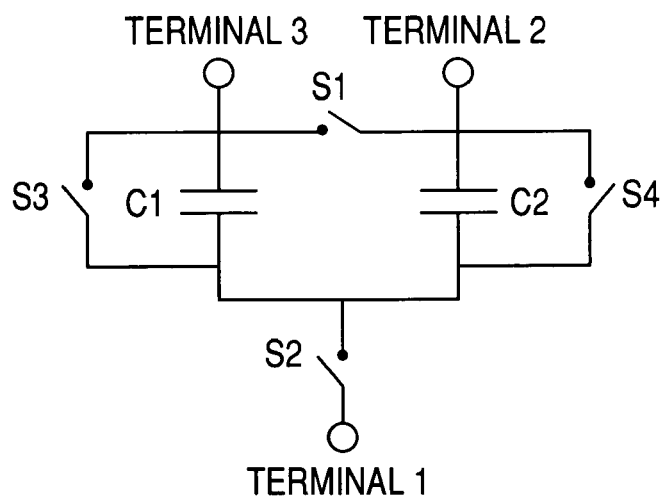
FIGS. 28A, 28B show an electrical equivalent circuit of, and the dielectric constants achieved according to particular states of switches, respectively, in the semiconductor device in the eighth embodiment of the present invention.

FIG. 28A schematically shows an electrical equivalent circuit of the MIM capacitor section shown in FIG. 27. In FIG. 28A, C1 is a dielectric constant of the capacitor constituted by the first metal wiring 700, the patterned dielectric film 401, and the patterned upper electrode 204, and C2 is a dielectric constant of the capacitor constituted by the patterned upper electrode 204, the patterned second dielectric film 404, and the patterned second upper electrode 219. Terminal 1 is associated with the second metal wiring 701, terminal 2, with third metal wiring 702, and terminal 3, with fourth metal wiring 703. Symbols S1, S2, S3, and S4 denote electrical switches.

An "on" state of each switch indicates that the switch is in a conducting state, and an "off" state indicates that the switch is in a non-conducting state.

FIG. 28B shows the "on/off" state of each switch and the associated dielectric constant obtained between terminals. For example, if switches S1, S2 are "on" and switches S3, S4 are "off", a dielectric constant between terminals 1 and 2 (or 3) equals a parallel capacitance of C1 and C2 (i.e., C1+C2). More specifically, switch S1 can be turned "on" by electrically strapping the third metal wiring 702 and the fourth metal wiring 703, and switch S2 can be turned "on" by electrically connecting the second metal wiring 701 to the patterned upper electrode 204. Conversely, switches S3, S4 can be turned "off" by arranging the second metal wiring 701, the third metal wiring 702, and the fourth metal wiring 703, so as not to electrically strap these wiring portions. If switches S1, S2, S3, S4 are all turned "off", a dielectric constant between terminals 2 and 3 equals a series capacitance of C1 and C2 (i.e., C1×C2/(C1+C2)). If switches S3, S4 are turned "off" and "on", respectively, with switch S1 "off" and switch S2 "on", the dielectric constant between terminals 1 and 3 equals C1, and if switches S3, S4 are turned "on" and "off", respectively, with switch S1 "on" and switch S2 "off", the dielectric constant between terminals 1 and 2 equals C2. These connection formats can likewise be easily implemented by changing a method of connecting each metal wiring portion.

Examinations were performed on MIM capacitor performance and reliability of the thus-formed semiconductor device that has MIM capacitors. A performance of 8 fF/$\mu m^2$ in capacitance density was obtained by conducting a capacitance measurement between the second metal wiring and third metal wiring in the structure where switches S1, S2 were turned "on" and switches S3, S4, "off". A performance of 2 fF/$\mu m^2$ in capacitance density was obtained by conducting a capacitance measurement between the third metal wiring and fourth metal wiring in the structure where switches S1, S2, S3, S4 were all turned "off". Under these conditions, very great dielectric breakdown strength was also obtained. A performance of 4 fF/$\mu m^2$ in capacitance density was obtained when, with switch S1 "off" and switch S2 "on", switch S3 was turned "off" and switch S4 "on" or switch S4 "off" and switch S3 "on". Additionally, obtained values relating to coupling capacitance and short yield between adjacent first metal wiring portions in the thus-formed semiconductor device with the MIM capacitors were also equivalent to the values of the seventh embodiment.

That is to say, according to the present embodiment, it is possible to form MIM capacitors each capable of achieving high capacitance density while minimizing increases in leakage current and decreases in dielectric breakdown strength, and a semiconductor device capable of concurrently realizing reduction in a coupling capacitance of a wiring layer equivalent to a lower electrode of each MIM capacitor, and improvement in a wiring-to-wiring short yield. More specifically, the above MIM capacitors and semiconductor device can be realized by: forming a first intermediate layer made of a 100-nm-thick silicon dioxide film having an opening at the top of the lower electrode; forming a dielectric film and an upper electrode in such a form as to cover the above opening; patterning the upper electrode and the dielectric film in such a form as to completely embrace the opening; forming a second intermediate layer made of a 100-nm-thick silicon dioxide film having an opening at the top of the lower electrode; forming a second upper electrode and a second dielectric film in such a form as to cover the above opening; and patterning the second upper electrode and the second dielectric film in such a form as to completely embrace the opening.

The present embodiment, unlike the seventh embodiment, has independent lead-out wiring for the patterned upper electrode, the patterned second upper electrode, and the first metal wiring each. Consequently, a plurality of dielectric constants can be realized in the same MIM capacitor structure by changing a method of connecting each lead-out wiring portion.

The present embodiment controls the "on/off" state of each of switches S1, S2, S3, S4, by connecting/disconnecting the metal wiring. Control of switches, however, is not limited to this method. Switch control is likewise possible by, for example, providing electrically controllable switches such as crossbars, or using fuse elements or the like.

While the present embodiment employs a vertically two-level stacked structure of MIM capacitors, the number of stacking levels can also be increased to three or more, as required.

Although tantalum oxide films with a thickness of 50 nm are used as the dielectric film and second dielectric film in the present embodiment, neither the film thickness nor the kind of material is limited by the embodiment. Capacitance density increases inversely with the film thickness of the dielectric film. For improved capacitance density, therefore, it is preferable that the film thickness be as small as possible. However, a film thickness reduction limit according to a particular operating voltage exists since reducing the film thickness also reduces dielectric breakdown strength. Additionally, a hafnium oxide, a zirconium oxide, a lanthanum oxide, a titanium oxide, an aluminum oxide, or the like, or a mixture thereof, or a compound that contains nitrogen (and/or the like) therein can be used as the dielectric film material, instead of tantalum oxide. Alternatively, a ferroelectric material such as PZT, STO, or BST can also be used. Furthermore, while the present embodiment uses a single-layer dielectric film as the dielectric film, this dielectric film can also be formed into a stacked structure as required. For example, leakage current density can likewise be reduced by sandwiching above and below the tantalum oxide film between the aluminum oxide (or the like) having a large band gap. Besides, the dielectric film and the second dielectric film do not always need to be of the same material, the same forming process, or the same film thickness, and can use an appropriate material, forming process, and/or film thickness according to particular requirements.

While the present embodiment primarily uses 100-nm-thick silicon dioxide films as the first intermediate layer and the second intermediate layer, the embodiment is not limited by this film thickness or this kind of material. As mentioned above, the first intermediate layer and the second intermediate layer each have a preferred film-thickness range, and for the current manufacturing apparatus, excellent characteristics are obtained in the range of about 50 to 200 nm in film thickness. If a technique for further improving a step coverage is adopted as a method of forming the dielectric film, although expansion of the maximum permissible film thickness to a region of 200 nm or more can be easily anticipated, increasing this film thickness without due consideration only yields a small number of advantages. In addition, although the silicon dioxide that is formed using plasma CVD is used as the material of the first and second intermediate layers, the use of this material does not obstruct selection of other materials, provided that the use of the material suits an intended purpose. More specifically, it is possible to use a low-k film (or the like) represented by silicon nitride, silicon oxynitride, silicon carbide, silicon nitrocarbide, aluminum oxide, SiOC, and the like. If silicon nitride, silicon oxynitride, or aluminum oxide is used, this makes it possible to improve dry-etching selectivity and to use them as a light-absorbing layer during lithography. These materials, however, have the disadvantage that their high relative permittivities increase interconnect coupling capacitance. Additionally, although, because of their low relative permittivities, silicon carbide, silicon nitrocarbide, an SiOC film, and the like are effective for reduction in coupling capacitance, these materials also have a disadvantage that a leakage current does not easily decrease. Furthermore, although the present embodiment uses single-layer silicon dioxide as the first and second intermediate layers, these layers can both be formed into a stacked structure made up of plural layers. More specifically, in the structure where silicon nitride is used as the layer abutting on the lower electrode and silicon dioxide is used as the layer formed on this silicon nitride layer, it becomes easy to control sectional taper angles of the openings provided in the first and second intermediate layers. If these taper angles are highly controllable, the coverage of the dielectric film is likely to be improved, which is effective in improving dielectric breakdown strength. The high controllability of the taper angles also improves controllability of areas of the openings in the MIM capacitors, thus offering the advantage that a desired dielectric constant can be obtained with high reproducibility. Furthermore, although the same material, the same forming process, and the same film thickness are used for the first and second intermediate layers in the present embodiment, validity of the present invention is not limited to these factors.

Besides, while the present embodiment uses 50-nm-thick titanium nitride films to form the upper electrode and the second upper electrode, neither the film thickness nor the kind of material is limited by the embodiment. If the film thickness is too small, when interconnect via plugs are opened, these via plugs could break through the electrodes, damaging the dielectric film located thereunder. Conversely, if the film thickness is too great, since this means that a resistor is inserted in series with respect to the MIM capacitor, high-frequency characteristics could deteriorate. In the range where titanium nitride is used, a film thickness from about 50 to 100 nm is preferred. Tantalum, tungsten, or a metal based mainly on a nitride thereof, or aluminum, or an alloy thereof, or the like is usable as an electrode material, instead of titanium nitride. Furthermore, although titanium nitride is used as the barrier metal for forming first, second, and third metal-wiring portions, it is possible, as mentioned above, to use tantalum, tungsten, or a metal based mainly on a nitride thereof, instead of titanium nitride. Besides, if there is a margin on reliability, it is possible to employ a structure not using a barrier metal. Moreover, forming both the upper electrode and the barrier metal into a stacked structure made up of plural layers does not present any problems.

In addition, while, in the present embodiment, the process steps using primarily a silicon dioxide film as the first interlayer dielectric film have been described by way of example, the embodiment is not limited to this material and it is possible to use a low-k material capable of reducing the coupling capacitance of the wiring. It is also possible to use such an SiOC film (carbon-containing silicon dioxide film) as represented by Black Diamond (registered trademark of Applied Materials, Inc.), such an organic film as represented by SiLK (registered trademark of the Dow Chemicals Company), other low-k materials with a pore(s) introduced thereinto, a fluorine-containing silicon dioxide film, or the like. When such a low-k material is used, protective dielectric films of some kind are required and thus a first interlayer dielectric film also includes the multilayer film constructed of these plural dielectric films. Furthermore, when such a low-k material is used, restrictions on process temperature and on the like usually make it difficult to apply the CVD method to tungsten, and if this is the case, interconnect via plugs are preferably filled in with aluminum or the like.

Although the aluminum wiring processed by dry etching is used as second, third, and fourth metal wiring portions in the present embodiment, the aluminum wiring or copper wiring that is processed with a damascene method can be used instead, as required. In this case, it is also possible to reduce the number of process steps by applying a dual damascene method capable of forming interconnect via plugs at the same time.

Ninth Embodiment

The present embodiment is one of the applications using the manufacturing process for the semiconductor device shown in the third embodiment. Process steps for forming MIM capacitors in a vertically two-level stacked form are described below using the sectional views shown in FIGS. 29A, 29B, 29C, 30A, and 30B. The description is given in order of the process steps. The sectional views of FIGS. 29A, 29B, 29C, 30A, and 30B show a manufacturing process for the semiconductor device of the present invention. The following is a description given in order of the process steps.

Figure 29A:
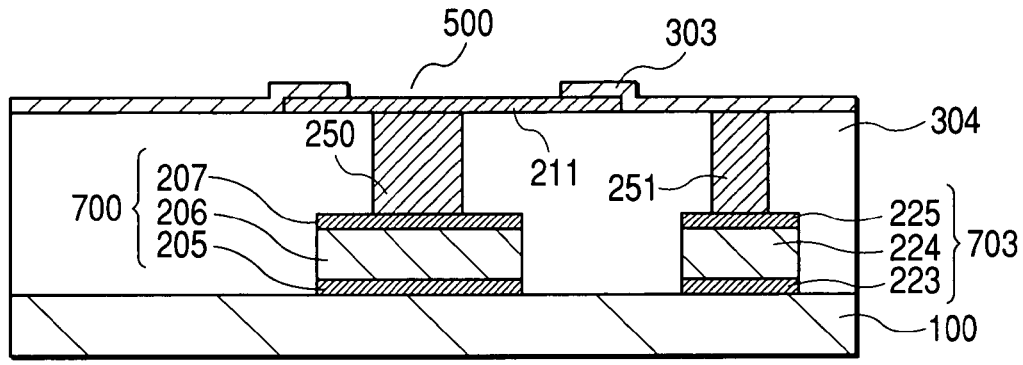
FIGS. 29A, 29B, 29C are sectional schematic views of a manufacturing process for major elements of a semiconductor device in a ninth embodiment of the present invention.

As shown in FIG. 29A, on a substrate 100 having semiconductor devices formed thereon, a 50-nm-thick titanium nitride film, a 400-nm-thick aluminum alloy film, and another 50-nm-thick titanium nitride film are first formed using a sputtering method. After that, first metal wiring 700 constituted by a first barrier metal layer 205, a first aluminum layer 206, and a second barrier metal layer 207, and fourth metal wiring 703 constituted by an eighth barrier metal layer 223, a fourth aluminum layer 224, and a ninth barrier metal layer 225, are formed lithographically and by dry etching. Next, a first interlayer dielectric layer 304 made of a 1000-nm-thick silicon dioxide film is formed using plasma CVD, and then the first interlayer dielectric layer 304 is made planar by chemical-mechanical polishing. Next, an opening is provided in both a desired area of the first metal wiring 700 and that of the fourth metal wiring 703 by combining lithography and dry etching in order to expose both desired areas, and then a first conductive plug 250 and a second conductive plug 251, both made of tungsten, are formed in the openings. After this, a 50-nm-thick titanium nitride film is formed by sputtering in such a form as to cover the first conductive plug 250 and the second conductive plug 251, and then a patterned lower electrode 211 is formed by combining lithography and dry etching so as to cover the first conductive plug 250. Subsequently after formation of a 100-nm-thick silicon dioxide film by means of plasma CVD, a first intermediate layer 303 processed beforehand to have an opening 500 at the top of the patterned lower electrode 211 is formed using lithographic and dry-etching methods.

Figure 29B:
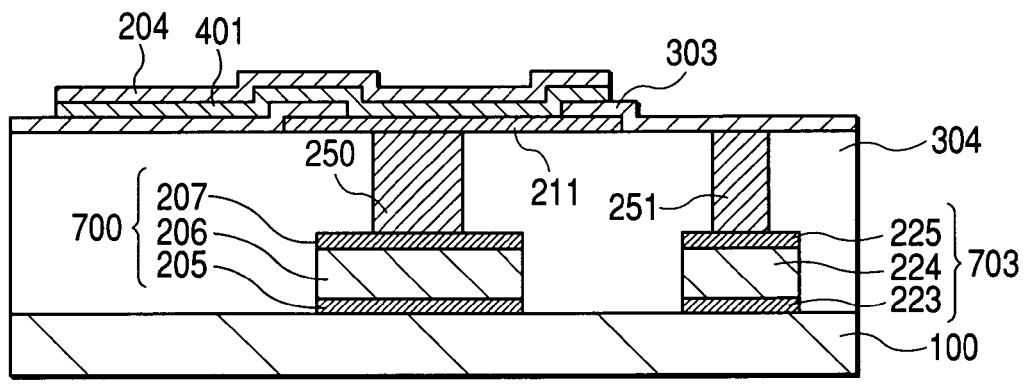

Next, as shown in FIG. 29B, a 50-nm-thick tantalum oxide film and a 50-nm-thick titanium nitride film are formed in such a form as to cover the opening 500 and abut the patterned lower electrode 211, and then a patterned dielectric film 401 made of 50-nm-thick tantalum oxide and a patterned upper electrode 204 are formed by combining lithography and dry etching so as to include at least the entire opening 500 internally.

Figure 29C:
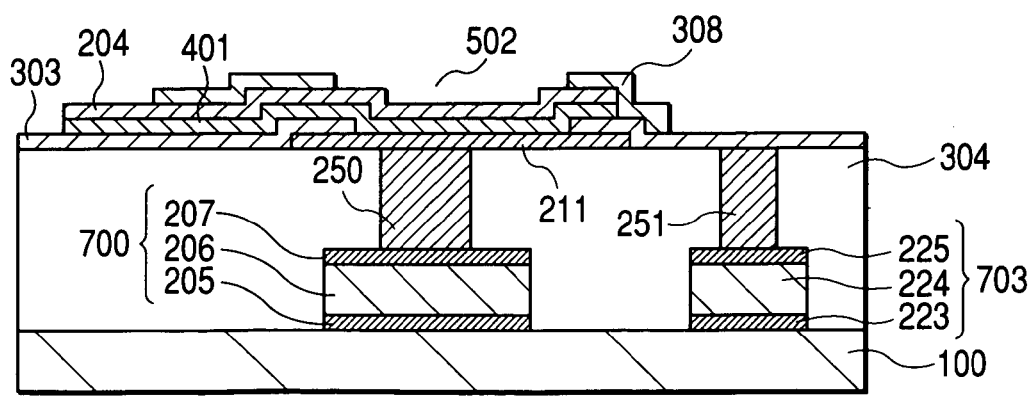

Next, as shown in FIG. 29C, a 100-nm-thick silicon dioxide film is formed by whole-surface processing with plasma CVD, and then a patterned second intermediate layer 308 provided with an opening 502 including at least a portion of the opening 500, and with a portion opened toward the patterned upper electrode 204, is formed using lithography and dry etching.

Figure 30A:
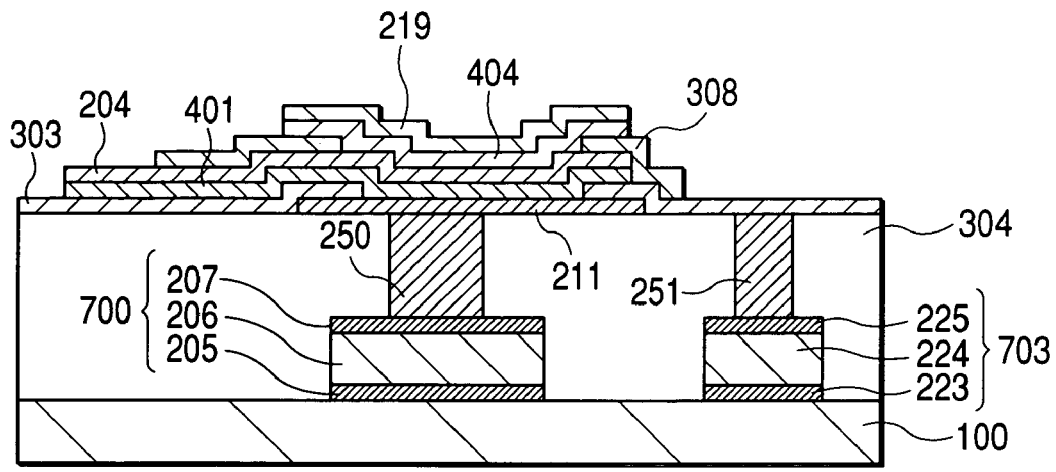
FIGS. 30A, 30B are sectional schematic views of a manufacturing process for major elements of a semiconductor device in a ninth embodiment of the present invention.

Next, as shown in FIG. 30A, after whole-surface formation of a 50-nm-thick tantalum oxide film and a 50-nm-thick titanium nitride film, a patterned second dielectric film 404 made of a 50-nm-thick tantalum oxide film, and a patterned second upper electrode 219 are formed by combining lithography and dry etching so as to completely include at least the opening 502 therein and expose a portion of the surface of the patterned upper electrode 204.

Figure 30B:
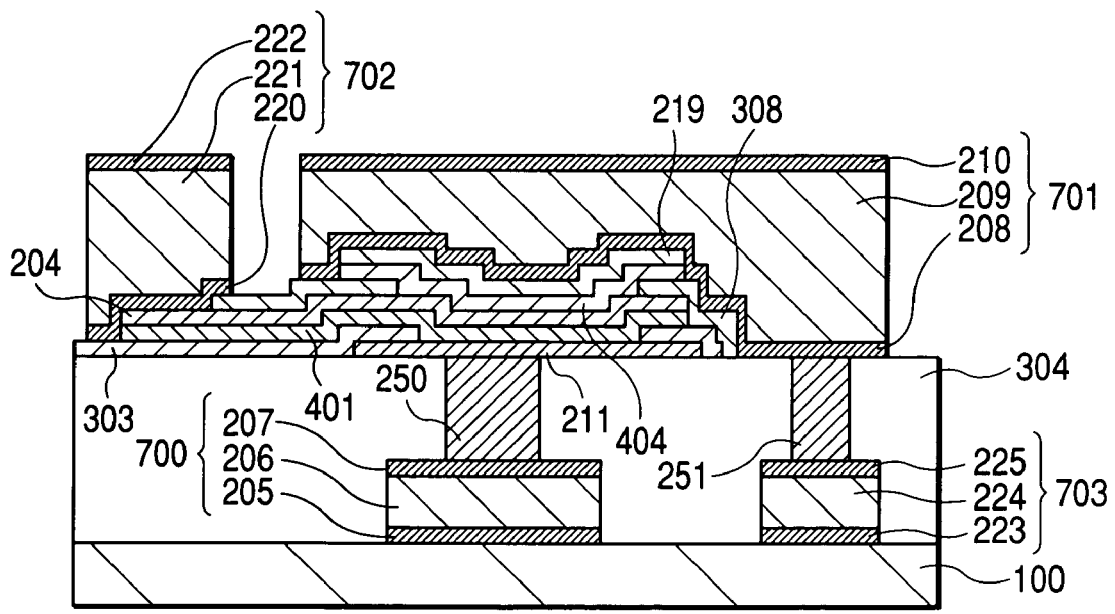

Next, as shown in FIG. 30B, the patterned first intermediate layer in the area having at least the formed second conductive plug 251 is first removed using lithographic and dry-etching methods, and then a 50-nm-thick titanium nitride film, a 400-nm-thick aluminum alloy film, and another 50-nm-thick titanium nitride film are formed on the entire surface by means of sputtering. After this, second metal wiring 701 that includes a third barrier metal layer 208 electrically connected to both the second conductive plug 251 and the second upper electrode 219 and made of a 50-nm-thick titanium nitride film, a second aluminum layer 209 made of a 400-nm-thick aluminum alloy, and a fourth barrier metal layer 210 made of a 50-nm-thick titanium nitride film, is formed using lithographic and dry-etching methods. Next, third metal wiring 702 that includes a sixth barrier metal layer 208 electrically connected to the patterned upper electrode 204 and made of a 50-nm-thick titanium nitride film, a third aluminum layer 209 made of a 400-nm-thick aluminum alloy, and a seventh barrier metal layer 210 made of a 50-nm-thick titanium nitride film, is also formed using lithographic and dry-etching methods.

The thus-formed MIM capacitor is electrically equivalent to the construction shown in FIG. 28A. The third metal wiring 702 in the present embodiment is equivalent to terminal 1, the second and fourth metal wiring portions (701, 703), to terminal 2, and the first metal wiring 700, to terminal 3. This means that the present embodiment, as with the eighth embodiment, makes it possible to achieve a plurality of capacitance densities with one MIM capacitor by changing a wiring interconnection method.

MIM capacitor performance and reliability of the thus-formed semiconductor device with MIM capacitors were examined. A performance of 8 fF/$\mu m^2$ in capacitance density was obtained by conducting a capacitance measurement between the first metal wiring and third metal wiring in the structure where switches S1, S2 were turned "on" and switches S3, S4, "off". Also, a performance of 2 fF/$\mu m^2$ in capacitance density was obtained by conducting a capacitance measurement between the first metal wiring and fourth metal wiring in the structure where switches S1, S2, S3, S4 were all turned "off" was measured. Under these conditions, very great dielectric breakdown strength was also obtained. A performance of 4 fF/$\mu m^2$ in capacitance density was obtained when, with switches S1 and S2 "off" and "on", respectively, switch S3 was turned "off" and switch S4 "on", or switch S4 "off" and switch S3 "on". Additionally, obtained values relating to coupling capacitance and short yield between adjacent first metal wiring portions in the thus-formed semiconductor device with the MIM capacitors were also equivalent to the values of the eighth embodiment.

That is to say, according to the present embodiment, it is possible to form a semiconductor device that has MIM capacitors capable of achieving high capacitance density while minimizing increases in leakage current and decreases in dielectric breakdown strength. More specifically, the above can be realized by: forming a lower electrode so as to cover an interconnect via plug opened in lower metal wiring; forming a first intermediate layer made of a 100-nm-thick silicon nitride film having an opening at the top of the lower electrode; forming a dielectric film and an upper electrode in such a form as to cover the above opening; patterning the upper electrode, the dielectric film, and the first intermediate layer in such a form as to completely embrace the opening; forming a second intermediate layer made of a 100-nm-thick silicon dioxide film having an opening at the top of the lower electrode; forming a second dielectric film and a second upper electrode in such a form as to cover the above opening; and patterning the second upper electrode and the second dielectric film in such a form as to completely embrace the opening.

The present embodiment, unlike the third embodiment, has a vertical two-level stacked MIM capacitor structure. Although this structure increases the number of manufacturing process steps required, the structure allows the capacitance density per MIM capacitor area occupancy to be significantly improved, and a plurality of capacitance densities and dielectric breakdown voltages to be realized by changing wiring interconnections.

While the present embodiment employs a vertically two-level stacked structure of MIM capacitors, the number of stacking levels can also be increased to three or more, as required.

The present embodiment controls the "on/off" state of each of switches S1, S2, S3, S4, by connecting/disconnecting the metal wiring. Control of switches, however, is not limited to this method. Switch control is likewise possible by, for example, providing electrically controllable switches such as crossbars, or using fuse elements or the like.

Although tantalum oxide films with a thickness of 50 nm are used as the dielectric film and second dielectric film in the present embodiment, neither the film thickness nor the kind of material is limited by the embodiment. Capacitance density increases inversely with the film thickness of the dielectric film. For improved capacitance density, therefore, it is preferable that the film thickness be as small as possible. However, a film thickness reduction limit according to a particular operating voltage exists since reducing the film thickness also reduces dielectric breakdown strength. Additionally, a hafnium oxide, a zirconium oxide, a lanthanum oxide, a titanium oxide, an aluminum oxide, or the like, or a mixture thereof, or a compound that contains nitrogen (and/or the like) therein can be used as the dielectric film material, instead of tantalum oxide. Alternatively, a ferroelectric material such as PZT, STO, or BST can also be used. Furthermore, while the present embodiment uses a single-layer dielectric film as the dielectric film, this dielectric film can also be formed into a stacked structure as required. For example, leakage current density can likewise be reduced by sandwiching above and below the tantalum oxide film between the aluminum oxide (or the like) having a large band gap. Besides, the dielectric film and the second dielectric film do not always need to be of the same material, the same forming process, or the same film thickness, and can use an appropriate material, forming process, and/or film thickness according to particular requirements.

While the present embodiment uses a 100-nm-thick silicon nitride film as the first intermediate layer, and a 100-nm-thick silicon dioxide film as the second intermediate layer, the embodiment is not limited to this film thickness or these materials. As mentioned above, the first intermediate layer and the second intermediate layer each have a preferred film-thickness range, and for the current manufacturing apparatus, excellent characteristics are obtained in the range of about 50 to 200 nm in film thickness. If a technique for further improving a step coverage is adopted as a method of forming the dielectric film, although expansion of the maximum permissible film thickness to a region of 200 nm or more can be easily anticipated, increasing this film thickness without due consideration only yields a small number of advantages. In addition, although the silicon dioxide and silicon nitride formed using plasma CVD are used as the materials of the intermediate layers, the use of these materials does not obstruct selection of other materials, provided that the use of the materials suits an intended purpose. More specifically, it is possible to use a low-k film (or the like) represented by silicon oxynitride, silicon carbide, silicon nitrocarbide, aluminum oxide, SiOC, and the like. If silicon oxynitride or aluminum oxide is used, this makes it possible to improve dry-etching selectivity and to use them for formation of a light-absorbing layer during lithography. These materials, however, have the disadvantage that their high relative permittivities increase interconnect coupling capacitance. Additionally, although, because of their low relative permittivities, silicon carbide, silicon nitrocarbide, an SiOC film, and the like are effective for reduction in coupling capacitance, these materials also have a disadvantage that a leakage current does not easily decrease. Furthermore, although the present embodiment uses single-layer dielectric films as the first and second intermediate layers, these dielectric films can both be formed into a stacked structure made up of plural layers. More specifically, in the structure where silicon nitride is used as the layer abutting on the lower electrode and silicon dioxide is used as the layer formed on this silicon nitride layer, it becomes easy to control sectional taper angles of the openings provided in the first and second intermediate layers. If these taper angles are highly controllable, the coverage of the dielectric film is likely to be improved, which is effective in improving dielectric breakdown strength. The high controllability of the taper angles also improves controllability of areas of the openings in the MIM capacitors, thus offering the advantage that a desired dielectric constant can be obtained with high reproducibility. Furthermore. although the same film thickness and the same forming process are used for the first and second intermediate layers in the present embodiment, validity of the present invention is not limited to these factors.

Besides, while the present embodiment uses 50-nm-thick titanium nitride films to form the upper electrode and the second upper electrode, neither the film thickness nor the kind of material is limited by the embodiment. If the film thickness is too small, when interconnect via plugs are opened, these via plugs could break through the electrodes, damaging the dielectric film located thereunder. Conversely, if the film thickness is too great, since this means that a resistor is inserted in series with respect to the MIM capacitor, high-frequency characteristics could deteriorate. In the range where titanium nitride is used, a film thickness from about 50 to 100 nm is preferred. Tantalum, tungsten, or a metal based mainly on a nitride thereof, or aluminum, or an alloy thereof, or the like is usable as an electrode material, instead of titanium nitride. Furthermore, although titanium nitride is used as the barrier metal for forming first, second, third, and fourth metal-wiring portions, it is possible, as mentioned above, to use tantalum, tungsten, or a metal based mainly on a nitride thereof, instead of titanium nitride. Besides, if there is a margin on reliability, it is possible to employ a structure not using a barrier metal. Moreover, forming both the upper electrode and the barrier metal into a stacked structure made up of plural layers does not present any problems.

In addition, while, in the present embodiment, the process steps using primarily a silicon dioxide film as the first interlayer dielectric film have been described by way of example, the embodiment is not limited to this material and it is possible to use a low-k material capable of reducing the coupling capacitance of the wiring. That is to say, it is also possible to use such an SiOC film (carbon-containing silicon dioxide film) as represented by Black Diamond (registered trademark of Applied Materials, Inc.), such an organic film as represented by SiLK (registered trademark of the Dow Chemicals Company), other low-k materials with a pore(s) introduced thereinto, a fluorine-containing silicon dioxide film, or the like. When such a low-k material is used, protective dielectric films of some kind are required and thus a first interlayer dielectric film also includes the multilayer film constructed of these plural dielectric films.

Although the aluminum wiring processed by dry etching is used as the first and fourth metal wiring portions in the present embodiment, the aluminum wiring or copper wiring that is processed with a damascene method can be used instead, as required.

In addition, although, for simplification of the drawings, the present embodiment has been described in the format where the above two wiring portions are connected by a single interconnect via plug, it is possible to select any number of via plugs, and arbitrary positions and shapes thereof, provided that electrical connection between both is ensured. It goes without saying that to reduce the coupling resistance inserted in series into the MIM capacitors, interconnect via plugs as large as possible are preferred.

Furthermore, although the interconnect via plug is completely filled in with a first conductive plug 250 or a second conductive plug 251, both made of tungsten, validity of the present invention is not limited by this structure or material. Instead of tungsten, a conductor based mainly on aluminum or copper can be used as a material of the conductive plugs. Furthermore, the surfaces of the conductive plugs do not always need to be flush with the surface of the first interlayer dielectric film 304, and such levels of indentation or bumping that do not affect reliability can be accommodated to a certain extent during the forming process for the lower electrode and the dielectric film.

The meanings of the reference numerals used in the drawings accompanying this Application are as follows:

100 . . . Substrate having semiconductor devices formed thereon
200 . . . First barrier metal film
201 . . . First aluminum film
202 . . . Second barrier metal film
203 . . . Upper electrode
204 . . . Patterned upper electrode
205 . . . First barrier metal layer
206 . . . First aluminum layer
207 . . . Second barrier metal layer
208 . . . Third barrier metal layer
209 . . . Second aluminum layer
210 . . . Fourth barrier metal layer
211 . . . Patterned lower electrode
212 . . . Third barrier metal film
213 . . . Second aluminum film
214 . . . Fourth barrier metal film
215 . . . Fifth barrier metal layer
216 . . . First copper layer
217 . . . Patterned resistor layer
218 . . . Second upper electrode
219 . . . Patterned second upper electrode
220 . . . Sixth barrier metal layer
221 . . . Third aluminum layer
222 . . . Seventh barrier metal layer
223 . . . Eighth barrier metal layer 224 . . . Fourth aluminum layer
225 . . . Ninth barrier metal layer
250 . . . First conductive plug
251 . . . Second conductive plug
252 . . . Third conductive plug
300 . . . First intermediate layer
301 . . . Hard mask
302 . . . Patterned hard mask
303 . . . Patterned first intermediate layer
304 . . . First interlayer dielectric layer
305 . . . Etching stopper
306 . . . Second interlayer dielectric film
307 . . . Second intermediate layer
308 . . . Patterned second intermediate layer
400 . . . Dielectric film
401 . . . Patterned dielectric film
402 . . . Dielectric film under the resistor layer
403 . . . Second dielectric film
404 . . . Patterned second dielectric film
500 . . . First opening
501 . . . Opening formed in first interlayer dielectric layer
502 . . . Second opening
600 . . . First etching mask
601 . . . Second etching mask
602 . . . Third etching mask
700 . . . First metal wiring
701 . . . Second metal wiring
702 . . . Third metal wiring
703 . . . Fourth metal wiring
750 . . . Lower metal wiring connecting with MIM capacitor
751 . . . Upper metal wiring connecting with MIM capacitor
752 . . . Lower metal wiring adjacent to MIM capacitor
753 . . . Upper metal wiring adjacent to MIM capacitor
754 . . . Upper electrode of MIM capacitor
755 . . . Opening formed in first intermediate layer
756 . . . Via plug connecting between upper metal wiring 751 and lower metal wiring 754.
757 . . . Via plug connecting between upper metal wiring 753 and lower metal wiring 752
758 . . . First intermediate layer
759 . . . Lower metal wiring connecting with resistor
760 . . . Resistor
761 . . . First intermediate layer covering the resistor
762 . . . Via plug connecting between resistor 760 and lower metal wiring 759
800 . . . Etching residue

What is claimed is:

1. A semiconductor device comprising:
    a first electrode formed on a semiconductor substrate;
    an intermediate dielectric film provided in vicinity of an upper peripheral face of said first electrode, said intermediate dielectric film having an opening through said intermediate dielectric film in a vicinity of a central portion thereof;
    a dielectric film formed in the opening directly on said intermediate dielectric film; and
    a second electrode formed directly on said dielectric film;
    wherein the upper peripheral face of said first electrode is covered with said intermediate dielectric film, and a side of said first electrode is not covered with said intermediate dielectric film;
    wherein an end of said intermediate dielectric film is corresponding to an end of said first electrode;
    wherein an end of said dielectric film and end of said second electrode are provided at positions not overstepping an end of said intermediate dielectric film; and
    wherein at least a part of the intermediate dielectric film is formed between the dielectric film and the first electrode.

2. The semiconductor device according to claim 1, wherein a thickness of said intermediate dielectric film is smaller than a width of the opening measured along any direction that is in parallel with the surface of the semiconductor substrate.

3. The semiconductor device according to claim 1, wherein a thickness of said intermediate dielectric film is greater than 10 nm and smaller than 300 nm.

4. The semiconductor device according to claim 1, wherein said intermediate dielectric film is composed mainly of a dielectric film selected from the group consisting of silicon dioxide, silicon nitride, silicon oxynitride, silicon carbide, silicon nitrocarbide, aluminum oxide, and silicon oxycarbide.

5. The semiconductor device according to claim 1, wherein said intermediate dielectric film is a stacked structure including at least two kinds of dielectric films different from one another in terms of etching selectivity.

6. The semiconductor device according to claim 1, wherein said dielectric film is composed mainly of a dielectric film selected from the group consisting of tantalum oxide, hafnium oxide, zirconium oxide, lanthanum oxide, titanium oxide, aluminum oxide, PZT, STO, and BST.

7. The semiconductor device according to claim 1, wherein said first electrode and said second electrode are each composed mainly of a metal selected from the group consisting of titanium, tantalum, tungsten, molybdenum, and a nitride thereof, or consisting of aluminum and alloys thereof.

* * * * *